(12) United States Patent
Shigaki et al.

(10) Patent No.: US 8,735,720 B2
(45) Date of Patent: *May 27, 2014

(54) DYE-SENSITIZED PHOTOELECTRIC CONVERSION DEVICE

(75) Inventors: Koichiro Shigaki, Tokyo (JP);
Masayoshi Kaneko, Tokyo (JP);
Takayuki Hoshi, Tokyo (JP); Teruhisa Inoue, Tokyo (JP)

(73) Assignee: Nippon Kayaku Kabushiki Kaisha, Tokyo (JP)

( * ) Notice: Subject to any disclaimer, the term of this patent is extended or adjusted under 35 U.S.C. 154(b) by 301 days.

This patent is subject to a terminal disclaimer.

(21) Appl. No.: 12/224,350

(22) PCT Filed: Mar. 1, 2007

(86) PCT No.: PCT/JP2007/053885
§ 371 (c)(1),
(2), (4) Date: Aug. 25, 2008

(87) PCT Pub. No.: WO2007/100033
PCT Pub. Date: Sep. 7, 2007

(65) Prior Publication Data
US 2009/0044857 A1 Feb. 19, 2009

(30) Foreign Application Priority Data
Mar. 2, 2006 (JP) ................. 2006-056884

(51) Int. Cl.
*H01L 31/00* (2006.01)

(52) U.S. Cl.
USPC ........................................ 136/263

(58) Field of Classification Search
USPC .......... 136/263, 256, 252; 430/570, 573, 577, 430/583, 584
See application file for complete search history.

(56) References Cited

U.S. PATENT DOCUMENTS

| | | | |
|---|---|---|---|
| 2,803,640 A | 8/1957 | Heckert | 260/465 |
| 4,927,721 A | 5/1990 | Gratzel et al. | 429/111 |
| 5,084,365 A | 1/1992 | Gratzel et al. | 429/111 |
| 5,670,091 A | 9/1997 | Marder et al. | 252/582 |
| 6,084,176 A | 7/2000 | Shiratsuchi et al. | 136/263 |
| 6,291,763 B1 | 9/2001 | Nakamura | |
| 6,335,481 B1 | 1/2002 | Watanabe | |
| 6,376,765 B1 | 4/2002 | Wariishi et al. | 136/263 |
| 7,141,735 B2 | 11/2006 | Ikeda et al. | 136/263 |
| 7,728,222 B2 | 6/2010 | Ikeda et al. | |
| 7,851,701 B2 | 12/2010 | Ikeda et al. | |
| 7,943,848 B2 | 5/2011 | Nishimura et al. | |
| 7,947,898 B2 | 5/2011 | Itami et al. | |
| 7,977,570 B2 | 7/2011 | Shigaki et al. | |
| 8,022,293 B2 | 9/2011 | Shigaki et al. | |
| 8,022,294 B2 | 9/2011 | Shigaki et al. | |
| 8,039,741 B2 | 10/2011 | Itami et al. | |
| 8,227,690 B2 | 7/2012 | Ikeda et al. | |
| 8,338,700 B2 | 12/2012 | Ikeda et al. | |
| 8,338,701 B2 | 12/2012 | Ikeda et al. | |
| 2002/0010969 A1 | 1/2002 | Goettel et al. | 8/405 |
| 2003/0152827 A1 | 8/2003 | Ikeda et al. | 429/111 |

(Continued)

FOREIGN PATENT DOCUMENTS

| | | |
|---|---|---|
| CN | 1861740 | 11/2006 |
| EP | 0 566 077 | 10/1993 |

(Continued)

OTHER PUBLICATIONS

Nature; vol. 353; Oct. 24, 1991; pp. 737-739; Brian O'Regan et al.; "A low-cost, high-efficiency solar cell based on dye-sensitized colloidal TiO2 films".

J.Am. Chem. Soc. 1993, 115, p. 6382-6390; M.K. Nazeeruddin et al.; "Conversion of Light to Electricity by cis-X2Bis(2,2'-bipyridyl-4,4'-dicarboxylate)ruthenium(II) Charge-Transfer Sensitizers (X=Cl-,Br-, I-,CN-, and SCN-) on Nanocrystalline TiO2 Electrodes".

(Continued)

*Primary Examiner* — Monique Peets
(74) *Attorney, Agent, or Firm* — Nields, Lemack & Frame, LLC

(57) ABSTRACT

Disclosed is a photoelectric conversion device wherein a methine dye represented by the formula (1) below is supported by a thin film of oxide semiconductor particles arranged on a substrate. Also disclosed is a solar cell manufactured by using such a photoelectric conversion device.

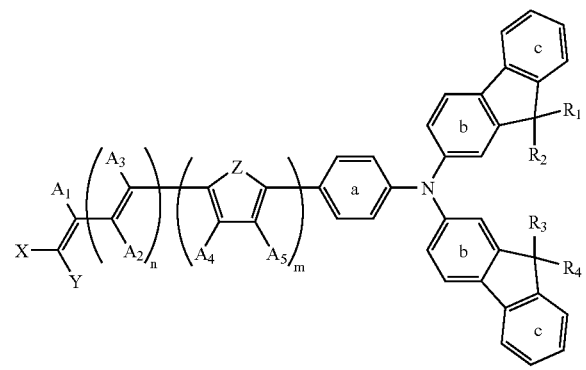

(1)

(In the formula (1), n represents an integer of 0-5; m represents an integer of 0-5; $R_1$-$R_4$ independently represent a hydrogen atom, an optionally substituted aromatic residue, an optionally substituted aliphatic hydrocarbon residue or the like; X and Y independently represent a hydrogen atom; an optionally substituted aromatic residue, an optionally substituted aliphatic hydrocarbon residue or the like; Z represents an oxygen atom, a sulfur atom or the like; $A_1$, $A_2$, $A_3$, $A_4$ and $A_5$ independently represent a hydrogen atom, an optionally substituted aromatic residue, an optionally substituted aliphatic hydrocarbon residue or the like; and rings a, b and c may be substituted.).

10 Claims, No Drawings

(56) References Cited

U.S. PATENT DOCUMENTS

| | | | |
|---|---|---|---|
| 2004/0074532 A1 | 4/2004 | Ikeda et al. | 136/250 |
| 2004/0099306 A1 | 5/2004 | Hara et al. | 136/263 |
| 2004/0187918 A1 | 9/2004 | Ikeda et al. | |
| 2006/0130249 A1 | 6/2006 | Ikeda et al. | 8/550 |
| 2007/0191455 A1 | 8/2007 | Hiyoshi et al. | |
| 2008/0067476 A1 | 3/2008 | Shigaki et al. | |
| 2008/0087327 A1 | 4/2008 | Horiuchi et al. | |
| 2011/0030801 A1 | 2/2011 | Ikeda et al. | |
| 2011/0031446 A1 | 2/2011 | Ikeda et al. | |

FOREIGN PATENT DOCUMENTS

| | | |
|---|---|---|
| EP | 0 566 081 | 10/1993 |
| EP | 0 566 082 | 10/1993 |
| EP | 0 692 800 A2 | 1/1996 |
| EP | 0 892 411 | 1/1999 |
| EP | 0 911 841 A2 | 4/1999 |
| EP | 0 924 724 | 6/1999 |
| EP | 1 075 005 | 2/2001 |
| EP | 1 311 001 | 5/2003 |
| EP | 1 339 129 A1 | 8/2003 |
| EP | 1 422 782 A1 | 5/2004 |
| EP | 1 628 356 A1 | 2/2006 |
| EP | 1628356 * | 2/2006 |
| JP | 48-3115 | 1/1973 |
| JP | 8-81222 A | 3/1996 |
| JP | 2664194 | 6/1997 |
| JP | 11-67285 A | 3/1999 |
| JP | 11-158395 | 6/1999 |
| JP | 11-163378 | 6/1999 |
| JP | 11-176489 | 7/1999 |
| JP | 11-214731 | 8/1999 |
| JP | 2000-26487 | 1/2000 |
| JP | 2000-195569 | 7/2000 |
| JP | 2000-223167 | 8/2000 |
| JP | 2000-268892 | 9/2000 |
| JP | 2000-285977 | 10/2000 |
| JP | 2000-285978 | 10/2000 |
| JP | 2001-042524 | 2/2001 |
| JP | 2001-52766 A | 2/2001 |
| JP | 2001-064529 | 3/2001 |
| JP | 2002-164089 | 6/2002 |
| JP | 2003-059547 | 2/2003 |
| JP | 2004-22222 A | 1/2004 |
| JP | 2004-146421 A | 5/2004 |
| JP | 2004-207224 A | 7/2004 |
| JP | 2004-227825 A | 8/2004 |
| JP | 2005-5026 A | 1/2005 |
| JP | 2005-11800 A | 1/2005 |
| JP | 2005-19251 A | 1/2005 |
| JP | 2005-123013 A | 5/2005 |
| JP | 2005-129329 A | 5/2005 |
| JP | 2005-129429 A | 5/2005 |
| JP | 2005-129430 A | 5/2005 |
| JP | 2005-209682 A | 8/2005 |
| JP | 2005-227376 | 8/2005 |
| JP | 2006-93284 A | 4/2006 |
| JP | 2006-156212 A | 6/2006 |
| JP | 2006-188582 A | 7/2006 |
| JP | 2006-190534 A | 7/2006 |
| WO | 02/11213 | 2/2002 |
| WO | 2004/011555 A1 | 2/2004 |
| WO | 2004/082061 | 9/2004 |
| WO | 2005/077956 A1 | 8/2005 |
| WO | 2006/028087 A1 | 3/2006 |

OTHER PUBLICATIONS

Chemistry Letters 1998; pp. 1241-1242; Wataru Kubo et al.; "Fabrication of Quasi-solid-state Dye-sensitized TiO2 Solar Cells Using Low Molecular Weight Gelators".

J.Am. Chem. Soc. 2006, 128, p. 16701-16707; Sanghoon Kim et al.; "Molecular Engineering of Organic Sensitizers for Solar Cell Applications".

The International Search Report dated May 22, 2007.

The International Search Report dated Jun. 2, 2002.

The International Search Report dated Sep. 17, 2002.

The Supplementary European Search Report dated Feb. 13, 2006.

The Supplementary Partial European Search Report dated Feb. 21, 2007.

The International Search Report dated May 25, 2004.

J.Mater. Chem. 2000, 10. pp. 1-25; Yasuhiko Shirota; "Organic materials for electronic and optoelectronic devices".

OA dated Sep. 17, 2009 and May 12, 2009 in co-pending U.S. Appl. No. 10/548,858.

OA dated Jul. 7, 2009, May 1, 2009, Sep. 17, 2008, Feb. 21, 2008, Aug. 22, 2007, and Jun. 1, 2007 in co-pending U.S. Appl. No. 10/482,425.

OA dated Aug. 25, 2009, Mar. 16, 2009, Sep. 5, 2008, Jan. 29, 2008, Dec. 12, 2007, Nov. 21, 2007 and Nov. 30, 2006 in co-pending U.S. Appl. No. 10/469,670.

Office Action dated May 25, 2010 in co-pending U.S. Appl. No. 10/548,858.

European communication dated Jun. 7, 2010 in co-pending foreing application (EP07715098.5).

Thin Solid Films, vol. 438-439, 2003, pp. 147-152; XP-002582510; Keiichi Miyairi et al.; "Photovoltaic properties of double layer devices consisting of titanium dioxide and porphyrin dispersed hole transporting material layer".

Chem.Comm., 2004, pp. 68-69; XP-002582511; Sanghoon Kim et al.; "The role of borole in a fully conjugated electron-rich system".

Notice of Allowance dated Jul. 26, 2010 in co-pending U.S. Appl. No. 10/482,425.

Notice of Allowance mailed Apr. 11, 2012 in co-pending U.S. Appl. No. 10/548,858.

International Search Report dated Sep. 19, 2006 in co-pending foreign patent application No. PCT/JP2006/311867.

International Search Report dated Dec. 2, 2005 in co-pending foreign patent application No. PCT/JP2005/016328.

International Search Report dated Sep. 5, 2006 in foregin patent application No. PCT/JP2006/310246.

European Communication dated Aug. 4, 2010 in co-pending foreign application EP 06757302.2.

Supplemental European Search Report dated May 25, 2009 in co-pending foreign application EP 05782209.

Solar Energy Materials & Solar Cells 80 (2003) pp. 47-71, "Efficient sensitization of nanocrystalline TiO2 films with cyanine and merocyanine organic dyes", Sayama, et al.

Office Action dated Jun. 21, 2010 in co-pending U.S. Appl. No. 11/661,843.

Office Action dated Oct. 7, 2010 in co-pending U.S. Appl. No. 11/661,843.

Office Action dated Jun. 21, 2010 in co-pending U.S. Appl. No. 11/920,899.

Office Action dated Oct. 8, 2010 in co-pending U.S. Appl. No. 11/920,899.

Office Action dated Jun. 21, 2010 in co-pending U.S. Appl. No. 11/922,062.

Office Action dated Oct. 31, 2010 in co-pending U.S. Appl. No. 11/922,062.

Final Rejection dated Mar. 16, 2011 in co-pending U.S. Appl. No. 11/661,843.

Notice of Allowance dated Mar. 16, 2011 in co-pending U.S. Appl. No. 11/920,899.

Final Rejection dated Mar. 15, 2011 in co-pending U.S. Appl. No. 11/922,062.

Notice of Allowance dated Jun. 22, 2011 in co-pending U.S. Appl. No. 11/661,843.

Notice of Allowance dated Jun. 22, 2011 in co-pending U.S. Appl. No. 11/922,062.

Office Action dated Aug. 16, 2011 in co-pending U.S. Appl. No. 10/548,858.

OA dated Jan. 19, 2010 in co-pending U.S. Appl. No. 10/482,425.

NOA dated Feb. 4, 2010 in co-pending U.S. Appl. No. 10/469,670.

Tanaka et al.; JP2001-064529 A online machine translation, Mar. 13, 2001.

(56) References Cited

OTHER PUBLICATIONS

Notice of Allowance mailed Sep. 4, 2012 in co-pending U.S. Appl. No. 12/908,439.

Notice of Allowance mailed Sep. 20, 2012 in co-pending U.S. Appl. No. 12/908,444.

\* cited by examiner

DYE-SENSITIZED PHOTOELECTRIC CONVERSION DEVICE

TECHNICAL FIELD

The present invention relates to a photoelectric conversion device having a thin film of oxide semiconductor fine particles that is sensitized with an organic dye, and a solar cell using the same. More specifically, the present invention relates to a photoelectric conversion device produced by supporting a methine compound (dye) with a specific structure on a thin film of oxide semiconductor fine particles, and a solar cell using the same.

BACKGROUND ART

A solar cell using sunlight has become a focus of attention as an energy resource alternative to fossil fuel such as petroleum or coal. At present, a silicon solar cell using crystalline or amorphous silicon, a compound semiconductor solar cell using gallium, arsenic, etc., and the like have vigorously been studied and developed. However, since a large amount of energy and high cost are required for production of such solar cells, they are problematic in terms of difficulty in generally using such solar cells. On the other hand, a photoelectric conversion device using semiconductor fine particles sensitized with a dye, and a solar cell using such a photoelectric conversion device have also been known. Materials used in production of such products and production techniques have been disclosed (see Patent Document 1, Non-Patent Document 1, and Non-Patent Document 2). This photoelectric conversion device is produced using relatively inexpensive oxide semiconductors such as titanium oxide. There is a possibility that this photoelectric conversion device can be produced at a cost lower than that of a conventional solar cell using silicon or the like. Moreover, this photoelectric conversion device has become a focus of attention because more colorful solar cells can be obtained using it. However, in order to obtain a device with high conversion efficiency, a ruthenium complex is used as a sensitizing dye, and such a dye is expensive. Further, a problem remains also in terms of the supply of such a dye. Furthermore, an attempt has already been made to use an organic dye as such a sensitizing dye. However, such a photoelectric conversion device using an organic dye has been poor in terms of conversion efficiency, stability and durability, and thus, it has not yet been in practical use under the current circumstances. It has been desired to further improve such conversion efficiency (see Patent Documents 2 and 3). Still further, with regard to the photoelectric conversion device of the present invention, attempts such as consolidation of an electrolyte have also been made (see Non-Patent Document 3), and thus, the development of a device with excellent durability has been required.

Patent Document 1: Japanese Patent No. 2664194
Patent Document 2: WO2002/011213
Patent Document 3: WO2004/082061
Non-Patent Document 1: B. O'Regan and M. Graetzel, Nature, Vol. 353, p. 737 (1991)
Non-Patent Document 2: M. K. Nazeeruddin, A. Kay, I. Rodicio, R. Humphry-Baker, E. Muller, P. Liska, N. Vlachopoulos, M. Graetzel, J. Am. Chem. Soc., Vol. 115, p. 6382 (1993)
Non-Patent Document 3: W. Kubo, K. Murakoshi, T. Kitamura, K. Hanabusa, H. Shirai, and S. Yanagida, Chem. Lett., p. 1241 (1998)

It has been desired to develop a photoelectric conversion device using oxide semiconductor fine particles sensitized with an organic dye, wherein an inexpensive organic dye is used to produce a photoelectric conversion device with stability, high conversion efficiency and high feasibility.

DISCLOSURE OF THE INVENTION

As a result of intensive studies directed towards achieving the aforementioned object, the present inventors have found that a photoelectric conversion device with stability and high conversion efficiency can be obtained by sensitizing a thin film of semiconductor fine particles with a methine dye having a specific structure and producing a photoelectric conversion device using the aforementioned thin film, thereby completing the present invention.

That is to say, the present invention relates to the following (1) to (27):

(1) A photoelectric conversion device comprising a methine dye represented by the following Formula (1) supported on a thin film of oxide semiconductor fine particles provided on a substrate:

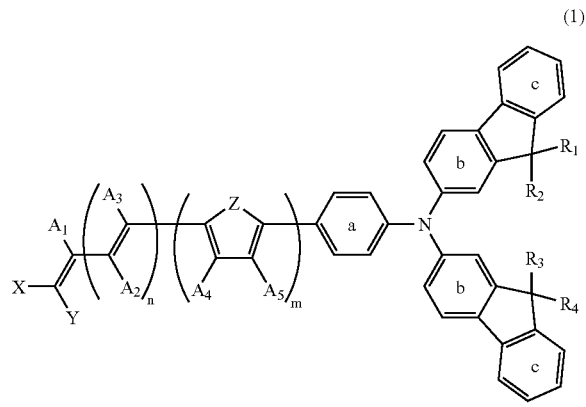

(1)

(wherein, in Formula (1), n represents an integer between 0 and 5; m represents an integer between 0 and 5; $R_1$ to $R_4$ each independently represent a hydrogen atom, an aromatic residue that may have a substituent, or an aliphatic hydrocarbon residue that may have a substituent; X and Y each independently represent a hydrogen atom, an aromatic residue that may have a substituent, an aliphatic hydrocarbon residue that may have a substituent, a carboxyl group, a phosphoric acid group, a sulfonic acid group, a cyano group, an acyl group, an amide group, or an alkoxycarbonyl group, or X and Y may bind together to form a ring that may have a substituent; Z('s) represents an oxygen atom, a sulfur atom, a selenium atom, or $NR_5$; $R_5$ represents a hydrogen atom, an aromatic residue that may have a substituent, or an aliphatic hydrocarbon residue that may have a substituent; when m is 2 or greater and plural Z's exist, the plural Z's may be identical to or different from one another; $A_1$, $A_2$('s), $A_3$('s), $A_4$('s), and $A_5$('s) each independently represent a hydrogen atom, an aromatic residue that may have a substituent, an aliphatic hydrocarbon residue that may have a substituent, a hydroxyl group, a phosphoric acid group, a cyano group, a halogen atom, a carboxyl group, a carbonamide group, an alkoxyl group that may have a substituent, an aryloxy group that may have a substituent, an alkoxycarbonyl group that may have a substituent, an arylcarbonyl group that may have a substituent, or an acyl group; when n is 2 or greater and plural $A_2$'s and $A_3$'s exist, each of the $A_2$'s and $A_3$'s may be identical to or different from one another; when n is an integer other than 0, $A_1$ and/or $A_2$('s)

and/or A₃('s) in combination may form a ring that may have a substituent; when n is an integer other than 0 and m is 0, A₁ and/or A₂('s) and/or A₃('s) may be attended with a benzene ring a to form a ring that may have a substituent; when m is 2 or greater and plural A₄'s and A₅'s exist, each of the A₄'s and A₅'s may be identical to or different from one another; when m is an integer other than 0, A₄('s) and A₅('s) in combination may form a ring that may have a substituent, or A₄('s) and/or A₅('s) may form, together with a benzene ring a, a ring that may have a substituent; the benzene ring a may have 1 to 4 substituents selected from the group consisting of an aromatic residue that may have a substituent, an aliphatic hydrocarbon residue that may have a substituent, a hydroxyl group, a phosphoric acid group, a cyano group, a nitro group, a halogen atom, a carboxyl group, a carbonamide group, an alkoxycarbonyl group, an arylcarbonyl group, an alkoxyl group, an aryloxy group, an amide group, an acetamide group, an acyl group, and a substituted or unsubstituted amino group; when plural substituents exist on the benzene ring a, the substituents may bind to one another or may bind to A₁ and/or A₂('s) and/or A₃('s), or to A₄('s) and/or A₅('s), to form a ring that may have a substituent; a benzene ring b may have 1 to 3 substituents selected from the group consisting of an aromatic residue that may have a substituent, an aliphatic hydrocarbon residue that may have a substituent, a hydroxyl group, a phosphoric acid group, a cyano group, a nitro group, a halogen atom, a carboxyl group, a carbonamide group, an alkoxycarbonyl group, an arylcarbonyl group, an alkoxyl group, an aryloxy group, an amide group, an acetamide group, an acyl group, and a substituted or unsubstituted amino group; a benzene ring c may have 1 to 4 substituents selected from the group consisting of an aromatic residue that may have a substituent, an aliphatic hydrocarbon residue that may have a substituent, a hydroxyl group, a phosphoric acid group, a cyano group, a nitro group, a halogen atom, a carboxyl group, a carbonamide group, an alkoxycarbonyl group, an arylcarbonyl group, an alkoxyl group, an aryloxy group, an amide group, an acetamide group, an acyl group, and a substituted or unsubstituted amino group; provided that a case where n is 0, m is 1, Z('s) represents a sulfur atom, X represents a carboxyl group, Y represents a cyano group, A₁, A₄, and A₅ each represent a hydrogen atom, R₁ to R₄ each represent a methyl group, and the benzene rings a, b, and c are unsubstituted is excluded).

(2) The photoelectric conversion device according to (1) above, wherein the methine dye represented by Formula (1) is a methine dye represented by the following Formula (2):

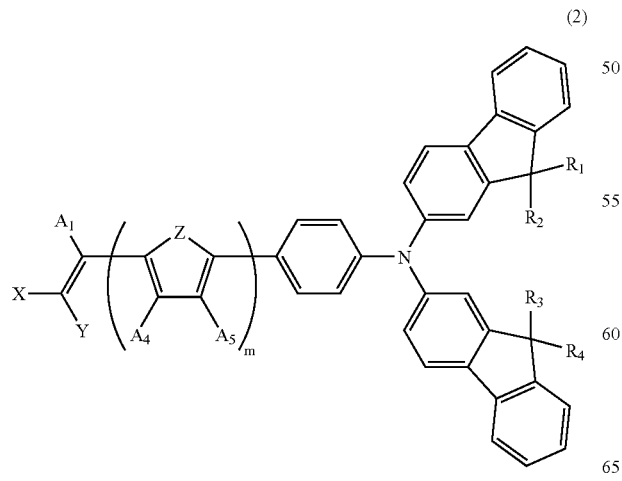

(2)

(wherein, in Formula (2), m, R₁ to R₄, X, Y, Z, A₁, A₄, and A₅ have the same definitions as in the case of Formula (1), provided that a case where m is 1, Z('s) represents a sulfur atom, X represents a carboxyl group, Y represents a cyano group, A₁, A₄, and A₅ each represent a hydrogen atom, and R₁ to R₄ each represent a methyl group is excluded).

(3) The photoelectric conversion device according to (1) or (2) above, wherein, in Formula (1) or Formula (2), Z('s) represents a sulfur atom.

(4) The photoelectric conversion device according to (3) above, wherein, in Formula (1) or Formula (2), R₁ to R₄ each represent an aliphatic hydrocarbon residue that may have a substituent.

(5) The photoelectric conversion device according to (4) above, wherein, in Formula (1) or Formula (2), R₁ to R₄ each represent a saturated alkyl group containing 1 to 18 carbon atoms.

(6) The photoelectric conversion device according to (5) above, characterized in that, in Formula (1) or Formula (2), R₁ to R₄ each represent a saturated linear alkyl group containing 1 to 8 carbon atoms.

(7) The photoelectric conversion device according to (6) above, wherein, in Formula (1) or Formula (2), m is an integer between 1 and 5.

(8) The photoelectric conversion device according to (7) above, wherein, in Formula (1) or Formula (2), X and Y each independently represent a carboxyl group, a cyano group, or an acyl group, provided that either X or Y represents a carboxyl group.

(9) The photoelectric conversion device according to (8) above, wherein, in Formula (1) or Formula (2), either X or Y represents a carboxyl group and the other represents a cyano group.

(10) The photoelectric conversion device according to (7) above, wherein, in Formula (1) or Formula (2), at least either X or Y represents a ring structure group having, as a substituent, at least one group selected from the group consisting of a carboxyl group, a hydroxyl group, a phosphoric acid group, a sulfonic acid group, and salts of the acidic groups.

(11) The photoelectric conversion device according to (10) above, characterized in that the ring structure group is represented by any one of the following Formulas (1001) to (1033):

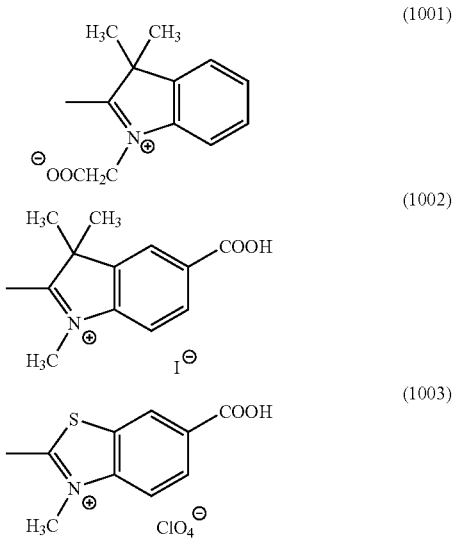

-continued
(1004) 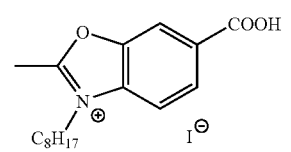
(1005) 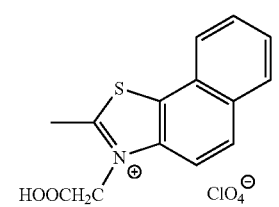
(1006) 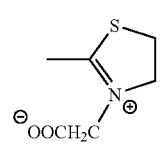
(1007) 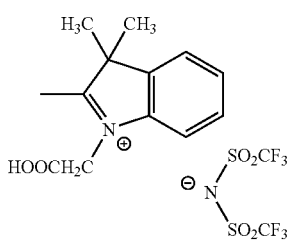
(1008) 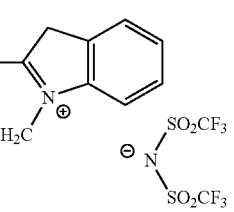
(1009) 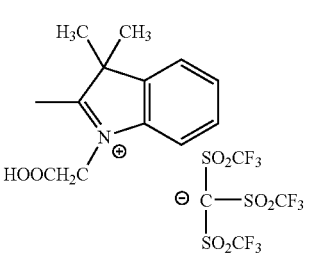
(1010) 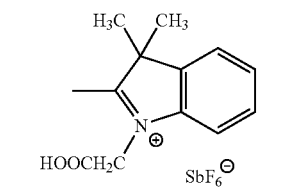
(1011) 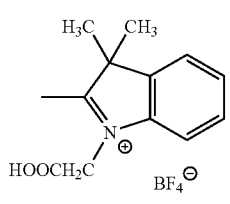
-continued
(1012) 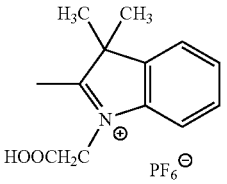
(1013) 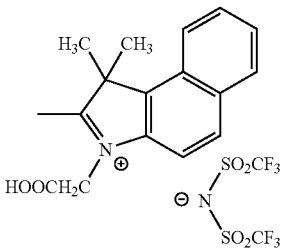
(1014) 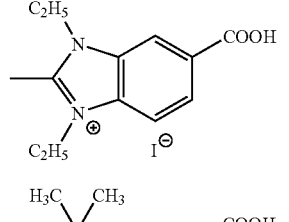
(1015) 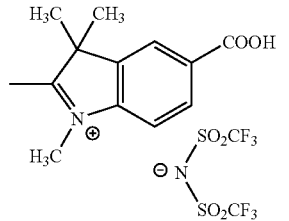
(1016) 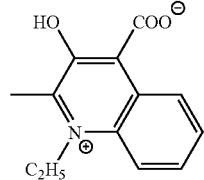
(1017) 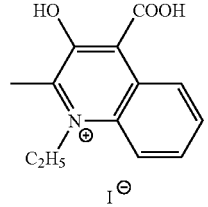
(1018) 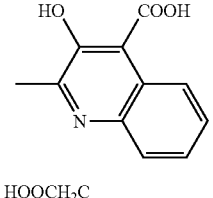
(1019) 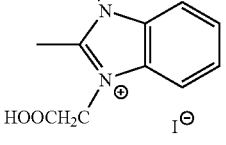

-continued
(1020) 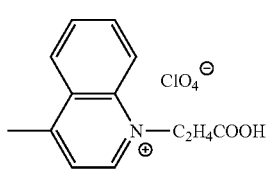
(1021) 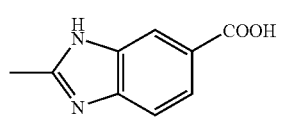
(1022) 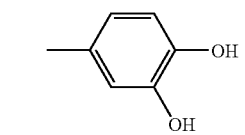
(1023) 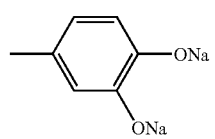
(1024) 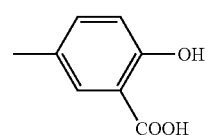
(1025) 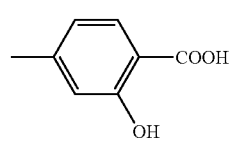
(1026) 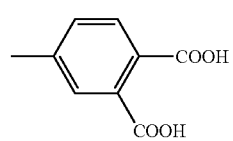
(1027) 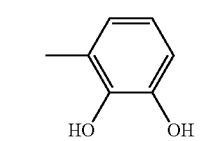
(1028) 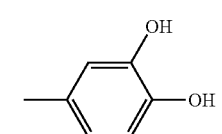
(1029) 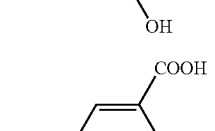
(1030) 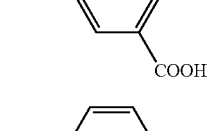
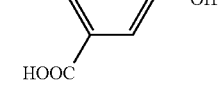
-continued
(1031) 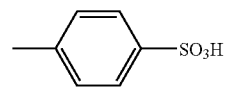
(1032) 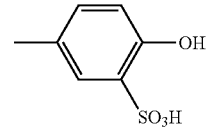
(1033) 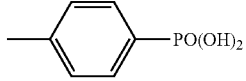
(12) The photoelectric conversion device according to (7) above, characterized in that X binds to Y to form a ring structure in Formula (1) or Formula (2).
(13) The photoelectric conversion device according to (12) above, wherein the ring structure formed by binding between X and Y is represented by any one of the following Formulas (2001) to (2044):
(2001) 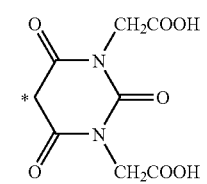
(2002) 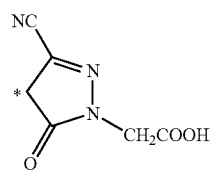
(2003) 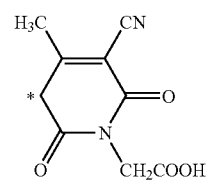
(2004) 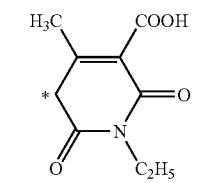
(2005) 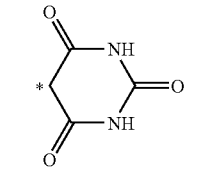

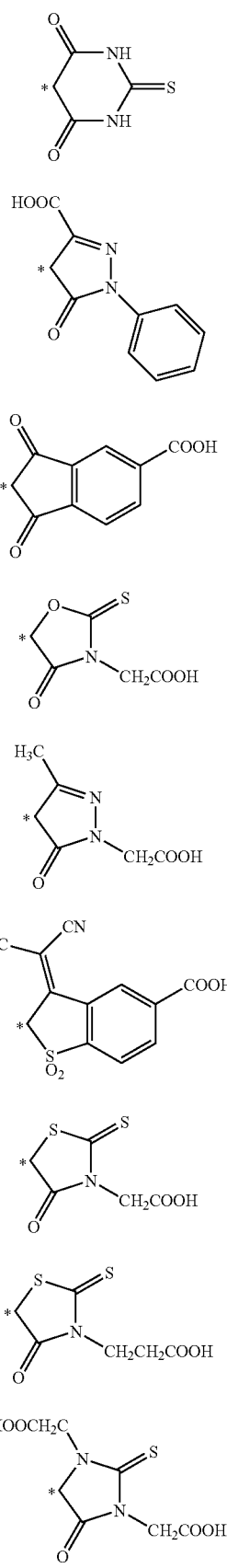
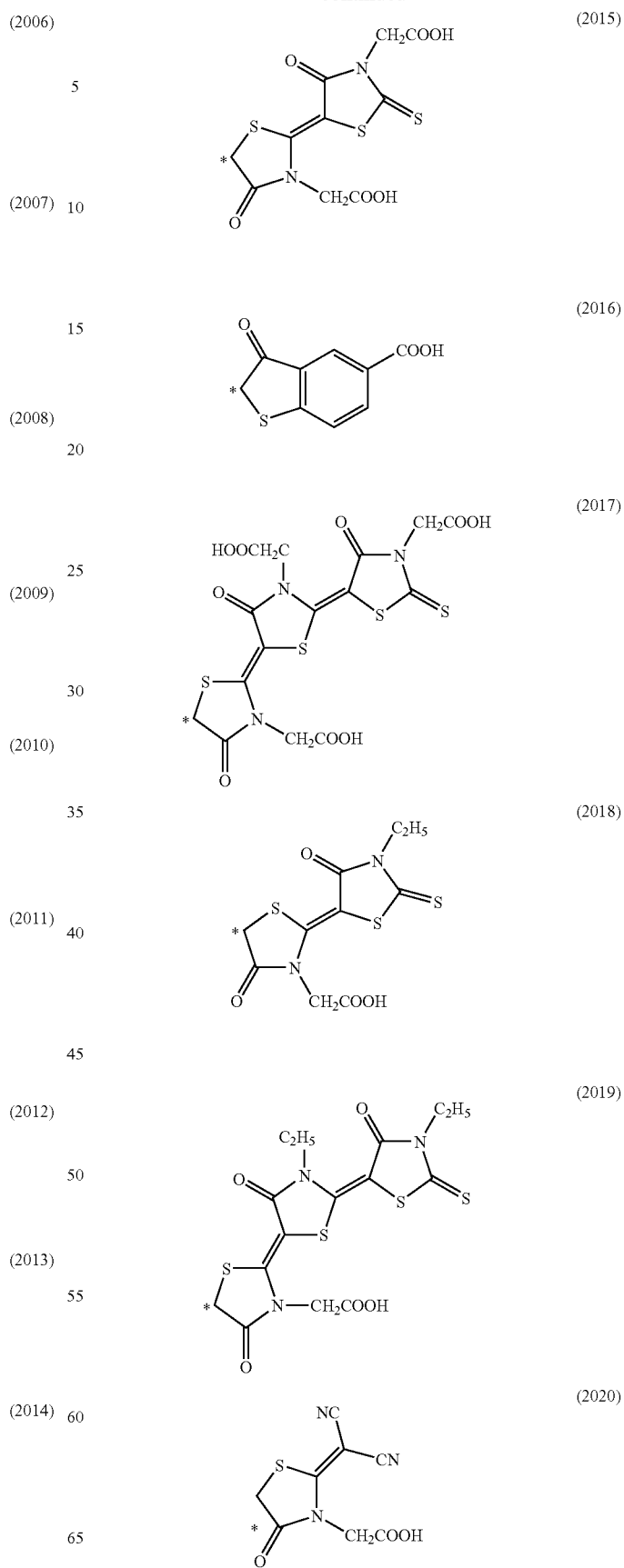

11
-continued
(2021)
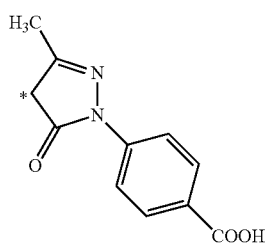
(2022)
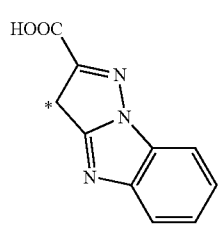
(2023)
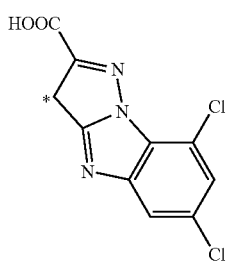
(2024)
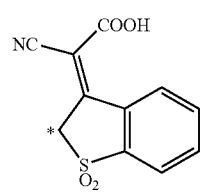
(2025)
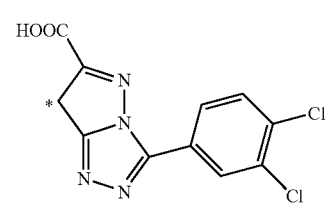
(2026)
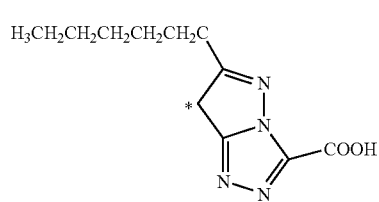
(2027)
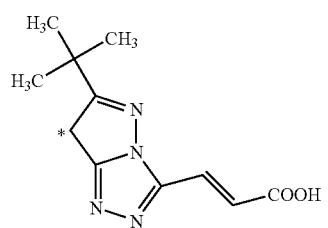
12
-continued
(2028)
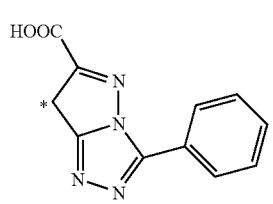
(2029)
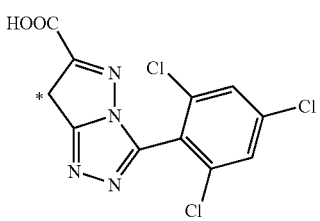
(2030)
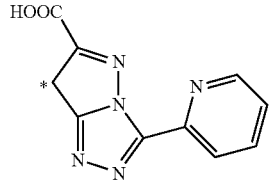
(2031)
(2032)
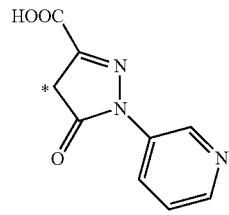
(2033)
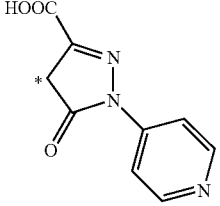
(2034)
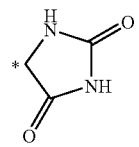
(2035)
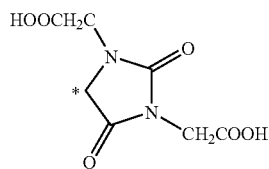

-continued (2036) 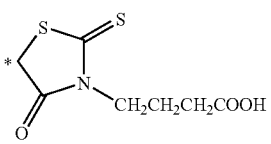

(2037) 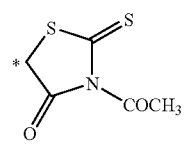

(2038) 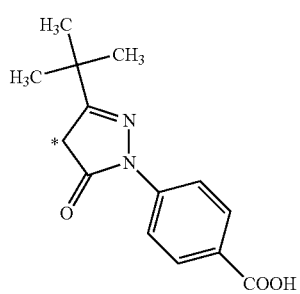

(2039) 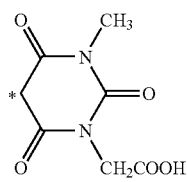

(2040) 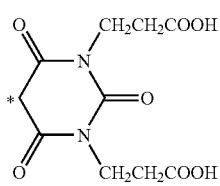

(2041) 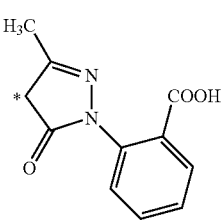

(2042) 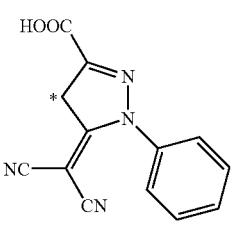

-continued (2043) 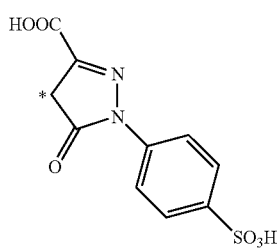

(2044) 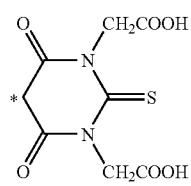

(wherein, in Formulas (2001) to (2044), the symbol * indicates a carbon atom where X binds to Y in Formula (1) or Formula (2)).

(14) The photoelectric conversion device according to (13) above, characterized in that the ring structure formed by binding between X and Y has a carboxyl group as a substituent.

(15) The photoelectric conversion device according to (14) above, characterized in that the ring structure formed by binding between X and Y, which has a carboxyl group as a substituent, is represented by the aforementioned Formula (2007) or (2012).

(16) The photoelectric conversion device according to any one of (1) to (15) above, characterized in that, in Formula (1) or Formula (2), either $A_4$ or $A_5$ (when m is 1), or at least one of the $A_4$'s and $A_5$'s (when m is 2 or greater) represents an aliphatic hydrocarbon residue that may have a substituent.

(17) The photoelectric conversion device according to (16) above, characterized in that the aliphatic hydrocarbon residue that may have a substituent is a saturated alkyl group that may have a substituent.

(18) The photoelectric conversion device according to (17) above, characterized in that the saturated alkyl group that may have a substituent is an n-hexyl group.

(19) The photoelectric conversion device according to (18) above, characterized in that, in Formula (1) or Formula (2), $A_5$('s) is an n-hexyl group.

(20) The photoelectric conversion device according to (1) above, comprising a methine dye represented by Formula (1) supported, wherein, in Formula (1), n represents an integer between 0 and 5; m represents an integer between 0 and 5; Z('s) represents a group selected from the group consisting of an oxygen atom, a sulfur atom, a selenium atom, amino, N-methylamino, and N-phenylamino; $R_1$ is identical to $R_2$, $R_3$ is identical to $R_4$, and $R_1$ to $R_4$ each represent a group selected from the group consisting of a hydrogen atom, a linear unsubstituted C1-C18 alkyl, cyclopentyl, phenyl, chloroethyl, and acetyl; X and Y each represent a group selected from the group consisting of a hydrogen atom, cyano, carboxyl, a phosphoric acid group, acetyl, and trifluoroacetyl (provided that in this case, either X or Y represents a carboxyl group), or either X or Y is a group represented by any one of the aforementioned Formulas (1001) to (1033) and the other is a hydrogen atom, or X and Y form a ring and the ring is a group selected from the group consisting of the groups represented by the aforementioned Formulas (2001) to (2044) (wherein, in Formulas (2001) to (2044), the symbol * indicates a carbon atom where X binds to Y in Formula (1)); $A_1$ to $A_5$('s) each are a group selected from the group consisting of a hydrogen atom, methyl, a chlorine atom, cyano, n-hexyl, and n-butyl; and benzene rings a, b, and c are unsubstituted (provided that a case where n is 0, m is 1, Z('s) represents a sulfur atom, X represents a carboxyl group, Y represents a cyano group, $A_1$, $A_4$, and $A_5$ each represent a hydrogen atom, $R_1$ to $R_4$ each represent a methyl group, and the benzene rings a, b, and c are unsubstituted is excluded).

(21) The photoelectric conversion device according to (1) above, comprising a methine dye represented by Formula (1) supported, wherein, in Formula (1), n is 0, m is an integer between 1 and 3, Z('s) represents a sulfur atom, $R_1$ to $R_4$ each represent an unsubstituted linear C1-C18 alkyl group, and benzene rings a, b, and c are all unsubstituted, either X or Y represents a carboxyl group and the other represents a cyano group, or the ring formed by binding between X and Y is a group selected from among Formulas (2005), (2007), and (2012) described in (13) above, and $A_1$, $A_4$('s) and $A_5$('s) are a hydrogen atom (provided that a case where n is 0, m is 1, Z('s) represents a sulfur atom, X represents a carboxyl group, Y represents a cyano group, $A_1$, $A_4$, and $A_5$ each represent a hydrogen atom, $R_1$ to $R_4$ each represent a methyl group, and the benzene rings a, b, and c are unsubstituted is excluded).

(22) The photoelectric conversion device according to (21) above, comprising a methine dye represented by Formula (1) supported, wherein, in Formula (1), the unsubstituted linear alkyl is C4-C8.

(23) A photoelectric conversion device comprising one or more methine dyes represented by Formula (1) described in (1) above, a metal complex, and/or an organic dye having a structure other than the structure represented by Formula (1), supported on a thin film of oxide semiconductor fine particles provided on a substrate.

(24) The photoelectric conversion device according to any one of (1) to (23) above, wherein the thin film of oxide semiconductor fine particles comprises titanium dioxide, zinc oxide, or tin oxide.

(25) The photoelectric conversion device according to any one of (1) to (24) above, wherein the thin film of oxide semiconductor fine particles sensitized with a methine dye comprises the methine dye represented by Formula (1) supported on a thin film of oxide semiconductor fine particles in the presence of a clathrate compound.

(26) A solar cell, characterized by using the photoelectric conversion device according to any one of (1) to (25) above.

(27) A methine compound represented by Formula (1) described in (1) above (provided that a case where n is 0, m is 1, Z('s) represents a sulfur atom, X represents a carboxyl group, Y represents a cyano group, $A_1$, $A_4$, and $A_5$ each represent a hydrogen atom, $R_1$ to $R_4$ each represent a methyl group, and the benzene rings a, b, and c are unsubstituted is excluded).

Using a methine dye having a specific structure, it became possible to provide a solar cell having high conversion efficiency and high stability. In addition, using oxide semiconductor fine particles sensitized with two or more types of dyes, such conversion efficiency was further improved.

BEST MODE FOR CARRYING OUT THE INVENTION

The present invention will be described in detail below.
The photoelectric conversion device of the present invention comprises a methine dye represented by the following Formula (1) supported on a thin film of oxide semiconductor fine particles provided on a substrate:

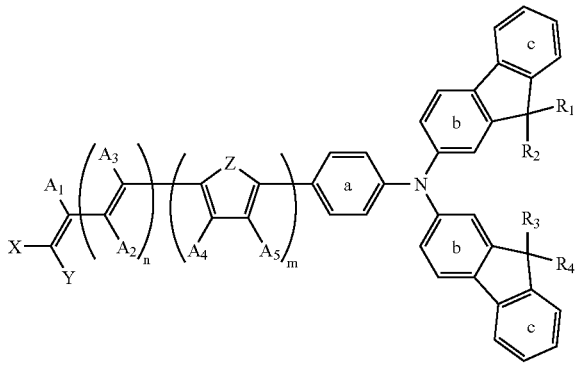

(1)

In the above Formula (1), n represents an integer between 0 and 5, preferably between 0 and 4, more preferably 0 and 2, and particularly preferably 0.

In the above Formula (1), m represents an integer between 0 and 5, preferably between 1 and 5, and more preferably 1 and 3.

In the above Formula (1), $R_1$ to $R_4$ each independently represent a hydrogen atom, an aromatic residue that may have a substituent, or an aliphatic hydrocarbon residue that may have a substituent. $R_1$ to $R_4$ each represent preferably a hydrogen atom and an aliphatic hydrocarbon residue that may have a substituent, more preferably an aliphatic hydrocarbon residue that may have a substituent, particularly preferably a saturated alkyl group containing 1 to 18 carbon atoms, and extremely preferably a saturated linear alkyl group containing 1 to 8 carbon atoms. In addition, $R_1$ may bind to $R_2$, and $R_3$ may bind to $R_4$, respectively to form a ring that may have a substituent.

In the above descriptions, the term "aromatic residue" in "an aromatic residue that may have a substituent" is used to mean a group formed by eliminating a single hydrogen atom from an aromatic ring. Specific examples of the aromatic ring include: aromatic hydrocarbon rings such as benzene, naphthalene, anthracene, phenanthrene, pyrene, perylene, or terylene; heteroaromatic rings such as indene, azulene, pyridine, pyrazine, pyrimidine, pyrazole, pyrazolidine, thiazolidine, oxazolidine, pyran, chromene, pyrrole, pyrrolidine, benzimidazole, imidazoline, imidazolidine, imidazole, pyrazole, triazole, triazine, diazole, indoline, thiophene, thienothiophene, furan, oxazole, oxadiazole, thiazine, thiazole, indole, benzothiazole, benzothiadiazole, naphthothiazole, benzoxazole, naphthoxazole, indolenine, benzoindolenine, pyrazine, quinoline, or quinazoline; and condensed aromatic rings such as fluorene or carbazole. The aromatic residue preferably has an aromatic ring (aromatic rings and condensed rings including the aromatic rings) containing 5 to 16 carbon atoms.

In the above descriptions, an aliphatic hydrocarbon residue in "an aliphatic hydrocarbon residue that may have a substituent" includes a saturated or unsaturated, liner, branched, or cyclic alkyl group. The number of carbon atoms contained is preferably 1 to 36, and more preferably 1 to 18. An example of a cyclic alkyl group is cycloalkyl containing 3 to 8 carbon atoms. Specific examples of the aliphatic hydrocarbon residue include methyl, ethyl, n-propyl, isopropyl, n-butyl, isobutyl, sec-butyl, t-butyl, n-pentyl, n-hexyl, n-heptyl, n-octyl, n-nonyl, n-decyl, n-undecyl, n-dodecyl, n-tridecyl, n-tetradecyl, n-pentadecyl, n-hexadecyl, n-heptadecyl, n-octadecyl, cyclohexyl, vinyl, propenyl, pentynyl, butenyl, hexenyl, hexadienyl, isopropenyl, isohexenyl, cyclohexenyl, cyclopentadienyl, ethynyl, propynyl, pentynyl, hexynyl, isohexynyl, and cyclohexynyl. A particularly preferred aliphatic hydrocarbon residue is the aforementioned linear alkyl group containing 1 to 8 carbon atoms.

The type of a substituent used in the aforementioned "aromatic residue that may have a substituent" and "aliphatic hydrocarbon residue that may have a substituent" is not particularly limited. Examples of the substituent include sulfonic acid, sulfamoyl, cyano, isocyano, thiocyanate, isothiocyanate, nitro, nitrosyl, a halogen atom, hydroxyl, phosphoric acid, a phosphoric ester group, a substituted or unsubstituted amino group, an optionally substituted mercapto group, an optionally substituted amide group, an alkoxyl group that may have a substituent, an aryloxy group that may have a substituent, carboxyl, carbamoyl, an acyl group, aldehyde, an alkoxycarbonyl group, a substituted carbonyl group such as arylcarbonyl, and the aforementioned aromatic residue that may have a substituent and aliphatic hydrocarbon residue that may have a substituent. Examples of the aforementioned halogen atom include atoms such as fluorine, chlorine, bromine, or iodine. Of these, a bromine atom and a chlorine atom are preferable. An example of the aforementioned phosphoric ester group is (C1-C4) alkyl phosphate. Specific examples of a preferred phosphoric ester group include methyl phosphate, ethyl phosphate, (n-propyl) phosphate, and (n-butyl) phosphate. Preferred examples of the aforementioned substituted or unsubstituted amino group include: alkyl substituted amino groups such as amino, mono or dimethylamino, mono or diethylamino, or mono or di(n-propyl)amino; aromatic substituted amino groups such as mono or diphenylamino, or mono or dinaphthylamino; amino groups wherein an alkyl group and an aromatic hydrocarbon residue are substituted, such as monoalkylmonophenylamino; benzylamino; acetylamino; and phenylacetylamino. Preferred examples of the aforementioned optionally substituted mercapto group include mercapto and an alkylmercapto group. Specific examples include C1-C4 alkylmercapto groups such as methylmercapto, ethylmercapto, n-propylmercapto, isopropylmercapto, n-butylmercapto, isobutylmercapto, sec-butylmercapto, or t-butylmercapto; and phenylmercapto. Examples of the aforementioned optionally substituted amide group include amide, acetamide, and an alkylamide group. Specific examples of a preferred optionally substituted amide group include amide, acetamide, N-methylamide, N-ethylamide, N-(n-propyl)amide, N-(n-butyl)amide, N-isobutylamide, N-(sec-butylamide), N-(t-butyl)amide, N,N-dimethylamide, N,N-diethylamide, N,N-di(n-propyl)amide, N,N-di(n-butyl)amide, N,N-diisobutylamide, N-methylacetamide, N-ethylacetamide, N-(n-propyl)acetamide, N-(n-butyl)acetamide, N-isobutylacetamide, N-(sec-butyl)acetamide, N-(t-butyl)acetamide, N,N-dimethylacetamide, N,N-diethylacetamide, N,N-di(n-propyl)acetamide, N,N-di(n-butyl)acetamide, and N,N-diisobutylacetamide. Another example is an arylamide group. Specific examples of the preferred arylamide group include phenylamide, naphthylamide, phenylacetamide, and naphthylacetamide. Preferred examples of the aforementioned alkoxyl group that may have a substituent include methoxy, ethoxy, n-propoxy, isopropoxy, n-butoxy, isobutoxy, sec-butoxy, and t-butoxy. Preferred examples of the aforementioned aryloxy group that may have a substituent include a phenoxy group and a naphthoxy group. Such aryloxy groups may have a phenyl group or a methyl group as a substituent.

Examples of the aforementioned acyl group include an alkylcarbonyl group containing 1 to 10 carbon atoms and an arylcarbonyl group. An alkylcarbonyl group containing 1 to 4 carbon atoms is preferable. Specific examples include acetyl, propionyl, trifluoromethylcarbonyl, pentafluoroethylcarbonyl, benzoyl, and naphthoyl. An example of the aforementioned alkoxycarbonyl group is an alkoxycarbonyl group containing 1 to 10 carbon atoms. Specific examples include methoxycarbonyl, ethoxycarbonyl, n-propoxycarbonyl, isopropoxycarbonyl, n-butoxycarbonyl, isobutoxycarbonyl, sec-butoxycarbonyl, t-butoxycarbonyl, n-pentoxycarbonyl, n-hexyloxycarbonyl, n-heptyloxycarbonyl, n-nonyloxycarbonyl, and n-decyloxycarbonyl. The aforementioned arylcarbonyl group indicates a group formed by connecting an aryl group such as benzophenone or naphthophenone with a carbonyl group. The aforementioned aromatic residue that may have a substituent and aliphatic hydrocarbon residue that may have a substituent, which are used as "substituents," may be the same as those described above.

In the above Formula (1), X and Y each independently represent a hydrogen atom, an aromatic residue that may have a substituent, an aliphatic hydrocarbon residue that may have a substituent, carboxyl, phosphic acid, sulfonic acid, a cyano group, an acyl group, an optionally substituted amide group, or an alkoxycarbonyl group. The aromatic residue that may have a substituent, aliphatic hydrocarbon residue that may have a substituent, acyl group, optionally substituted amide group, and alkoxycarbonyl group, which are used herein, may be the same as those described in the aforementioned section regarding $R_1$ to $R_4$. The aforementioned X and Y are preferably carboxyl, phosphoric acid, cyano, and acyl groups. More preferably, X and Y each independently represent a carboxyl group, a cyano group, or an acyl group (however, either X or Y is a carboxyl group). Particularly preferably, either X or Y is carboxyl and the other is cyano or acyl, and extremely preferably, either X or Y is carboxyl and the other is cyano. Moreover, at least either X or Y may be a ring structure group having, as a substituent, at least one group selected from the group consisting of a carboxyl group, a hydroxyl group, a phosphoric acid group, and a sulfonic acid group, and furthermore, such a ring structure group is preferably represented by any one of the following Formulas (1001) to (1033).

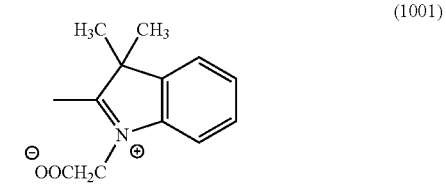

(1001)

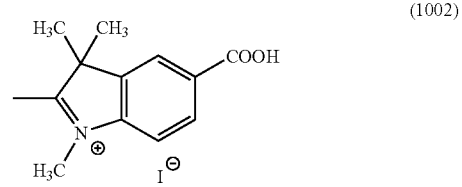

(1002)

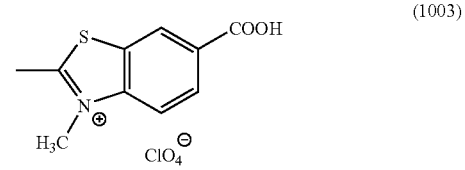

(1003)

-continued (1004)

(1005)

(1006)

(1007)

(1008)

(1009)

(1010)

(1011)

-continued (1012)

(1013)

(1014)

(1015)

(1016)

(1017)

(1018)

(1019)

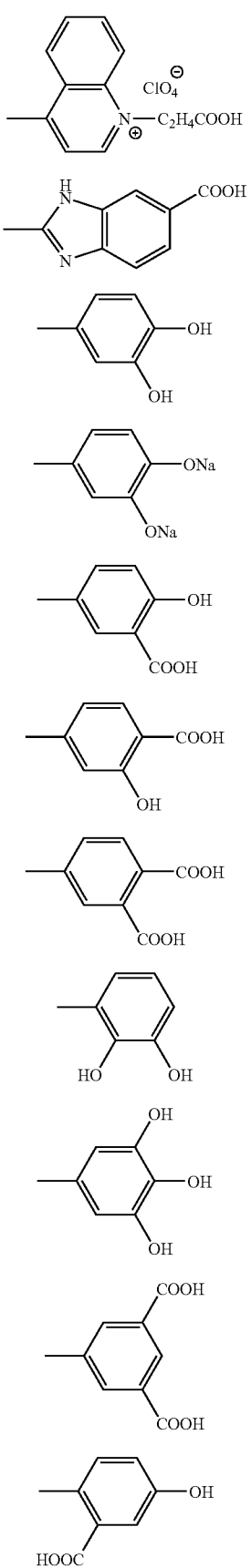

(1020) 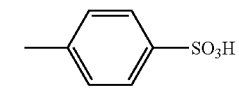

(1021)

(1022) 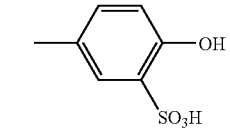

(1023) 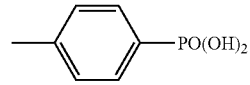

(1024)

(1025)

(1026)

(1027)

(1028)

(1029)

(1030)

(1031)

(1032)

(1033)

Furthermore, X may bind to Y to form a ring that may have a substituent. Such rings that may be formed as a result of the bond between X and Y include rings represented by the following Formulas (2001) to (2044). Of these, ring structures having a carboxyl group as a substituent are preferable, ring structures represented by Formulas (2007) and (2012) are particularly preferable, and a ring structure represented by Formula (2007) is extremely preferable.

(2001) 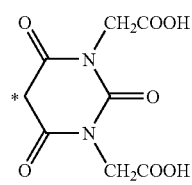

(2002) 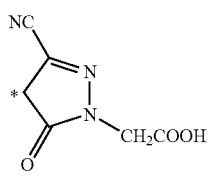

(2003) 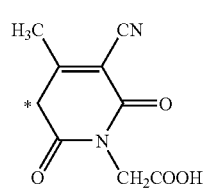

(2004) 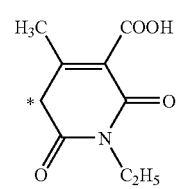

(2005) 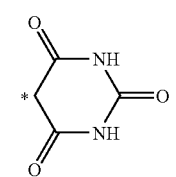

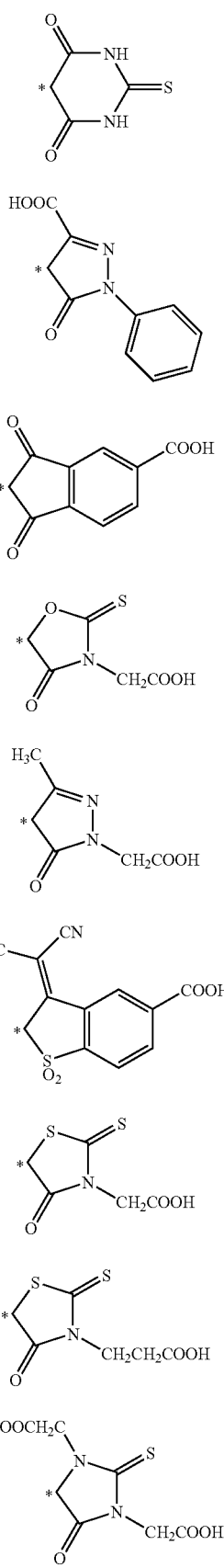
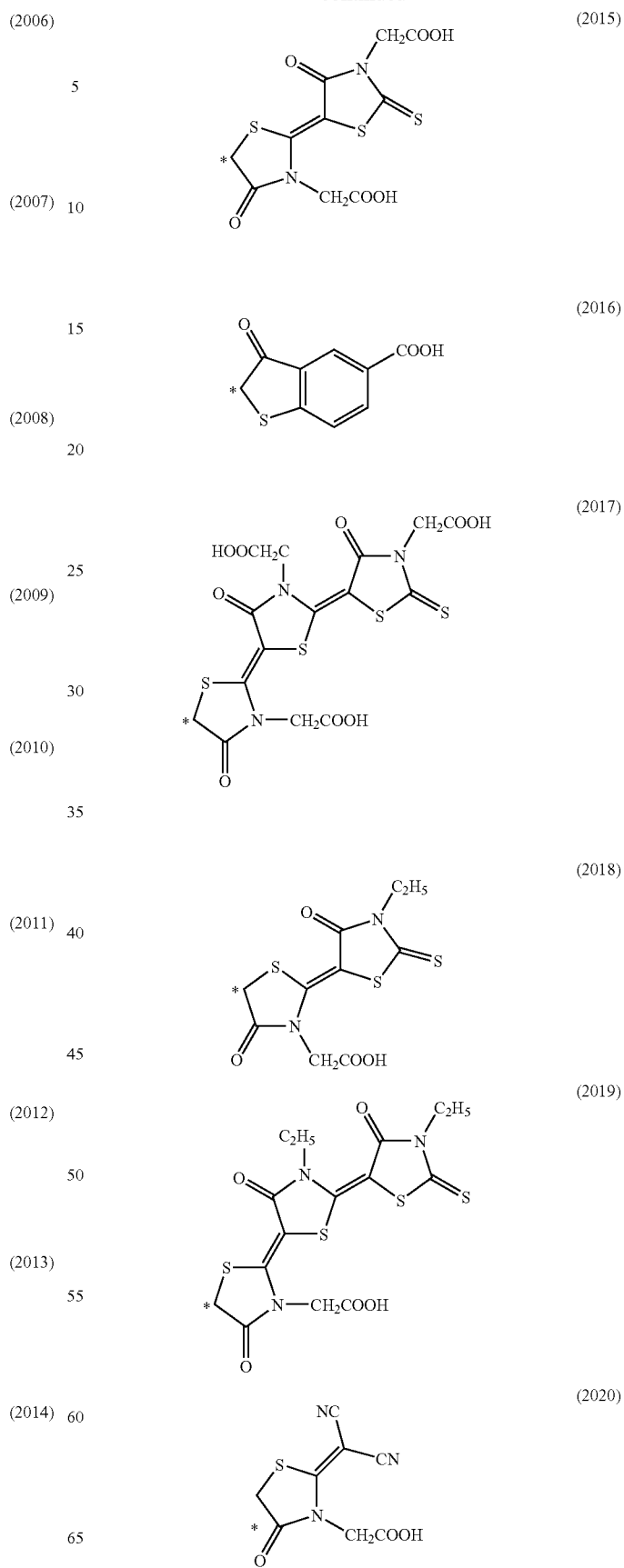

-continued
(2021) 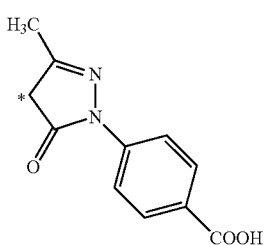
(2022) 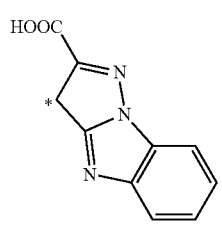
(2023) 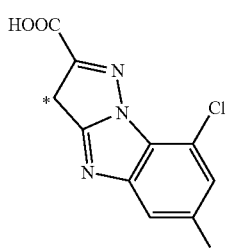
(2024) 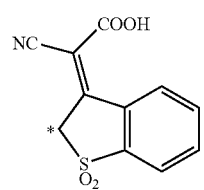
(2025) 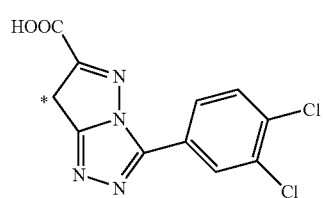
(2026) 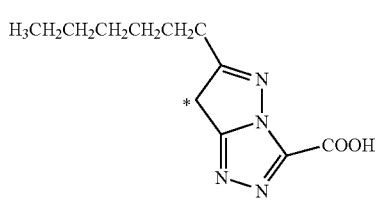
(2027) 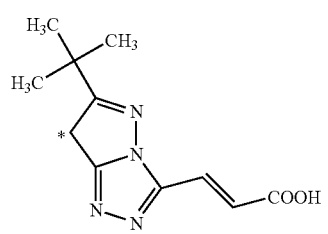
-continued
(2028) 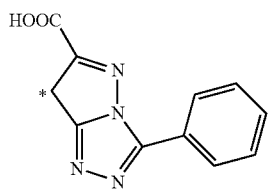
(2029) 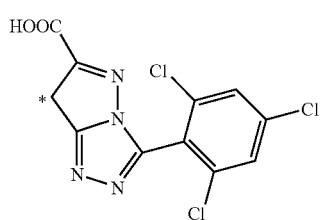
(2030) 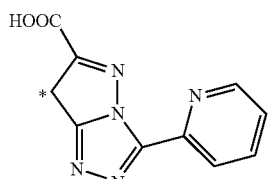
(2031) 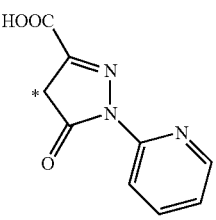
(2032) 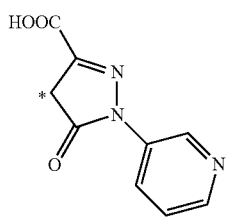
(2033) 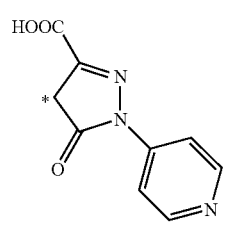
(2034) 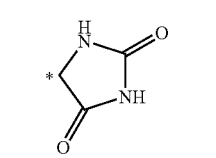
(2035) 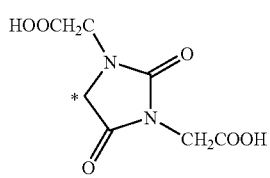

(2036) 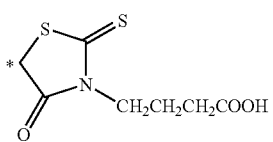

(2037) 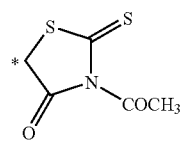

(2038) 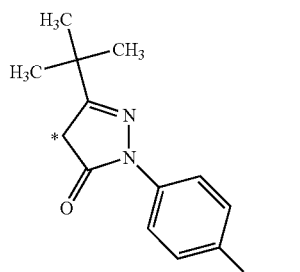

(2039) 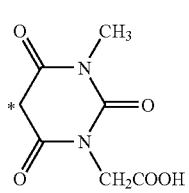

(2040) 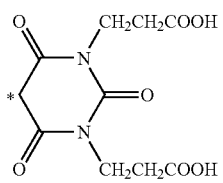

(2041) 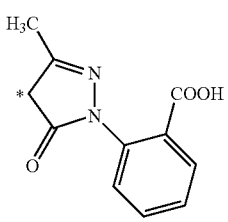

(2042) 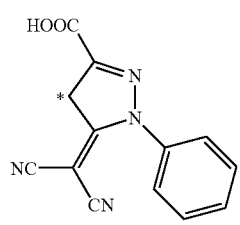

(2043) 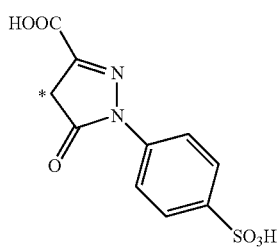

(2044)

The * portion in the above Formulas (2001) to (2044) indicates a carbon atom where X binds to Y in Formula (1).

In the above Formula (1), Z('s) represents an oxygen atom, a sulfur atom, a selenium atom, or $NR_5$. Z('s) is preferably an oxygen atom, a sulfur atom, or a selenium atom, and it is more preferably a sulfur atom. $R_5$ represents a hydrogen atom, an aromatic residue that may have a substituent, or an aliphatic hydrocarbon residue that may have a substituent. The aromatic residue that may have a substituent and the aliphatic hydrocarbon residue that may have a substituent may be the same as those described in the aforementioned section regarding $R_1$ to $R_4$. When m is 2 or greater and plural Z's exist, the plural Z's may be identical to or different from one another.

In the above Formula (1), $A_1$, $A_2$('s), $A_3$('s), $A_4$('s), and $A_5$('s) may be identical to or different from one another, and each of them represents a hydrogen atom, an aromatic residue that may have a substituent, an aliphatic hydrocarbon residue that may have a substituent, a hydroxyl group, a phosphoric acid group, a cyano group, a halogen atom, a carboxyl group, a carbonamide group, an amide group that may have a substituent, an alkoxyl group, an aryloxy group, an alkoxycarbonyl group, an arylcarbonyl group, or an acyl group.

The aforementioned aromatic residue that may have a substituent, aliphatic hydrocarbon residue that may have a substituent, halogen atom, amide group that may have a substituent, alkoxyl group, aryloxy group, alkoxycarbonyl group, arylcarbonyl group, and acyl group may be the same as those described in the aforementioned section regarding $R_1$ to $R_4$. Preferred examples of $A_1$, $A_2$('s), $A_3$('s), $A_4$('s), and $A_5$('s) may include a hydrogen atom and an aliphatic hydrocarbon group that may have a substituent. In addition, when n is 2 or greater and plural $A_2$'s and $A_3$'s exist, each of the $A_2$'s and $A_3$'s may be identical to or different from one another. Moreover, when n is an integer other than 0, $A_1$ and/or $A_2$('s) and/or $A_3$('s) in combination may form a ring that may have a substituent. Examples of the ring that may have a substituent may include an unsaturated hydrocarbon ring that may have a substituent and a heterocyclic ring that may have a substituent.

Examples of the aforementioned unsaturated hydrocarbon ring may include benzene, naphthalene, anthracene, phenanthrene, pyrene, indene, azulene, fluorene, cyclobutene, cyclohexene, cyclopentene, cyclohexadiene, and cyclopentadiene. Examples of the aforementioned heterocyclic ring may include pyran, pyridine, pyrazine, piperidine, indoline, oxazole, thiazole, thiadiazole, oxadiazole, indole, benzothiazole, benzoxazole, quinoline, carbazole, and benzopyran. Of these, benzene, cyclobutene, cyclopentene, and cyclohexene are preferable. Further, these may have a substituent, as described above. As a substituent, the same substituents as those described in the section of substituents in the "aromatic hydrocarbon residue that may have a substituent" and the "aliphatic hydrocarbon residue that may have a substituent" may be applied. When the ring to be formed is a heterocyclic ring that may have a substituent, which has carbonyl, thiocarbonyl or the like, it may form a cyclic ketone, a cyclic thioketone or the like. Such rings may further have a substituent. In such a case, as a substituent, the same substituents as those described in the section of substituents in the "aromatic hydrocarbon residue that may have a substituent" and the "aliphatic hydrocarbon residue that may have a substituent" may be applied.

In addition, when n is an integer other than 0 and m is 0, $A_1$ and/or $A_2$('s) and/or $A_3$('s) may form, together with a benzene ring a, a ring that may have a substituent. When m is 2 or greater and plural $A_4$ and $A_5$ exist, each of the $A_4$'s and $A_5$'s may be identical to or different from one another. Moreover, when m is an integer other than 0, $A_4$('s) and $A_5$('s) may form a ring that may have a substituent. Furthermore, $A_4$('s) and/or $A_5$('s) may form, together with a benzene ring a, a ring that may have a substituent. Examples of the ring that may have a substituent include an unsaturated hydrocarbon ring that may have a substituent and a heterocyclic ring that may have a substituent.

Still further, in the above Formula (1), either $A_4$ or $A_5$ (when m is 1), or at least one of $A_4$'s and $A_5$'s that exist plurally (when m is 2 or greater) is preferably an aliphatic hydrocarbon residue that may have a substituent. The aliphatic hydrocarbon residue that may have a substituent is more preferably a saturated alkyl group that may have a substituent. The saturated alkyl group is particularly preferably an n-hexyl group. $A_5$ in the Formula (1) or (2) is extremely preferably an n-hexyl group.

In the above Formula (1), the benzene ring a may have 1 to 4 substituents selected from the group consisting of an aromatic residue that may have a substituent, an aliphatic hydrocarbon residue that may have a substituent, a hydroxyl group, a phosphoric acid group, a cyano group, a nitro group, a halogen atom, a carboxyl group, a carbonamide group, an alkoxycarbonyl group, an arylcarbonyl group, an alkoxyl group, an aryloxy group, an amide group, an acetamide group, an acyl group, and a substituted or unsubstituted amino group. In addition, when plural substituents exist on the benzene ring a, the substituents may bind to one another or may bind to $A_1$ and/or $A_2$ and/or $A_3$, or to $A_4$ and/or $A_5$, to form a ring that may have a substituent. As the aromatic residue that may have a substituent, an aliphatic hydrocarbon residue that may have a substituent, a halogen atom, an alkoxycarbonyl group, an arylcarbonyl group, an alkoxyl group, an aryloxy group, an amide group, an acyl group, and a substituted or unsubstituted amino group, the same groups as those described in the aforementioned section regarding $R_1$ to $R_4$ may be applied.

In the above Formula (1), the benzene ring b may have 1 to 3 substituents selected from the group consisting of an aromatic residue that may have a substituent, an aliphatic hydrocarbon residue that may have a substituent, a hydroxyl group, a phosphoric acid group, a cyano group, a nitro group, a halogen atom, a carboxyl group, a carbonamide group, an alkoxycarbonyl group, an arylcarbonyl group, an alkoxyl group, an aryloxy group, an amide group, an acetamide group, an acyl group, and a substituted or unsubstituted amino group. As the aromatic residue that may have a substituent, an aliphatic hydrocarbon residue that may have a substituent, a halogen atom, an alkoxycarbonyl group, an arylcarbonyl group, an alkoxyl group, an aryloxy group, an amide group, an acyl group, and a substituted or unsubstituted amino group, the same groups as those described in the aforementioned section regarding $R_1$ to $R_4$ may be applied.

In the above Formula (1), the benzene ring c may have 1 to 4 substituents selected from the group consisting of an aromatic residue that may have a substituent, an aliphatic hydrocarbon residue that may have a substituent, a hydroxyl group, a phosphoric acid group, a cyano group, a nitro group, a halogen atom, a carboxyl group, a carbonamide group, an alkoxycarbonyl group, an arylcarbonyl group, an alkoxyl group, an aryloxy group, an amide group, an acetamide group, an acyl group, and a substituted or unsubstituted amino group. As the aromatic residue that may have a substituent, an aliphatic hydrocarbon residue that may have a substituent, a halogen atom, an alkoxycarbonyl group, an arylcarbonyl group, an alkoxyl group, an aryloxy group, an amide group, an acyl group, and a substituted or unsubstituted amino group, the same groups as those described in the aforementioned section regarding $R_1$ to $R_4$ may be applied.

However, a case where n is 0, m is 1, Z('s) represents a sulfur atom, X represents a carboxyl group, Y represents a cyano group, $A_1$, $A_4$, and $A_5$ each represent a hydrogen atom, $R_1$ to $R_4$ each represent a methyl group, and the benzene rings a, b, and c are unsubstituted is excluded.

The above Formula (1) is more preferably the following Formula (2):

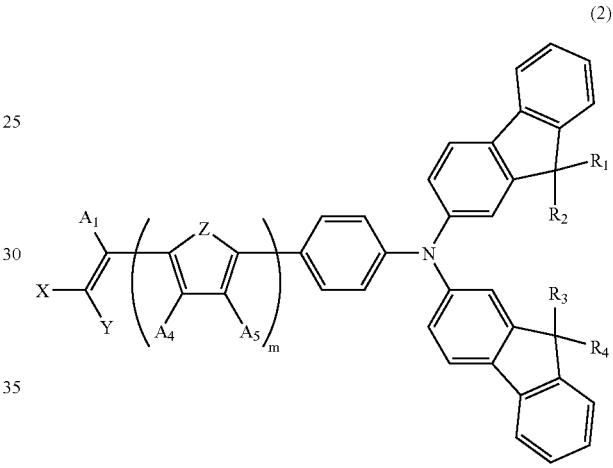

In the above Formula (2), m, X, Y, Z, $A_1$, $A_4$, $A_5$, and $R_1$ to $R_4$ may be the same as those in the above Formula (1).

Moreover, when the methine dye represented by the above Formula (1) or (2) has an acidic group such as a carboxyl group, a phosphoric acid group, a hydroxyl group or a sulfonic acid group as a substituent, it may form a salt thereof. Examples of the salt include: salts with alkaline metals such as lithium, sodium or potassium; salts with alkaline-earth metals such as magnesium or calcium; and salts of quaternary ammonium such as tetramethylammonium, tetrabutylammonium, pyridinium, imidazolium, piperazinium, piperidinium.

The methine dye represented by the above Formula (1) or (2) may have a structural isomer such as a cis form, a trans form, or a racemic form, but it is not particularly limited. All such isomers can be favorably used as a photosensitizing dye in the present invention.

A preferred combination of substituents in the above Formula (1) is as follows. That is, n represents an integer between 0 and 5, m represents an integer between 0 and 5, Z('s) represents a group selected from the group consisting of an oxygen atom, a sulfur atom, a selenium atom, amino, N-methylamino, and N-phenylamino, $R_1$ is identical to $R_2$, $R_3$ is identical to $R_4$, and $R_1$ to $R_4$ each represent a group selected from the group consisting of a hydrogen atom, a linear unsubstituted C1-C18 alkyl, cyclopentyl, phenyl, chloroethyl, and acetyl; X and Y each represent a group selected from the group consisting of a hydrogen atom, cyano, carboxyl, a phosphoric acid group, acetyl, and trifluoroacetyl (provided that in this case, either X or Y represents a carboxyl group). Otherwise, either X or Y is a group represented by any one of the aforementioned Formulas (1001) to (1033) and the other is a hydrogen atom, or X and Y form a ring and the ring is a group selected from the group consisting of the groups represented by the aforementioned Formulas (2001) to (2044). (In Formulas (2001) to (2044), the symbol * indicates a carbon atom where X binds to Y in Formula (1)). $A_1$('s) to $A_5$('s) each are a group selected from the group consisting of a hydrogen atom, methyl, a chlorine atom, cyano, n-hexyl, and n-butyl, and the benzene rings a, b and c are unsubstituted (provided that a case where n is 0, m is 1, Z('s) represents a sulfur atom, X represents a carboxyl group, Y represents a cyano group, $A_1$, $A_4$, and $A_5$ each represent a hydrogen atom, $R_1$ to $R_4$ each represent a methyl group, and the benzene rings a, b, and c are unsubstituted is excluded).

Among the aforementioned combinations, a particularly preferred combination is as follows. That is, n is 0, m is an integer between 1 and 3, Z('s) represents a sulfur atom, $R_1$ to $R_4$ each represent an unsubstituted linear C1-C18 alkyl group, and the benzene rings a, b, and c are all unsubstituted, either X or Y represents a carboxyl group and the other represents a cyano group, or the ring formed as a result of the bond between X and Y is a group selected from among the groups represented by the aforementioned Formulas (2005), (2007), and (2012), and $A_1$, $A_4$ and $A_5$ each represent a hydrogen atom (provided that a case where n is 0, m is 1, Z('s) represents a sulfur atom, X represents a carboxyl group, Y represents a cyano group, $A_1$, $A_4$, and $A_5$ each represent a hydrogen atom, $R_1$ to $R_4$ each represent a methyl group, and the benzene rings a, b, and c are unsubstituted is excluded).

As shown in the aforementioned Formulas (1001) to (1017), (1019) and (1020), a counterion for neutralizing the positive charge of a nitrogen atom may be formed either intermolecularly or intramolecularly. Examples of a preferred counterion that is formed intermolecularly include anions of iodine, perchloric acid, bistrifluoromethylsulfonimide, tristrifluoromethylsulfonylmethane, hexafluoride antimonate, tetrafluoroboric acid, and the like. Examples of a preferred counterion that is formed intramolecularly include anions of acetic acid-2-yl, propionic acid-3-yl, and sulfoethane-2-yl, which bind to a nitrogen atom having a positive charge.

The methine dye represented by the above Formula (1) can be produced by the reaction formula as shown below, for example. Compound (4) is iodinated to obtain Compound (5). Compound (5) is subjected to a substitution reaction or the like to induce it to Compound (6) or (7). Compound (6) or (7) and Compound (8) are subjected to a Ullmann reaction or the like to obtain Compound (9). Subsequently, when m is 0 in the above Formula (1), Compound (9) is subjected to a Vilsmeier-Haack reaction or the like for formylation to obtain a carbonyl Compound (10). This compound represented by Formula (10) and a compound having active methylene represented by Formula (11) are condensed, if necessary, in the presence of a basic catalyst such as sodium hydroxide, sodium methylate, sodium acetate, diethylamine, triethylamine, piperidine, piperazine or diazabicycloundecene, in a solvent including alcohols such as methanol, ethanol, isopropanol or butanol, aprotic polar solvents such as dimethylformamide or N-methylpyrrolidone, toluene, acetic anhydride, acetonitrile, etc., at a temperature between 20° C. and 180° C., and preferably between 50° C. and 150° C., thereby obtaining the methine compound (dye) of the present invention represented by Formula (1). When m is 1 or greater in Formula (1), Compound (9) is halogenated (is iodinated, for example) to obtain Compound (12), and it is condensed with a boronic acid analog (13) to obtain Compound (14). This Compound (14) is subjected to a Vilsmeier-Haack reaction or the like for formylation to obtain a carbonyl Compound (15). As necessary, this compound represented by Formula (15) and a compound having active methylene represented by Formula (11) are condensed in the presence of a basic catalyst such as sodium hydroxide, sodium methylate, sodium acetate, diethylamine, triethylamine, piperidine, piperazine or diazabicycloundecene, in a solvent including alcohols such as methanol, ethanol, isopropanol or butanol, aprotic polar solvents such as dimethylformamide or N-methylpyrrolidone, toluene, acetic anhydride, acetonitrile, etc., at a temperature between 20° C. and 180° C., and preferably between 50° C. and 150° C., thereby obtaining the methine compound (dye) of the present invention represented by Formula (1). In the above reaction, when Compound (11) having active methylene has an ester group, it is also possible to obtain a carboxylic acid analog by performing hydrolysis or the like after the condensation reaction.

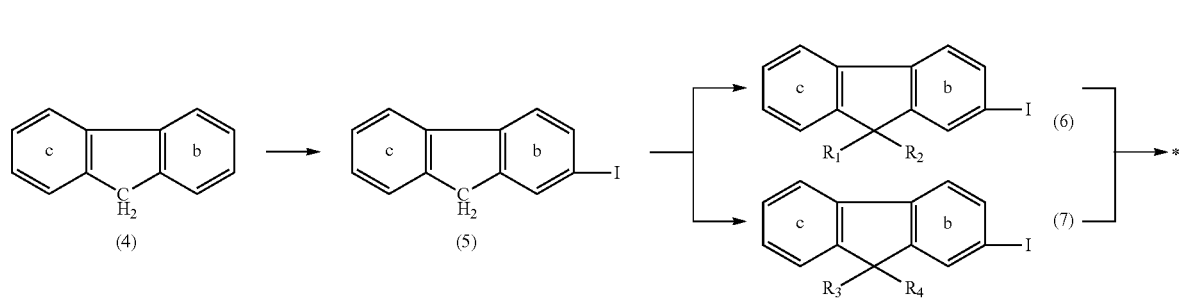

-continued
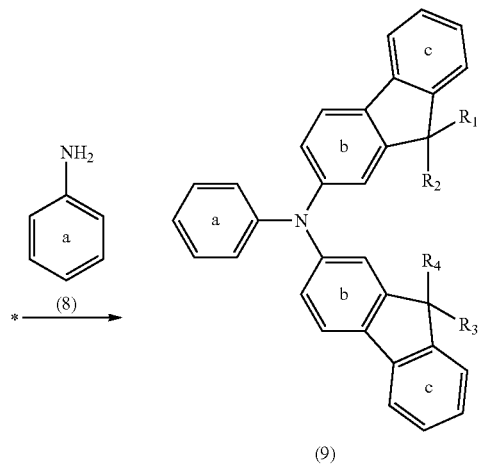
When m = 0
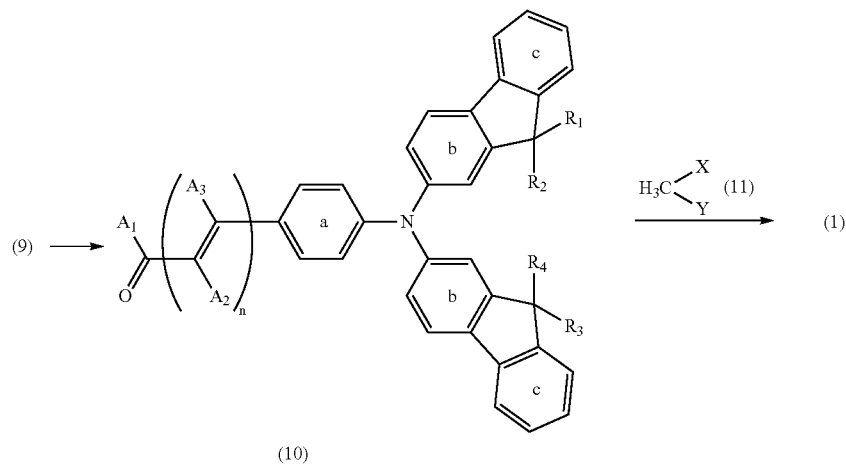
When m = 1 or greater
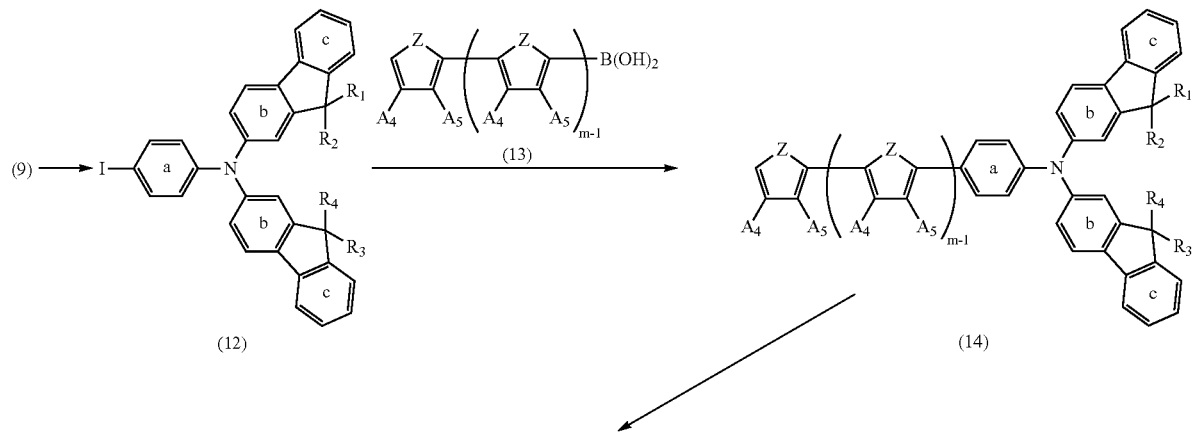

-continued

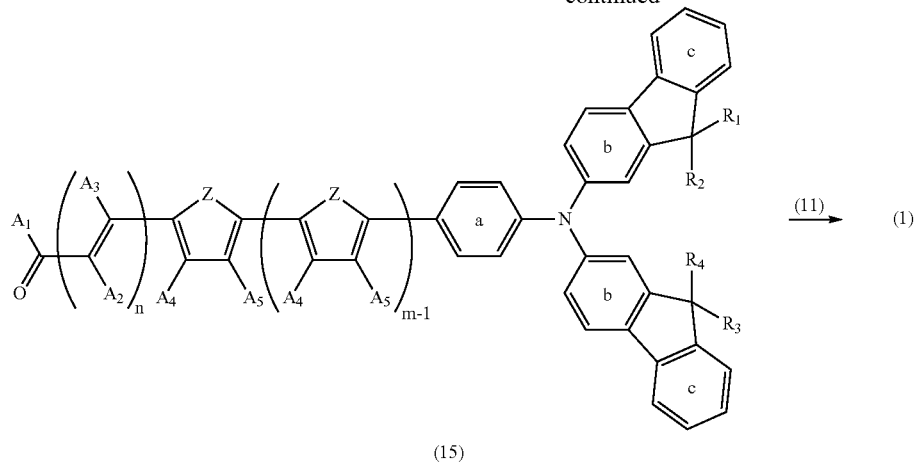

(15) → (11) (1)

Specific examples of the methine dye represented by Formula (1) will be given below. First, specific examples of the methine dye represented by the following Formula (16) will be shown in Tables 1 to 5. In each table, Ph indicates a phenyl group. In addition, the expression "(1001) to (1033)" corresponds to the above Formulas (1001) to (1033), and the expression "(2001) to (2017)" corresponds to the above Formulas (2001) to (2017). Each of the formulas indicates a ring in a case where $X_1$ and $Y_1$ form a ring that may have a substituent.

TABLE 1

(16)

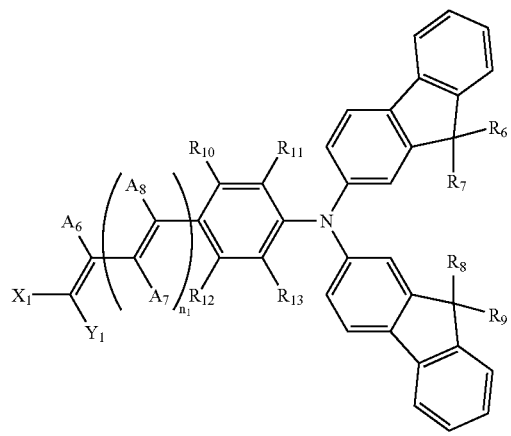

| Compound | $n_1$ | $X_1$ | $Y_1$ | $A_6$ | $A_7$ | $A_8$ | $R_6$ | $R_7$ | $R_8$ | $R_9$ | $R_{10}$ | $R_{11}$ | $R_{12}$ | $R_{13}$ |
|---|---|---|---|---|---|---|---|---|---|---|---|---|---|---|
| 1 | 0 | COOH | CN | H | — | — | H | H | H | H | H | H | H | H |
| 2 | 0 | COOH | COOH | H | — | — | H | H | H | H | H | H | H | H |
| 3 | 0 | COOH | COCH$_3$ | H | — | — | H | H | H | H | H | H | H | H |
| 4 | 0 | COOH | CN | H | — | — | CH$_3$ | CH$_3$ | CH$_3$ | CH$_3$ | H | H | H | H |
| 5 | 0 | COOLi | CN | H | — | — | CH$_3$ | CH$_3$ | CH$_3$ | CH$_3$ | H | H | H | H |
| 6 | 0 | COONa | CN | H | — | — | CH$_3$ | CH$_3$ | CH$_3$ | CH$_3$ | H | H | H | H |
| 7 | 0 | COOK | CN | H | — | — | CH$_3$ | CH$_3$ | CH$_3$ | CH$_3$ | H | H | H | H |
| 8 | 0 | PO(OH)$_2$ | CN | H | — | — | CH$_3$ | CH$_3$ | CH$_3$ | CH$_3$ | H | H | H | H |
| 9 | 0 | COOH | COCH$_3$ | H | — | — | CH$_3$ | CH$_3$ | CH$_3$ | CH$_3$ | H | H | H | H |
| 10 | 0 | COOH | COCF$_3$ | H | — | — | CH$_3$ | CH$_3$ | CH$_3$ | CH$_3$ | H | H | H | H |
| 11 | 0 | COOH | CN | H | — | — | C$_2$H$_5$ | C$_2$H$_5$ | C$_2$H$_5$ | C$_2$H$_5$ | H | H | H | H |
| 12 | 0 | COOH | CN | H | — | — | C$_3$H$_7$ | C$_3$H$_7$ | C$_3$H$_7$ | C$_3$H$_7$ | H | H | H | H |
| 13 | 0 | COOH | CN | H | — | — | C$_4$H$_9$ | C$_4$H$_9$ | C$_4$H$_9$ | C$_4$H$_9$ | H | H | H | H |
| 14 | 0 | COOH | CN | H | — | — | C$_5$H$_{11}$ | C$_5$H$_{11}$ | C$_5$H$_{11}$ | C$_5$H$_{11}$ | H | H | H | H |
| 15 | 0 | COOH | CN | H | — | — | C$_6$H$_{13}$ | C$_6$H$_{13}$ | C$_6$H$_{13}$ | C$_6$H$_{13}$ | H | H | H | H |
| 16 | 0 | COOH | CN | H | — | — | C$_8$H$_{17}$ | C$_8$H$_{17}$ | C$_8$H$_{17}$ | C$_8$H$_{17}$ | H | H | H | H |
| 17 | 0 | COOH | CN | H | — | — | C$_{18}$H$_{37}$ | C$_{18}$H$_{37}$ | C$_{18}$H$_{37}$ | C$_{18}$H$_{37}$ | H | H | H | H |
| 18 | 0 | COOH | CN | H | — | — | CH$_3$ | C$_4$H$_9$ | CH$_3$ | C$_4$H$_9$ | H | H | H | H |
| 19 | 0 | COOH | CN | H | — | — | CH$_3$ | CH$_3$ | C$_4$H$_9$ | C$_4$H$_9$ | H | H | H | H |
| 20 | 0 | COOH | CN | CH$_3$ | — | — | C$_4$H$_9$ | C$_4$H$_9$ | C$_4$H$_9$ | C$_4$H$_9$ | H | H | H | H |
| 21 | 0 | COOH | CN | H | — | — | C$_4$H$_9$ | C$_4$H$_9$ | C$_4$H$_9$ | C$_4$H$_9$ | CH$_3$ | H | H | H |
| 22 | 0 | COOH | CN | H | — | — | C$_4$H$_9$ | C$_4$H$_9$ | C$_4$H$_9$ | C$_4$H$_9$ | CH$_3$ | H | H | CH$_3$ |
| 23 | 0 | COOH | CN | H | — | — | C$_4$H$_9$ | C$_4$H$_9$ | C$_4$H$_9$ | C$_4$H$_9$ | OH | H | H | H |

TABLE 1-continued

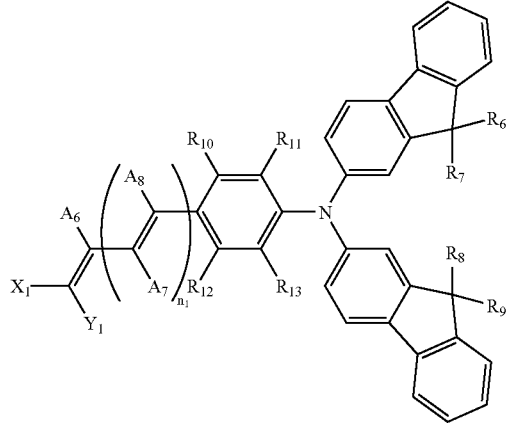

(16)

| Compound | $n_1$ | $X_1$ | $Y_1$ | $A_6$ | $A_7$ | $A_8$ | $R_6$ | $R_7$ | $R_8$ | $R_9$ | $R_{10}$ | $R_{11}$ | $R_{12}$ | $R_{13}$ |
|---|---|---|---|---|---|---|---|---|---|---|---|---|---|---|
| 24 | 0 | COOH | CN | $CH_3$ | — | — | $C_4H_9$ | $C_4H_9$ | $C_4H_9$ | $C_4H_9$ | $CH_3$ | $CH_3$ | $CH_3$ | $CH_3$ |
| 25 | 0 | COOH | CN | Cl | — | — | $C_4H_9$ | $C_4H_9$ | $C_4H_9$ | $C_4H_9$ | H | H | H | H |
| 26 | 0 | COOH | COOH | H | — | — | $C_4H_9$ | $C_4H_9$ | $C_4H_9$ | $C_4H_9$ | H | H | H | H |
| 27 | 0 | COOH | CN | H | — | — | $C_4H_9$ | $C_4H_9$ | $C_4H_9$ | $C_4H_9$ | $OCH_3$ | H | H | H |
| 28 | 0 | COOH | CN | H | — | — | $C_4H_9$ | $C_4H_9$ | $C_4H_9$ | $C_4H_9$ | $OCH_3$ | H | H | $CH_3$ |
| 29 | 0 | COOH | CN | H | — | — | $C_4H_9$ | $C_4H_9$ | $C_4H_9$ | $C_4H_9$ | Cl | H | H | H |
| 30 | 0 | COOH | CN | H | — | — | $C_4H_9$ | $C_4H_9$ | $C_4H_9$ | $C_4H_9$ | Br | H | H | H |

TABLE 2

| Compound | $n_1$ | $X_1$ | $Y_1$ | $A_6$ | $A_7$ | $A_8$ | $R_6$ | $R_7$ | $R_8$ | $R_9$ | $R_{10}$ | $R_{11}$ | $R_{12}$ | $R_{13}$ |
|---|---|---|---|---|---|---|---|---|---|---|---|---|---|---|
| 31 | 1 | COOH | CN | H | H | H | $C_4H_9$ | $C_4H_9$ | $C_4H_9$ | $C_4H_9$ | H | H | H | H |
| 32 | 2 | COOH | CN | H | H | H | $C_4H_9$ | $C_4H_9$ | $C_4H_9$ | $C_4H_9$ | H | H | H | H |
| 33 | 3 | COOH | CN | H | H | H | $C_4H_9$ | $C_4H_9$ | $C_4H_9$ | $C_4H_9$ | H | H | H | H |
| 34 | 4 | COOH | CN | H | H | H | $C_4H_9$ | $C_4H_9$ | $C_4H_9$ | $C_4H_9$ | H | H | H | H |
| 35 | 5 | COOH | CN | H | H | H | $C_4H_9$ | $C_4H_9$ | $C_4H_9$ | $C_4H_9$ | H | H | H | H |
| 36 | 1 | COOH | CN | $CH_3$ | $CH_3$ | $CH_3$ | $C_4H_9$ | $C_4H_9$ | $C_4H_9$ | $C_4H_9$ | H | H | H | H |
| 37 | 0 | (1001) | H | H | — | — | $C_4H_9$ | $C_4H_9$ | $C_4H_9$ | $C_4H_9$ | H | H | H | H |
| 38 | 0 | (1002) | H | H | — | — | $C_4H_9$ | $C_4H_9$ | $C_4H_9$ | $C_4H_9$ | H | H | H | H |
| 39 | 0 | (1003) | H | H | — | — | $C_4H_9$ | $C_4H_9$ | $C_4H_9$ | $C_4H_9$ | H | H | H | H |
| 40 | 0 | (1004) | H | H | — | — | $C_4H_9$ | $C_4H_9$ | $C_4H_9$ | $C_4H_9$ | H | H | H | H |
| 41 | 0 | (1005) | H | H | — | — | $C_4H_9$ | $C_4H_9$ | $C_4H_9$ | $C_4H_9$ | H | H | H | H |
| 42 | 0 | (1006) | H | H | — | — | $C_4H_9$ | $C_4H_9$ | $C_4H_9$ | $C_4H_9$ | H | H | H | H |
| 43 | 0 | (1007) | H | H | — | — | $C_4H_9$ | $C_4H_9$ | $C_4H_9$ | $C_4H_9$ | H | H | H | H |
| 44 | 0 | (1008) | H | H | — | — | $C_4H_9$ | $C_4H_9$ | $C_4H_9$ | $C_4H_9$ | H | H | H | H |
| 45 | 0 | (1009) | H | H | — | — | $C_4H_9$ | $C_4H_9$ | $C_4H_9$ | $C_4H_9$ | H | H | H | H |
| 46 | 0 | (1010) | H | H | — | — | $C_4H_9$ | $C_4H_9$ | $C_4H_9$ | $C_4H_9$ | H | H | H | H |
| 47 | 0 | (1011) | H | H | — | — | $C_4H_9$ | $C_4H_9$ | $C_4H_9$ | $C_4H_9$ | H | H | H | H |
| 48 | 0 | (1012) | H | H | — | — | $C_4H_9$ | $C_4H_9$ | $C_4H_9$ | $C_4H_9$ | H | H | H | H |
| 49 | 0 | (1013) | H | H | — | — | $C_4H_9$ | $C_4H_9$ | $C_4H_9$ | $C_4H_9$ | H | H | H | H |
| 50 | 0 | (1014) | H | H | — | — | $C_4H_9$ | $C_4H_9$ | $C_4H_9$ | $C_4H_9$ | H | H | H | H |
| 51 | 0 | (1015) | H | H | — | — | $C_4H_9$ | $C_4H_9$ | $C_4H_9$ | $C_4H_9$ | H | H | H | H |
| 52 | 0 | (1016) | H | H | — | — | $C_4H_9$ | $C_4H_9$ | $C_4H_9$ | $C_4H_9$ | H | H | H | H |
| 53 | 0 | (1017) | H | H | — | — | $C_4H_9$ | $C_4H_9$ | $C_4H_9$ | $C_4H_9$ | H | H | H | H |
| 54 | 0 | (1018) | H | H | — | — | $C_4H_9$ | $C_4H_9$ | $C_4H_9$ | $C_4H_9$ | H | H | H | H |
| 55 | 0 | (1019) | H | H | — | — | $C_4H_9$ | $C_4H_9$ | $C_4H_9$ | $C_4H_9$ | H | H | H | H |
| 56 | 0 | (1020) | H | H | — | — | $C_4H_9$ | $C_4H_9$ | $C_4H_9$ | $C_4H_9$ | H | H | H | H |
| 57 | 0 | (1021) | H | H | — | — | $C_4H_9$ | $C_4H_9$ | $C_4H_9$ | $C_4H_9$ | H | H | H | H |
| 58 | 0 | (1022) | H | H | — | — | $C_4H_9$ | $C_4H_9$ | $C_4H_9$ | $C_4H_9$ | H | H | H | H |
| 59 | 0 | (1023) | H | H | — | — | $C_4H_9$ | $C_4H_9$ | $C_4H_9$ | $C_4H_9$ | H | H | H | H |
| 60 | 0 | (1024) | H | H | — | — | $C_4H_9$ | $C_4H_9$ | $C_4H_9$ | $C_4H_9$ | H | H | H | H |

TABLE 3

| Compound | $n_1$ | $X_1$ | $Y_1$ | $A_6$ | $A_7$ | $A_8$ | $R_6$ | $R_7$ | $R_8$ | $R_9$ | $R_{10}$ | $R_{11}$ | $R_{12}$ | $R_{13}$ |
|---|---|---|---|---|---|---|---|---|---|---|---|---|---|---|
| 61 | 0 | (1025) | H | H | — | — | $C_4H_9$ | $C_4H_9$ | $C_4H_9$ | $C_4H_9$ | H | H | H | H |
| 62 | 0 | (1026) | H | H | — | — | $C_4H_9$ | $C_4H_9$ | $C_4H_9$ | $C_4H_9$ | H | H | H | H |
| 63 | 0 | (1027) | H | H | — | — | $C_4H_9$ | $C_4H_9$ | $C_4H_9$ | $C_4H_9$ | H | H | H | H |
| 64 | 0 | (1028) | H | H | — | — | $C_4H_9$ | $C_4H_9$ | $C_4H_9$ | $C_4H_9$ | H | H | H | H |

TABLE 3-continued

| Compound | $n_1$ | $X_1$ | $Y_1$ | $A_6$ | $A_7$ | $A_8$ | $R_6$ | $R_7$ | $R_8$ | $R_9$ | $R_{10}$ | $R_{11}$ | $R_{12}$ | $R_{13}$ |
|---|---|---|---|---|---|---|---|---|---|---|---|---|---|---|
| 65 | 0 | (1029) | H | H | — | — | $C_4H_9$ | $C_4H_9$ | $C_4H_9$ | $C_4H_9$ | H | H | H | H |
| 66 | 0 | (1030) | H | H | — | — | $C_4H_9$ | $C_4H_9$ | $C_4H_9$ | $C_4H_9$ | H | H | H | H |
| 67 | 0 | (1031) | H | H | — | — | $C_4H_9$ | $C_4H_9$ | $C_4H_9$ | $C_4H_9$ | H | H | H | H |
| 68 | 0 | (1032) | H | H | — | — | $C_4H_9$ | $C_4H_9$ | $C_4H_9$ | $C_4H_9$ | H | H | H | H |
| 69 | 0 | (1033) | H | H | — | — | $C_4H_9$ | $C_4H_9$ | $C_4H_9$ | $C_4H_9$ | H | H | H | H |
| 70 | 0 | (2001) |  | H | — | — | $C_4H_9$ | $C_4H_9$ | $C_4H_9$ | $C_4H_9$ | H | H | H | H |
| 71 | 0 | (2002) |  | H | — | — | $C_4H_9$ | $C_4H_9$ | $C_4H_9$ | $C_4H_9$ | H | H | H | H |
| 72 | 0 | (2003) |  | H | — | — | $C_4H_9$ | $C_4H_9$ | $C_4H_9$ | $C_4H_9$ | H | H | H | H |
| 73 | 0 | (2004) |  | H | — | — | $C_4H_9$ | $C_4H_9$ | $C_4H_9$ | $C_4H_9$ | H | H | H | H |
| 74 | 0 | (2005) |  | H | — | — | $C_4H_9$ | $C_4H_9$ | $C_4H_9$ | $C_4H_9$ | H | H | H | H |
| 75 | 0 | (2006) |  | H | — | — | $C_4H_9$ | $C_4H_9$ | $C_4H_9$ | $C_4H_9$ | H | H | H | H |
| 76 | 0 | (2007) |  | H | — | — | $C_4H_9$ | $C_4H_9$ | $C_4H_9$ | $C_4H_9$ | H | H | H | H |
| 77 | 0 | (2008) |  | H | — | — | $C_4H_9$ | $C_4H_9$ | $C_4H_9$ | $C_4H_9$ | H | H | H | H |
| 78 | 0 | (2009) |  | H | — | — | $C_4H_9$ | $C_4H_9$ | $C_4H_9$ | $C_4H_9$ | H | H | H | H |
| 79 | 0 | (2010) |  | H | — | — | $C_4H_9$ | $C_4H_9$ | $C_4H_9$ | $C_4H_9$ | H | H | H | H |
| 80 | 0 | (2011) |  | H | — | — | $C_4H_9$ | $C_4H_9$ | $C_4H_9$ | $C_4H_9$ | H | H | H | H |
| 81 | 0 | (2012) |  | H | — | — | $C_4H_9$ | $C_4H_9$ | $C_4H_9$ | $C_4H_9$ | H | H | H | H |
| 82 | 0 | (2013) |  | H | — | — | $C_4H_9$ | $C_4H_9$ | $C_4H_9$ | $C_4H_9$ | H | H | H | H |
| 83 | 0 | (2014) |  | H | — | — | $C_4H_9$ | $C_4H_9$ | $C_4H_9$ | $C_4H_9$ | H | H | H | H |
| 84 | 0 | (2015) |  | H | — | — | $C_4H_9$ | $C_4H_9$ | $C_4H_9$ | $C_4H_9$ | H | H | H | H |
| 85 | 0 | (2016) |  | H | — | — | $C_4H_9$ | $C_4H_9$ | $C_4H_9$ | $C_4H_9$ | H | H | H | H |
| 86 | 0 | (2017) |  | H | — | — | $C_4H_9$ | $C_4H_9$ | $C_4H_9$ | $C_4H_9$ | H | H | H | H |
| 87 | 1 | (1001) | H | H | H | H | $C_4H_9$ | $C_4H_9$ | $C_4H_9$ | $C_4H_9$ | H | H | H | H |
| 88 | 1 | (1002) | H | H | H | H | $C_4H_9$ | $C_4H_9$ | $C_4H_9$ | $C_4H_9$ | H | H | H | H |
| 89 | 1 | (1003) | H | H | H | H | $C_4H_9$ | $C_4H_9$ | $C_4H_9$ | $C_4H_9$ | H | H | H | H |
| 90 | 1 | (1004) | H | H | H | H | $C_4H_9$ | $C_4H_9$ | $C_4H_9$ | $C_4H_9$ | H | H | H | H |

TABLE 4

| Compound | $n_1$ | $X_1$ | $Y_1$ | $A_6$ | $A_7$ | $A_8$ | $R_6$ | $R_7$ | $R_8$ | $R_9$ | $R_{10}$ | $R_{11}$ | $R_{12}$ | $R_{13}$ |
|---|---|---|---|---|---|---|---|---|---|---|---|---|---|---|
| 91 | 1 | (1005) | H | H | H | H | $C_4H_9$ | $C_4H_9$ | $C_4H_9$ | $C_4H_9$ | H | H | H | H |
| 92 | 1 | (1006) | H | H | H | H | $C_4H_9$ | $C_4H_9$ | $C_4H_9$ | $C_4H_9$ | H | H | H | H |
| 93 | 1 | (1007) | H | H | H | H | $C_4H_9$ | $C_4H_9$ | $C_4H_9$ | $C_4H_9$ | H | H | H | H |
| 94 | 1 | (1008) | H | H | H | H | $C_4H_9$ | $C_4H_9$ | $C_4H_9$ | $C_4H_9$ | H | H | H | H |
| 95 | 1 | (1009) | H | H | H | H | $C_4H_9$ | $C_4H_9$ | $C_4H_9$ | $C_4H_9$ | H | H | H | H |
| 96 | 1 | (1010) | H | H | H | H | $C_4H_9$ | $C_4H_9$ | $C_4H_9$ | $C_4H_9$ | H | H | H | H |
| 97 | 1 | (1011) | H | H | H | H | $C_4H_9$ | $C_4H_9$ | $C_4H_9$ | $C_4H_9$ | H | H | H | H |
| 98 | 1 | (1012) | H | H | H | H | $C_4H_9$ | $C_4H_9$ | $C_4H_9$ | $C_4H_9$ | H | H | H | H |
| 99 | 1 | (1013) | H | H | H | H | $C_4H_9$ | $C_4H_9$ | $C_4H_9$ | $C_4H_9$ | H | H | H | H |
| 100 | 1 | (1014) | H | H | H | H | $C_4H_9$ | $C_4H_9$ | $C_4H_9$ | $C_4H_9$ | H | H | H | H |
| 101 | 1 | (1015) | H | H | H | H | $C_4H_9$ | $C_4H_9$ | $C_4H_9$ | $C_4H_9$ | H | H | H | H |
| 102 | 1 | (1016) | H | H | H | H | $C_4H_9$ | $C_4H_9$ | $C_4H_9$ | $C_4H_9$ | H | H | H | H |
| 103 | 1 | (1017) | H | H | H | H | $C_4H_9$ | $C_4H_9$ | $C_4H_9$ | $C_4H_9$ | H | H | H | H |
| 104 | 1 | (1018) | H | H | H | H | $C_4H_9$ | $C_4H_9$ | $C_4H_9$ | $C_4H_9$ | H | H | H | H |
| 105 | 1 | (1019) | H | H | H | H | $C_4H_9$ | $C_4H_9$ | $C_4H_9$ | $C_4H_9$ | H | H | H | H |
| 106 | 1 | (1020) | H | H | H | H | $C_4H_9$ | $C_4H_9$ | $C_4H_9$ | $C_4H_9$ | H | H | H | H |
| 107 | 1 | (1021) | H | H | H | H | $C_4H_9$ | $C_4H_9$ | $C_4H_9$ | $C_4H_9$ | H | H | H | H |
| 108 | 1 | (1022) | H | H | H | H | $C_4H_9$ | $C_4H_9$ | $C_4H_9$ | $C_4H_9$ | H | H | H | H |
| 109 | 1 | (1023) | H | H | H | H | $C_4H_9$ | $C_4H_9$ | $C_4H_9$ | $C_4H_9$ | H | H | H | H |
| 110 | 1 | (1024) | H | H | H | H | $C_4H_9$ | $C_4H_9$ | $C_4H_9$ | $C_4H_9$ | H | H | H | H |
| 111 | 1 | (1025) | H | H | H | H | $C_4H_9$ | $C_4H_9$ | $C_4H_9$ | $C_4H_9$ | H | H | H | H |
| 112 | 1 | (1026) | H | H | H | H | $C_4H_9$ | $C_4H_9$ | $C_4H_9$ | $C_4H_9$ | H | H | H | H |
| 113 | 1 | (1027) | H | H | H | H | $C_4H_9$ | $C_4H_9$ | $C_4H_9$ | $C_4H_9$ | H | H | H | H |
| 114 | 1 | (1028) | H | H | H | H | $C_4H_9$ | $C_4H_9$ | $C_4H_9$ | $C_4H_9$ | H | H | H | H |
| 115 | 1 | (1029) | H | H | H | H | $C_4H_9$ | $C_4H_9$ | $C_4H_9$ | $C_4H_9$ | H | H | H | H |
| 116 | 1 | (1030) | H | H | H | H | $C_4H_9$ | $C_4H_9$ | $C_4H_9$ | $C_4H_9$ | H | H | H | H |
| 117 | 1 | (1031) | H | H | H | H | $C_4H_9$ | $C_4H_9$ | $C_4H_9$ | $C_4H_9$ | H | H | H | H |
| 118 | 1 | (1032) | H | H | H | H | $C_4H_9$ | $C_4H_9$ | $C_4H_9$ | $C_4H_9$ | H | H | H | H |
| 119 | 1 | (1033) | H | H | H | H | $C_4H_9$ | $C_4H_9$ | $C_4H_9$ | $C_4H_9$ | H | H | H | H |
| 120 | 1 | (2001) |  | H | H | H | $C_4H_9$ | $C_4H_9$ | $C_4H_9$ | $C_4H_9$ | H | H | H | H |

TABLE 5

| Compound | $n_1$ | $X_1$ | $Y_1$ | $A_6$ | $A_7$ | $A_8$ | $R_6$ | $R_7$ | $R_8$ | $R_9$ | $R_{10}$ | $R_{11}$ | $R_{12}$ | $R_{13}$ |
|---|---|---|---|---|---|---|---|---|---|---|---|---|---|---|
| 121 | 1 | (2002) |  | H | H | H | $C_4H_9$ | $C_4H_9$ | $C_4H_9$ | $C_4H_9$ | H | H | H | H |
| 122 | 1 | (2003) |  | H | H | H | $C_4H_9$ | $C_4H_9$ | $C_4H_9$ | $C_4H_9$ | H | H | H | H |
| 123 | 1 | (2004) |  | H | H | H | $C_4H_9$ | $C_4H_9$ | $C_4H_9$ | $C_4H_9$ | H | H | H | H |
| 124 | 1 | (2005) |  | H | H | H | $C_4H_9$ | $C_4H_9$ | $C_4H_9$ | $C_4H_9$ | H | H | H | H |
| 125 | 1 | (2006) |  | H | H | H | $C_4H_9$ | $C_4H_9$ | $C_4H_9$ | $C_4H_9$ | H | H | H | H |
| 126 | 1 | (2007) |  | H | H | H | $C_4H_9$ | $C_4H_9$ | $C_4H_9$ | $C_4H_9$ | H | H | H | H |
| 127 | 1 | (2008) |  | H | H | H | $C_4H_9$ | $C_4H_9$ | $C_4H_9$ | $C_4H_9$ | H | H | H | H |

TABLE 5-continued

| Compound | $n_1$ | $X_1$ | $Y_1$ | $A_6$ | $A_7$ | $A_8$ | $R_6$ | $R_7$ | $R_8$ | $R_9$ | $R_{10}$ | $R_{11}$ | $R_{12}$ | $R_{13}$ |
|---|---|---|---|---|---|---|---|---|---|---|---|---|---|---|
| 128 | 1 | (2009) | H | H | H | H | $C_4H_9$ | $C_4H_9$ | $C_4H_9$ | $C_4H_9$ | H | H | H | H |
| 129 | 1 | (2010) | H | H | H | H | $C_4H_9$ | $C_4H_9$ | $C_4H_9$ | $C_4H_9$ | H | H | H | H |
| 130 | 1 | (2011) | H | H | H | H | $C_4H_9$ | $C_4H_9$ | $C_4H_9$ | $C_4H_9$ | H | H | H | H |
| 131 | 1 | (2012) | H | H | H | H | $C_4H_9$ | $C_4H_9$ | $C_4H_9$ | $C_4H_9$ | H | H | H | H |
| 132 | 1 | (2013) | H | H | H | H | $C_4H_9$ | $C_4H_9$ | $C_4H_9$ | $C_4H_9$ | H | H | H | H |
| 133 | 1 | (2014) | H | H | H | H | $C_4H_9$ | $C_4H_9$ | $C_4H_9$ | $C_4H_9$ | H | H | H | H |
| 134 | 1 | (2015) | H | H | H | H | $C_4H_9$ | $C_4H_9$ | $C_4H_9$ | $C_4H_9$ | H | H | H | H |
| 135 | 1 | (2016) | H | H | H | H | $C_4H_9$ | $C_4H_9$ | $C_4H_9$ | $C_4H_9$ | H | H | H | H |
| 136 | 2 | (2007) | H | H | H | H | $C_4H_9$ | $C_4H_9$ | $C_4H_9$ | $C_4H_9$ | H | H | H | H |
| 137 | 3 | (2007) | H | H | H | H | $C_4H_9$ | $C_4H_9$ | $C_4H_9$ | $C_4H_9$ | H | H | H | H |
| 138 | 4 | (2007) | H | H | H | H | $C_4H_9$ | $C_4H_9$ | $C_4H_9$ | $C_4H_9$ | H | H | H | H |
| 139 | 5 | (2007) | H | H | H | H | $C_4H_9$ | $C_4H_9$ | $C_4H_9$ | $C_4H_9$ | H | H | H | H |
| 140 | 1 | (2007) | H | H | H | H | Ph | Ph | Ph | Ph | H | H | H | H |
| 141 | 1 | (2007) | H | H | H | H | $CH_3$ | $CH_3$ | $CH_3$ | $CH_3$ | H | H | H | H |
| 142 | 1 | (2007) | H | H | H | H | $C_2H_5$ | $C_2H_5$ | $C_2H_5$ | $C_2H_5$ | H | H | H | H |
| 143 | 1 | (2007) | H | H | H | H | $C_8H_{17}$ | $C_8H_{17}$ | $C_8H_{17}$ | $C_8H_{17}$ | H | H | H | H |
| 144 | 1 | (2007) | CN | H | H | H | $C_4H_9$ | $C_4H_9$ | $C_4H_9$ | $C_4H_9$ | H | H | H | H |
| 145 | 1 | (2007) | $CH_3$ | H | H | H | $C_4H_9$ | $C_4H_9$ | $C_4H_9$ | $C_4H_9$ | H | H | H | H |
| 146 | 1 | (2007) | H | H | H | H | $C_4H_9$ | $C_4H_9$ | $C_4H_9$ | $C_4H_9$ | $CH_3$ | $CH_3$ | $CH_3$ | $CH_3$ |
| 147 | 1 | (2007) | $CH_3$ | $CH_3$ | $CH_3$ | $CH_3$ | $C_4H_9$ | $C_4H_9$ | $C_4H_9$ | $C_4H_9$ | $CH_3$ | $CH_3$ | $CH_3$ | $CH_3$ |
| 148 | 1 | (2007) | $CH_3$ | $CH_3$ | $CH_3$ | $CH_3$ | $CH_3$ | $CH_3$ | $CH_3$ | $CH_3$ | $CH_3$ | $CH_3$ | $CH_3$ | $CH_3$ |
| 149 | 1 | (2007) | H | H | H | H | $C_{18}H_{37}$ | $C_{18}H_{37}$ | $C_{18}H_{37}$ | $C_{18}H_{37}$ | H | H | H | H |
| 150 | 1 | (2007) | H | H | H | H | $C_2H_4Cl$ | $C_2H_4Cl$ | $C_2H_4Cl$ | $C_2H_4Cl$ | H | H | H | H |

Specific examples of the methine dye represented by Formula (1), which is the methine dye represented by the following Formula (17), will be shown in Tables 6 to 10. In each table, Ph indicates a phenyl group. In addition, the expression "(1001) to (1033)" corresponds to the above Formulas (1001) to (1033), and the expression "(2001) to (2017)" corresponds to the above Formulas (2001) to (2017). Each of the formulas indicates a ring in a case where $X_2$ and $Y_2$ form a ring that may have a substituent.

TABLE 6

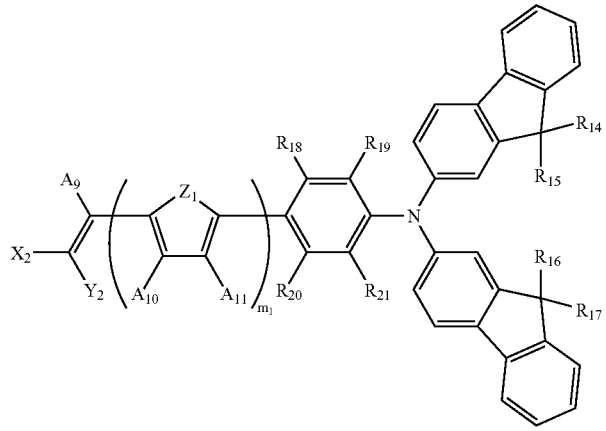

(17)

| Compound | $m_1$ | $X_2$ | $Y_2$ | $Z_1$ | $A_9$ | $A_{10}$ | $A_{11}$ | $R_{14}$ | $R_{15}$ | $R_{16}$ | $R_{17}$ | $R_{18}$ | $R_{19}$ | $R_{20}$ | $R_{21}$ |
|---|---|---|---|---|---|---|---|---|---|---|---|---|---|---|---|
| 151 | 1 | COOH | CN | O | H | H | H | $CH_3$ | $CH_3$ | $CH_3$ | $CH_3$ | H | H | H | H |
| 152 | 1 | COOH | CN | S | H | H | H | $C_4H_9$ | $C_4H_9$ | $C_4H_9$ | $C_4H_9$ | H | H | H | H |
| 153 | 1 | COOH | CN | Se | H | H | H | $C_4H_9$ | $C_4H_9$ | $C_4H_9$ | $C_4H_9$ | H | H | H | H |
| 154 | 1 | COOH | CN | NH | H | H | H | $C_4H_9$ | $C_4H_9$ | $C_4H_9$ | $C_4H_9$ | H | H | H | H |
| 155 | 1 | COOH | CN | $NCH_3$ | H | H | H | $C_4H_9$ | $C_4H_9$ | $C_4H_9$ | $C_4H_9$ | H | H | H | H |
| 156 | 1 | COOH | CN | NPh | H | H | H | $C_4H_9$ | $C_4H_9$ | $C_4H_9$ | $C_4H_9$ | H | H | H | H |
| 157 | 1 | COOLi | CN | S | H | H | H | $C_4H_9$ | $C_4H_9$ | $C_4H_9$ | $C_4H_9$ | H | H | H | H |
| 158 | 1 | COONa | CN | S | H | H | H | $C_4H_9$ | $C_4H_9$ | $C_4H_9$ | $C_4H_9$ | H | H | H | H |
| 159 | 1 | COOK | CN | S | H | H | H | $C_4H_9$ | $C_4H_9$ | $C_4H_9$ | $C_4H_9$ | H | H | H | H |
| 160 | 2 | COOH | CN | S | H | H | H | $C_4H_9$ | $C_4H_9$ | $C_4H_9$ | $C_4H_9$ | H | H | H | H |
| 161 | 3 | COOH | CN | S | H | H | H | $C_4H_9$ | $C_4H_9$ | $C_4H_9$ | $C_4H_9$ | H | H | H | H |
| 162 | 4 | COOH | CN | S | H | H | H | $C_4H_9$ | $C_4H_9$ | $C_4H_9$ | $C_4H_9$ | H | H | H | H |
| 163 | 5 | COOH | CN | S | H | H | H | $C_4H_9$ | $C_4H_9$ | $C_4H_9$ | $C_4H_9$ | H | H | H | H |

TABLE 6-continued (17)

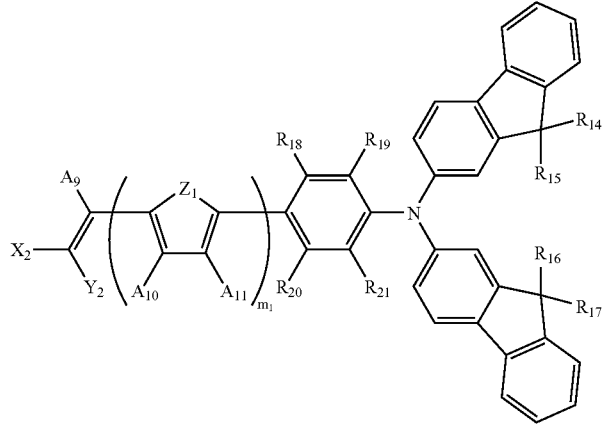

| Compound | $m_1$ | $X_2$ | $Y_2$ | $Z_1$ | $A_9$ | $A_{10}$ | $A_{11}$ | $R_{14}$ | $R_{15}$ | $R_{16}$ | $R_{17}$ | $R_{18}$ | $R_{19}$ | $R_{20}$ | $R_{21}$ |
|---|---|---|---|---|---|---|---|---|---|---|---|---|---|---|---|
| 164 | 1 | COOH | CN | S | $CH_3$ | H | H | $C_4H_9$ | $C_4H_9$ | $C_4H_9$ | $C_4H_9$ | H | H | H | H |
| 165 | 1 | COOH | CN | S | H | $CH_3$ | $CH_3$ | $C_4H_9$ | $C_4H_9$ | $C_4H_9$ | $C_4H_9$ | H | H | H | H |
| 166 | 1 | COOH | CN | S | $CH_3$ | $CH_3$ | $CH_3$ | $C_4H_9$ | $C_4H_9$ | $C_4H_9$ | $C_4H_9$ | H | H | H | H |
| 167 | 1 | COOH | CN | S | H | $C_6H_{13}$ | H | $C_4H_9$ | $C_4H_9$ | $C_4H_9$ | $C_4H_9$ | H | H | H | H |
| 168 | 1 | COOH | CN | S | H | H | $C_6H_{13}$ | $C_4H_9$ | $C_4H_9$ | $C_4H_9$ | $C_4H_9$ | H | H | H | H |
| 169 | 2 | COOH | CN | S | H | $CH_3$ | $CH_3$ | $C_4H_9$ | $C_4H_9$ | $C_4H_9$ | $C_4H_9$ | H | H | H | H |
| 170 | 2 | COOH | CN | S | $CH_3$ | $CH_3$ | $CH_3$ | $C_4H_9$ | $C_4H_9$ | $C_4H_9$ | $C_4H_9$ | H | H | H | H |
| 171 | 2 | COOH | CN | S | H | H | H | $CH_3$ | $CH_3$ | $CH_3$ | $CH_3$ | $CH_3$ | H | H | H |
| 172 | 2 | CN | COOH | S | H | H | H | $C_8H_{17}$ | $C_8H_{17}$ | $C_8H_{17}$ | $C_8H_{17}$ | H | H | H | H |
| 173 | 2 | COOH | CN | S | H | H | H | $C_4H_9$ | $C_4H_9$ | $C_4H_9$ | $C_4H_9$ | H | H | H | H |
| 174 | 2 | COOH | CN | S | H | H | H | $C_4H_9$ | $C_4H_9$ | $CH_3$ | $CH_3$ | H | H | H | H |
| 175 | 2 | COOH | CN | S | H | H | H | $C_4H_9$ | $C_4H_9$ | H | H | H | H | H | H |
| 176 | 2 | COOH | CN | S | H | H | H | $COCH_3$ | $COCH_3$ | $COCH_3$ | $COCH_3$ | H | H | H | H |
| 177 | 2 | COOH | CN | S | H | H | H | Ph | Ph | Ph | Ph | H | H | H | H |
| 178 | 2 | COOH | CN | S | Cl | H | H | $C_4H_9$ | $C_4H_9$ | $C_4H_9$ | $C_4H_9$ | H | H | H | H |
| 179 | 2 | COOH | CN | S | H | Cl | Cl | $C_4H_9$ | $C_4H_9$ | $C_4H_9$ | $C_4H_9$ | H | H | H | H |
| 180 | 2 | COOH | CN | S | H | H | H | $C_4H_9$ | $C_4H_9$ | $C_4H_9$ | $C_4H_9$ | OH | H | H | H |

TABLE 7

| Compound | $m_1$ | $X_2$ | $Y_2$ | $Z_1$ | $A_9$ | $A_{10}$ | $A_{11}$ | $R_{14}$ | $R_{15}$ | $R_{16}$ | $R_{17}$ | $R_{18}$ | $R_{19}$ | $R_{20}$ | $R_{21}$ |
|---|---|---|---|---|---|---|---|---|---|---|---|---|---|---|---|---|
| 181 | 1 | (1001) | H | S | H | H | H | $C_4H_9$ | $C_4H_9$ | $C_4H_9$ | $C_4H_9$ | H | H | H | H |
| 182 | 1 | (1002) | H | S | H | H | H | $C_4H_9$ | $C_4H_9$ | $C_4H_9$ | $C_4H_9$ | H | H | H | H |
| 183 | 1 | (1003) | H | S | H | H | H | $C_4H_9$ | $C_4H_9$ | $C_4H_9$ | $C_4H_9$ | H | H | H | H |
| 184 | 1 | (1004) | H | S | H | H | H | $C_4H_9$ | $C_4H_9$ | $C_4H_9$ | $C_4H_9$ | H | H | H | H |
| 185 | 1 | (1005) | H | S | H | H | H | $C_4H_9$ | $C_4H_9$ | $C_4H_9$ | $C_4H_9$ | H | H | H | H |
| 186 | 1 | (1006) | H | S | H | H | H | $C_4H_9$ | $C_4H_9$ | $C_4H_9$ | $C_4H_9$ | H | H | H | H |
| 187 | 1 | (1007) | H | S | H | H | H | $C_4H_9$ | $C_4H_9$ | $C_4H_9$ | $C_4H_9$ | H | H | H | H |
| 188 | 1 | (1008) | H | S | H | H | H | $C_4H_9$ | $C_4H_9$ | $C_4H_9$ | $C_4H_9$ | H | H | H | H |
| 189 | 1 | (1009) | H | S | H | H | H | $C_4H_9$ | $C_4H_9$ | $C_4H_9$ | $C_4H_9$ | H | H | H | H |
| 190 | 1 | (1010) | H | S | H | H | H | $C_4H_9$ | $C_4H_9$ | $C_4H_9$ | $C_4H_9$ | H | H | H | H |
| 191 | 1 | (1011) | H | S | H | H | H | $C_4H_9$ | $C_4H_9$ | $C_4H_9$ | $C_4H_9$ | H | H | H | H |
| 192 | 1 | (1012) | H | S | H | H | H | $C_4H_9$ | $C_4H_9$ | $C_4H_9$ | $C_4H_9$ | H | H | H | H |
| 193 | 1 | (1013) | H | S | H | H | H | $C_4H_9$ | $C_4H_9$ | $C_4H_9$ | $C_4H_9$ | H | H | H | H |
| 194 | 1 | (1014) | H | S | H | H | H | $C_4H_9$ | $C_4H_9$ | $C_4H_9$ | $C_4H_9$ | H | H | H | H |
| 195 | 1 | (1015) | H | S | H | H | H | $C_4H_9$ | $C_4H_9$ | $C_4H_9$ | $C_4H_9$ | H | H | H | H |
| 196 | 1 | (1016) | H | S | H | H | H | $C_4H_9$ | $C_4H_9$ | $C_4H_9$ | $C_4H_9$ | H | H | H | H |
| 197 | 1 | (1017) | H | S | H | H | H | $C_4H_9$ | $C_4H_9$ | $C_4H_9$ | $C_4H_9$ | H | H | H | H |
| 198 | 1 | (1018) | H | S | H | H | H | $C_4H_9$ | $C_4H_9$ | $C_4H_9$ | $C_4H_9$ | H | H | H | H |
| 199 | 1 | (1019) | H | S | H | H | H | $C_4H_9$ | $C_4H_9$ | $C_4H_9$ | $C_4H_9$ | H | H | H | H |
| 200 | 1 | (1020) | H | S | H | H | H | $C_4H_9$ | $C_4H_9$ | $C_4H_9$ | $C_4H_9$ | H | H | H | H |
| 201 | 1 | (1021) | H | S | H | H | H | $C_4H_9$ | $C_4H_9$ | $C_4H_9$ | $C_4H_9$ | H | H | H | H |
| 202 | 1 | (1022) | H | S | H | H | H | $C_4H_9$ | $C_4H_9$ | $C_4H_9$ | $C_4H_9$ | H | H | H | H |
| 203 | 1 | (1023) | H | S | H | H | H | $C_4H_9$ | $C_4H_9$ | $C_4H_9$ | $C_4H_9$ | H | H | H | H |
| 204 | 1 | (1024) | H | S | H | H | H | $C_4H_9$ | $C_4H_9$ | $C_4H_9$ | $C_4H_9$ | H | H | H | H |
| 205 | 1 | (1025) | H | S | H | H | H | $C_4H_9$ | $C_4H_9$ | $C_4H_9$ | $C_4H_9$ | H | H | H | H |
| 206 | 1 | (1026) | H | S | H | H | H | $C_4H_9$ | $C_4H_9$ | $C_4H_9$ | $C_4H_9$ | H | H | H | H |
| 207 | 1 | (1027) | H | S | H | H | H | $C_4H_9$ | $C_4H_9$ | $C_4H_9$ | $C_4H_9$ | H | H | H | H |
| 208 | 1 | (1028) | H | S | H | H | H | $C_4H_9$ | $C_4H_9$ | $C_4H_9$ | $C_4H_9$ | H | H | H | H |

TABLE 7-continued

| Compound | m₁ | X₂ | Y₂ | Z₁ | A₉ | A₁₀ | A₁₁ | R₁₄ | R₁₅ | R₁₆ | R₁₇ | R₁₈ | R₁₉ | R₂₀ | R₂₁ |
|---|---|---|---|---|---|---|---|---|---|---|---|---|---|---|---|
| 209 | 1 | (1029) | H | S | H | H | H | C₄H₉ | C₄H₉ | C₄H₉ | C₄H₉ | H | H | H | H |
| 210 | 1 | (1030) | H | S | H | H | H | C₄H₉ | C₄H₉ | C₄H₉ | C₄H₉ | H | H | H | H |

TABLE 8

| Compound | m₁ | X₂ | Y₂ | Z₁ | A₉ | A₁₀ | A₁₁ | R₁₄ | R₁₅ | R₁₆ | R₁₇ | R₁₈ | R₁₉ | R₂₀ | R₂₁ |
|---|---|---|---|---|---|---|---|---|---|---|---|---|---|---|---|
| 211 | 1 | (1031) | H | S | H | H | H | C₄H₉ | C₄H₉ | C₄H₉ | C₄H₉ | H | H | H | H |
| 212 | 1 | (1032) | H | S | H | H | H | C₄H₉ | C₄H₉ | C₄H₉ | C₄H₉ | H | H | H | H |
| 213 | 1 | (2001) |  | S | H | H | H | C₄H₉ | C₄H₉ | C₄H₉ | C₄H₉ | H | H | H | H |
| 214 | 1 | (2002) |  | S | H | H | H | C₄H₉ | C₄H₉ | C₄H₉ | C₄H₉ | H | H | H | H |
| 215 | 1 | (2003) |  | S | H | H | H | C₄H₉ | C₄H₉ | C₄H₉ | C₄H₉ | H | H | H | H |
| 216 | 1 | (2004) |  | S | H | H | H | C₄H₉ | C₄H₉ | C₄H₉ | C₄H₉ | H | H | H | H |
| 217 | 1 | (2005) |  | S | H | H | H | C₄H₉ | C₄H₉ | C₄H₉ | C₄H₉ | H | H | H | H |
| 218 | 1 | (2006) |  | S | H | H | H | C₄H₉ | C₄H₉ | C₄H₉ | C₄H₉ | H | H | H | H |
| 219 | 1 | (2007) |  | S | H | H | H | C₄H₉ | C₄H₉ | C₄H₉ | C₄H₉ | H | H | H | H |
| 220 | 1 | (2008) |  | S | H | H | H | C₄H₉ | C₄H₉ | C₄H₉ | C₄H₉ | H | H | H | H |
| 221 | 1 | (2009) |  | S | H | H | H | C₄H₉ | C₄H₉ | C₄H₉ | C₄H₉ | H | H | H | H |
| 222 | 1 | (2010) |  | S | H | H | H | C₄H₉ | C₄H₉ | C₄H₉ | C₄H₉ | H | H | H | H |
| 223 | 1 | (2011) |  | S | H | H | H | C₄H₉ | C₄H₉ | C₄H₉ | C₄H₉ | H | H | H | H |
| 224 | 1 | (2012) |  | S | H | H | H | C₄H₉ | C₄H₉ | C₄H₉ | C₄H₉ | H | H | H | H |
| 225 | 1 | (2013) |  | S | H | H | H | C₄H₉ | C₄H₉ | C₄H₉ | C₄H₉ | H | H | H | H |
| 226 | 1 | (2014) |  | S | H | H | H | C₄H₉ | C₄H₉ | C₄H₉ | C₄H₉ | H | H | H | H |
| 227 | 1 | (2015) |  | S | H | H | H | C₄H₉ | C₄H₉ | C₄H₉ | C₄H₉ | H | H | H | H |
| 228 | 1 | (2016) |  | S | H | H | H | C₄H₉ | C₄H₉ | C₄H₉ | C₄H₉ | H | H | H | H |
| 229 | 1 | (2017) |  | S | H | H | H | C₄H₉ | C₄H₉ | C₄H₉ | C₄H₉ | H | H | H | H |
| 230 | 2 | (1001) | H | S | H | H | H | C₄H₉ | C₄H₉ | C₄H₉ | C₄H₉ | H | H | H | H |
| 231 | 2 | (1002) | H | S | H | H | H | C₄H₉ | C₄H₉ | C₄H₉ | C₄H₉ | H | H | H | H |
| 232 | 2 | (1003) | H | S | H | H | H | C₄H₉ | C₄H₉ | C₄H₉ | C₄H₉ | H | H | H | H |
| 233 | 2 | (1004) | H | S | H | H | H | C₄H₉ | C₄H₉ | C₄H₉ | C₄H₉ | H | H | H | H |
| 234 | 2 | (1005) | H | S | H | H | H | C₄H₉ | C₄H₉ | C₄H₉ | C₄H₉ | H | H | H | H |
| 235 | 2 | (1006) | H | S | H | H | H | C₄H₉ | C₄H₉ | C₄H₉ | C₄H₉ | H | H | H | H |
| 236 | 2 | (1007) | H | S | H | H | H | C₄H₉ | C₄H₉ | C₄H₉ | C₄H₉ | H | H | H | H |
| 237 | 2 | (1008) | H | S | H | H | H | C₄H₉ | C₄H₉ | C₄H₉ | C₄H₉ | H | H | H | H |
| 238 | 2 | (1009) | H | S | H | H | H | C₄H₉ | C₄H₉ | C₄H₉ | C₄H₉ | H | H | H | H |
| 239 | 2 | (1010) | H | S | H | H | H | C₄H₉ | C₄H₉ | C₄H₉ | C₄H₉ | H | H | H | H |
| 240 | 2 | (1011) | H | S | H | H | H | C₄H₉ | C₄H₉ | C₄H₉ | C₄H₉ | H | H | H | H |

TABLE 9

| Compound | m₁ | X₂ | Y₂ | Z₁ | A₉ | A₁₀ | A₁₁ | R₁₄ | R₁₅ | R₁₆ | R₁₇ | R₁₈ | R₁₉ | R₂₀ | R₂₁ |
|---|---|---|---|---|---|---|---|---|---|---|---|---|---|---|---|
| 241 | 2 | (1012) | H | S | H | H | H | C₄H₉ | C₄H₉ | C₄H₉ | C₄H₉ | H | H | H | H |
| 242 | 2 | (1013) | H | S | H | H | H | C₄H₉ | C₄H₉ | C₄H₉ | C₄H₉ | H | H | H | H |
| 243 | 2 | (1014) | H | S | H | H | H | C₄H₉ | C₄H₉ | C₄H₉ | C₄H₉ | H | H | H | H |
| 244 | 2 | (1015) | H | S | H | H | H | C₄H₉ | C₄H₉ | C₄H₉ | C₄H₉ | H | H | H | H |
| 245 | 2 | (1016) | H | S | H | H | H | C₄H₉ | C₄H₉ | C₄H₉ | C₄H₉ | H | H | H | H |
| 246 | 2 | (1017) | H | S | H | H | H | C₄H₉ | C₄H₉ | C₄H₉ | C₄H₉ | H | H | H | H |
| 247 | 2 | (1018) | H | S | H | H | H | C₄H₉ | C₄H₉ | C₄H₉ | C₄H₉ | H | H | H | H |
| 248 | 2 | (1019) | H | S | H | H | H | C₄H₉ | C₄H₉ | C₄H₉ | C₄H₉ | H | H | H | H |
| 249 | 2 | (1020) | H | S | H | H | H | C₄H₉ | C₄H₉ | C₄H₉ | C₄H₉ | H | H | H | H |
| 250 | 2 | (1021) | H | S | H | H | H | C₄H₉ | C₄H₉ | C₄H₉ | C₄H₉ | H | H | H | H |
| 251 | 2 | (1022) | H | S | H | H | H | C₄H₉ | C₄H₉ | C₄H₉ | C₄H₉ | H | H | H | H |
| 252 | 2 | (1023) | H | S | H | H | H | C₄H₉ | C₄H₉ | C₄H₉ | C₄H₉ | H | H | H | H |
| 253 | 2 | (1024) | H | S | H | H | H | C₄H₉ | C₄H₉ | C₄H₉ | C₄H₉ | H | H | H | H |
| 254 | 2 | (1025) | H | S | H | H | H | C₄H₉ | C₄H₉ | C₄H₉ | C₄H₉ | H | H | H | H |
| 255 | 2 | (1026) | H | S | H | H | H | C₄H₉ | C₄H₉ | C₄H₉ | C₄H₉ | H | H | H | H |
| 256 | 2 | (1027) | H | S | H | H | H | C₄H₉ | C₄H₉ | C₄H₉ | C₄H₉ | H | H | H | H |
| 257 | 2 | (1028) | H | S | H | H | H | C₄H₉ | C₄H₉ | C₄H₉ | C₄H₉ | H | H | H | H |
| 258 | 2 | (1029) | H | S | H | H | H | C₄H₉ | C₄H₉ | C₄H₉ | C₄H₉ | H | H | H | H |
| 259 | 2 | (1030) | H | S | H | H | H | C₄H₉ | C₄H₉ | C₄H₉ | C₄H₉ | H | H | H | H |
| 260 | 2 | (1031) | H | S | H | H | H | C₄H₉ | C₄H₉ | C₄H₉ | C₄H₉ | H | H | H | H |
| 261 | 2 | (1032) | H | S | H | H | H | C₄H₉ | C₄H₉ | C₄H₉ | C₄H₉ | H | H | H | H |
| 262 | 2 | (1033) | H | S | H | H | H | C₄H₉ | C₄H₉ | C₄H₉ | C₄H₉ | H | H | H | H |
| 263 | 2 | (2001) |  | S | H | H | H | C₄H₉ | C₄H₉ | C₄H₉ | C₄H₉ | H | H | H | H |
| 264 | 2 | (2002) |  | S | H | H | H | C₄H₉ | C₄H₉ | C₄H₉ | C₄H₉ | H | H | H | H |
| 265 | 2 | (2003) |  | S | H | H | H | C₄H₉ | C₄H₉ | C₄H₉ | C₄H₉ | H | H | H | H |
| 266 | 2 | (2004) |  | S | H | H | H | C₄H₉ | C₄H₉ | C₄H₉ | C₄H₉ | H | H | H | H |
| 267 | 2 | (2005) |  | S | H | H | H | C₄H₉ | C₄H₉ | C₄H₉ | C₄H₉ | H | H | H | H |

TABLE 9-continued

| Compound | $m_1$ | $X_2$ | $Y_2$ | $Z_1$ | $A_9$ | $A_{10}$ | $A_{11}$ | $R_{14}$ | $R_{15}$ | $R_{16}$ | $R_{17}$ | $R_{18}$ | $R_{19}$ | $R_{20}$ | $R_{21}$ |
|---|---|---|---|---|---|---|---|---|---|---|---|---|---|---|---|
| 268 | 2 | (2006) | S | H | H | H | | $C_4H_9$ | $C_4H_9$ | $C_4H_9$ | $C_4H_9$ | H | H | H | H |
| 269 | 2 | (2007) | S | H | H | H | | $C_4H_9$ | $C_4H_9$ | $C_4H_9$ | $C_4H_9$ | H | H | H | H |
| 270 | 2 | (2008) | S | H | H | H | | $C_4H_9$ | $C_4H_9$ | $C_4H_9$ | $C_4H_9$ | H | H | H | H |

TABLE 10

| Compound | $m_1$ | $X_2$ | $Y_2$ | $Z_1$ | $A_9$ | $A_{10}$ | $A_{11}$ | $R_{14}$ | $R_{15}$ | $R_{16}$ | $R_{17}$ | $R_{18}$ | $R_{19}$ | $R_{20}$ | $R_{21}$ |
|---|---|---|---|---|---|---|---|---|---|---|---|---|---|---|---|---|
| 271 | 2 | (2009) | S | H | H | H | $C_4H_9$ | $C_4H_9$ | $C_4H_9$ | $C_4H_9$ | H | H | H | H | | |
| 272 | 2 | (2010) | S | H | H | H | $C_4H_9$ | $C_4H_9$ | $C_4H_9$ | $C_4H_9$ | H | H | H | H | | |
| 273 | 2 | (2011) | S | H | H | H | $C_4H_9$ | $C_4H_9$ | $C_4H_9$ | $C_4H_9$ | H | H | H | H | | |
| 274 | 2 | (2012) | S | H | H | H | $C_4H_9$ | $C_4H_9$ | $C_4H_9$ | $C_4H_9$ | H | H | H | H | | |
| 275 | 2 | (2013) | S | H | H | H | $C_4H_9$ | $C_4H_9$ | $C_4H_9$ | $C_4H_9$ | H | H | H | H | | |
| 276 | 2 | (2014) | S | H | H | H | $C_4H_9$ | $C_4H_9$ | $C_4H_9$ | $C_4H_9$ | H | H | H | H | | |
| 277 | 2 | (2015) | S | H | H | H | $C_4H_9$ | $C_4H_9$ | $C_4H_9$ | $C_4H_9$ | H | H | H | H | | |
| 278 | 2 | (2016) | S | H | H | H | $C_4H_9$ | $C_4H_9$ | $C_4H_9$ | $C_4H_9$ | H | H | H | H | | |
| 279 | 2 | (2017) | S | H | H | H | $C_4H_9$ | $C_4H_9$ | $C_4H_9$ | $C_4H_9$ | H | H | H | H | | |
| 280 | 2 | (2007) | S | H | H | H | $C_4H_9$ | $C_4H_9$ | $C_4H_9$ | $C_4H_9$ | H | H | H | H | | |
| 281 | 3 | (2007) | S | H | H | H | $C_4H_9$ | $C_4H_9$ | $C_4H_9$ | $C_4H_9$ | H | H | H | H | | |
| 282 | 4 | (2007) | S | H | H | H | $C_4H_9$ | $C_4H_9$ | $C_4H_9$ | $C_4H_9$ | H | H | H | H | | |
| 283 | 5 | (2007) | S | H | H | H | $C_4H_9$ | $C_4H_9$ | $C_4H_9$ | $C_4H_9$ | H | H | H | H | | |
| 284 | 2 | (2007) | S | H | H | H | $CH_3$ | $CH_3$ | $CH_3$ | $CH_3$ | H | H | H | H | | |
| 285 | 2 | (2007) | S | $CH_3$ | H | H | $C_4H_9$ | $C_4H_9$ | $C_4H_9$ | $C_4H_9$ | H | H | H | H | | |
| 286 | 2 | (2007) | S | H | H | H | $C_4H_9$ | $C_4H_9$ | $C_4H_9$ | $C_4H_9$ | OH | H | H | H | | |
| 287 | 2 | (2007) | S | H | H | H | $C_4H_9$ | $C_4H_9$ | $C_4H_9$ | $C_4H_9$ | $CH_3$ | H | H | H | | |
| 288 | 2 | (2007) | S | H | H | H | $C_4H_9$ | $C_4H_9$ | $C_4H_9$ | $C_4H_9$ | $CH_3$ | $CH_3$ | $CH_3$ | $CH_3$ | | |
| 289 | 2 | (2007) | S | H | H | H | $C_4H_9$ | $C_4H_9$ | $C_4H_9$ | $C_4H_9$ | Cl | Cl | Cl | Cl | | |
| 290 | 2 | (2007) | S | H | H | H | $C_4H_9$ | $C_4H_9$ | $C_4H_9$ | $C_4H_9$ | Br | Br | Br | Br | | |
| 291 | 2 | (2007) | S | H | $CH_3$ | $CH_3$ | $C_4H_9$ | $C_4H_9$ | $C_4H_9$ | $C_4H_9$ | H | H | H | H | | |
| 292 | 2 | (2007) | S | H | $CH_3$ | H | $C_4H_9$ | $C_4H_9$ | $C_4H_9$ | $C_4H_9$ | H | H | H | H | | |
| 293 | 2 | (2007) | S | $CH_3$ | $CH_3$ | $CH_3$ | $C_4H_9$ | $C_4H_9$ | $C_4H_9$ | $C_4H_9$ | H | H | H | H | | |
| 294 | 2 | (2007) | S | Cl | H | H | $C_4H_9$ | $C_4H_9$ | $C_4H_9$ | $C_4H_9$ | H | H | H | H | | |
| 295 | 2 | (2007) | S | Cl | Cl | Cl | $C_4H_9$ | $C_4H_9$ | $C_4H_9$ | $C_4H_9$ | H | H | H | H | | |
| 296 | 2 | (2007) | S | H | H | $CH_3$ | $C_4H_9$ | $C_4H_9$ | $C_4H_9$ | $C_4H_9$ | H | H | H | H | | |
| 297 | 2 | (2007) | S | H | H | H | $C_8H_{17}$ | $C_8H_{17}$ | $C_8H_{17}$ | $C_8H_{17}$ | H | H | H | H | | |
| 298 | 2 | (2007) | S | H | H | H | $C_{18}H_{37}$ | $C_{18}H_{37}$ | $C_{18}H_{37}$ | $C_{18}H_{37}$ | H | H | H | H | | |
| 299 | 2 | (2007) | S | H | H | H | Ph | Ph | Ph | Ph | H | H | H | H | | |
| 300 | 2 | (2007) | S | H | H | H | $C_4H_9$ | $C_4H_9$ | $C_4H_9$ | $C_4H_9$ | $C_4H_9$ | H | H | H | | |

Other specific examples of the methine dye represented by Formula (1) will be given below.

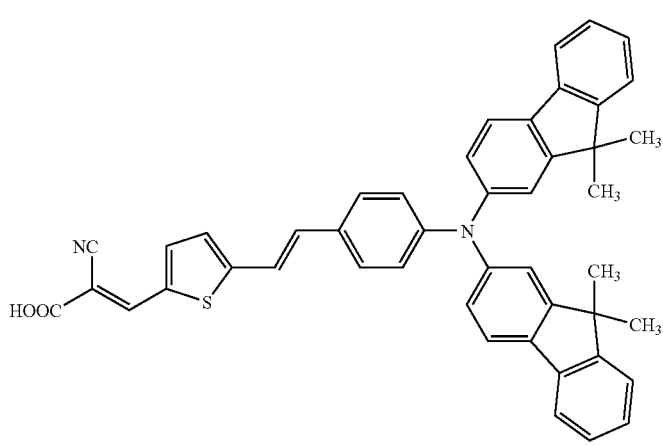

(301)

(302)
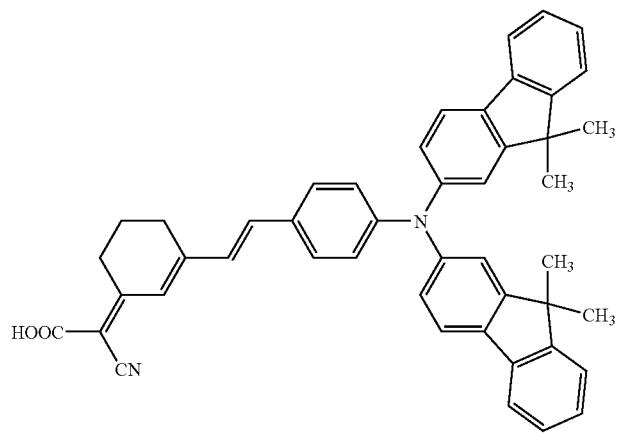
(303)
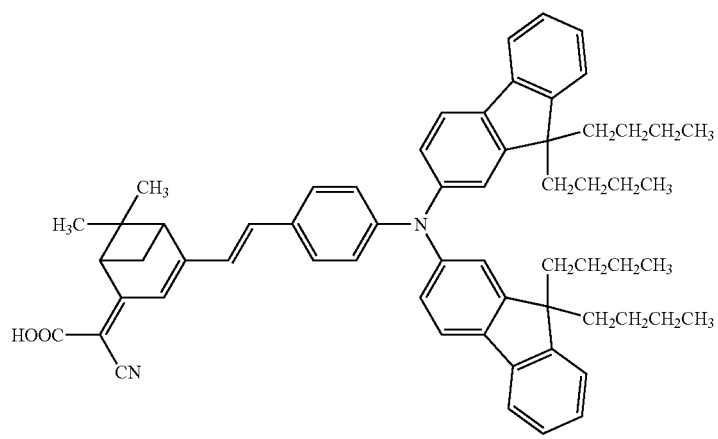
(304)
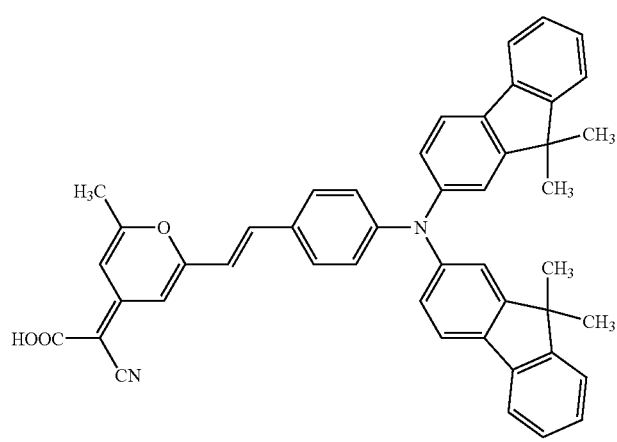

-continued
(305)
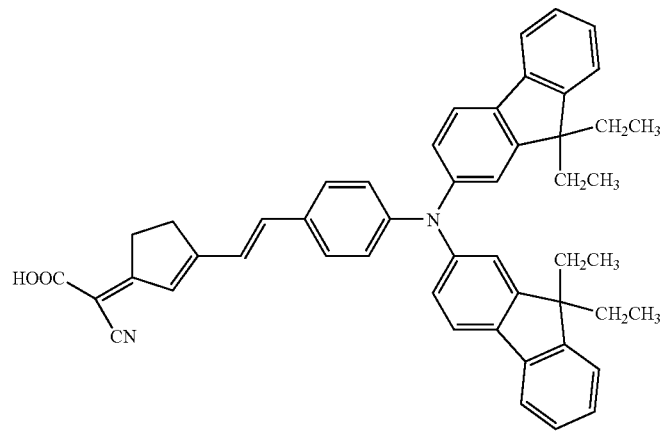
(306)
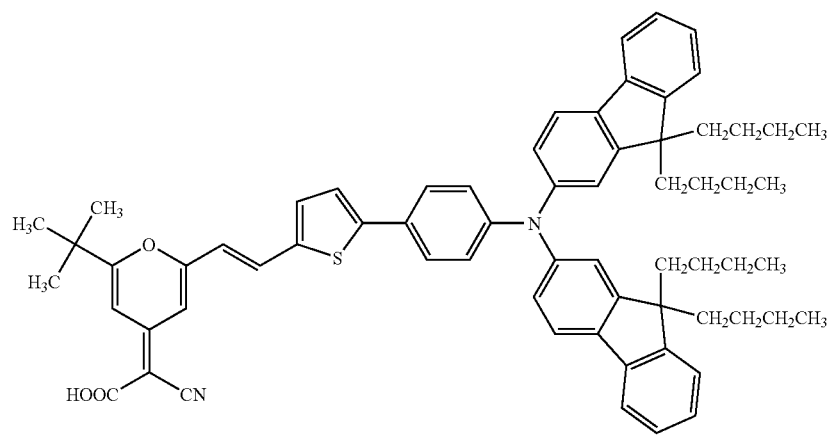
(307)
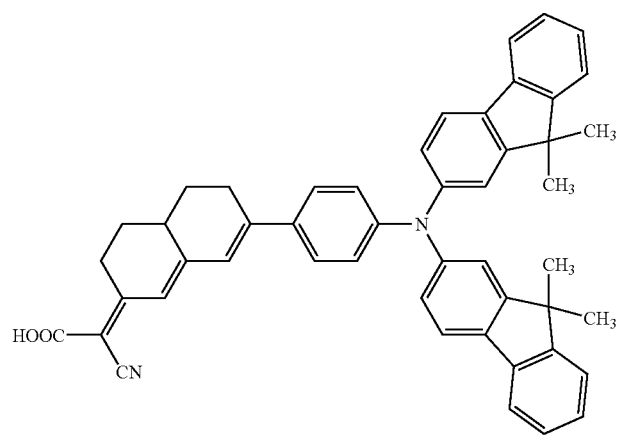

(308)
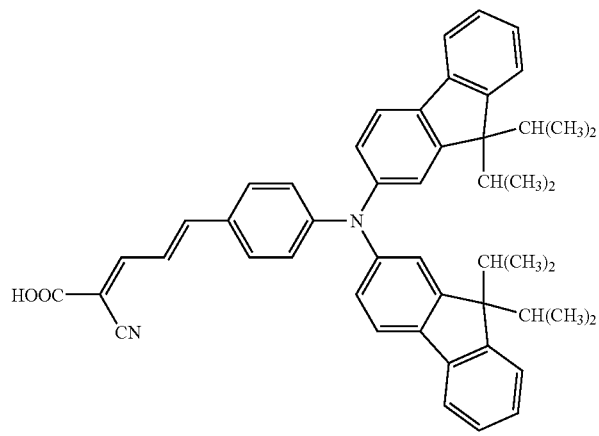
(309)
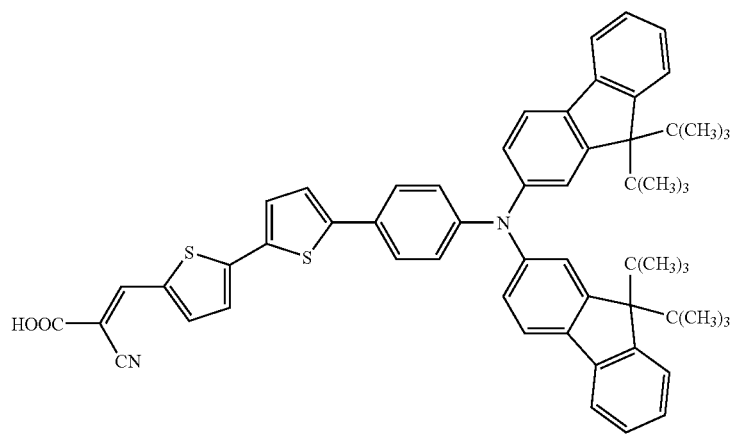
(310)
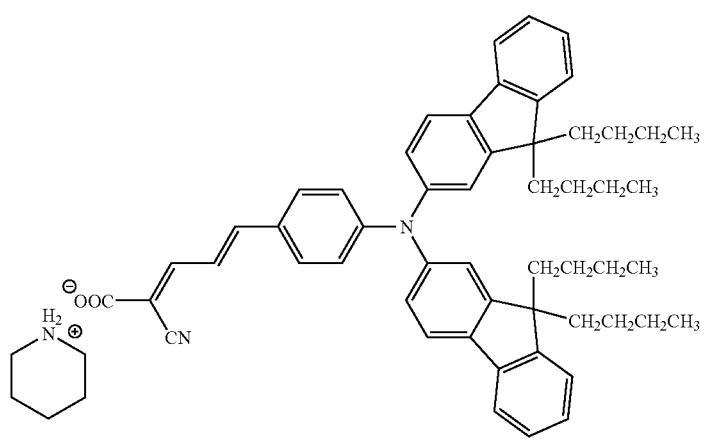

-continued
(311)
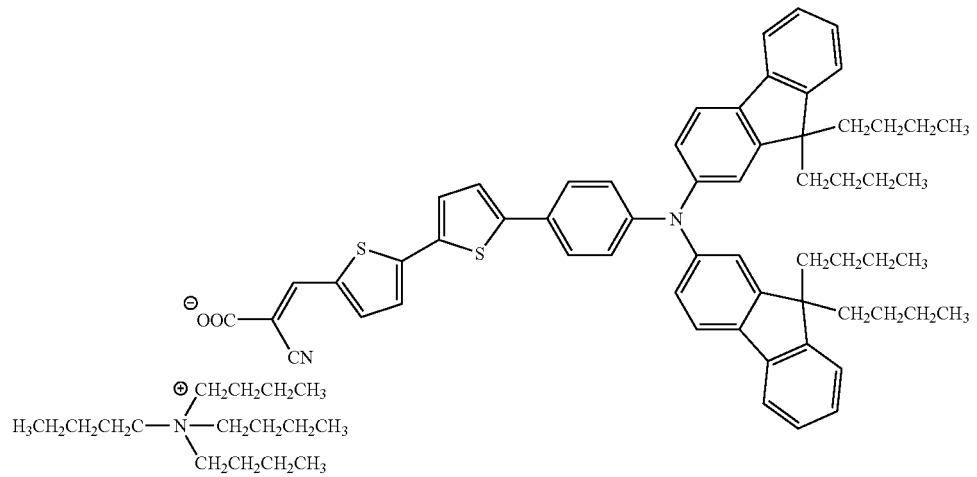
(312)
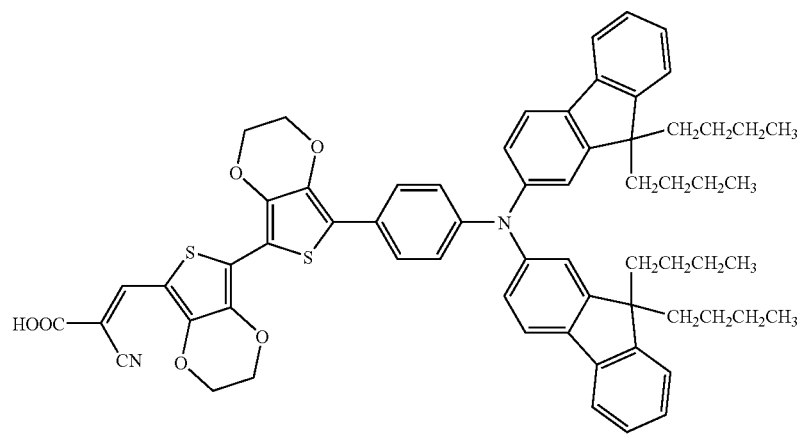
(313)
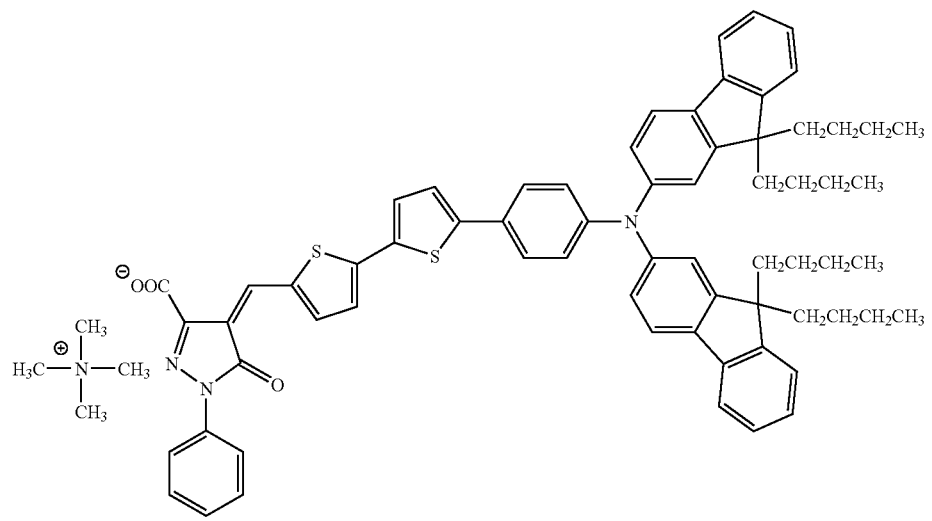

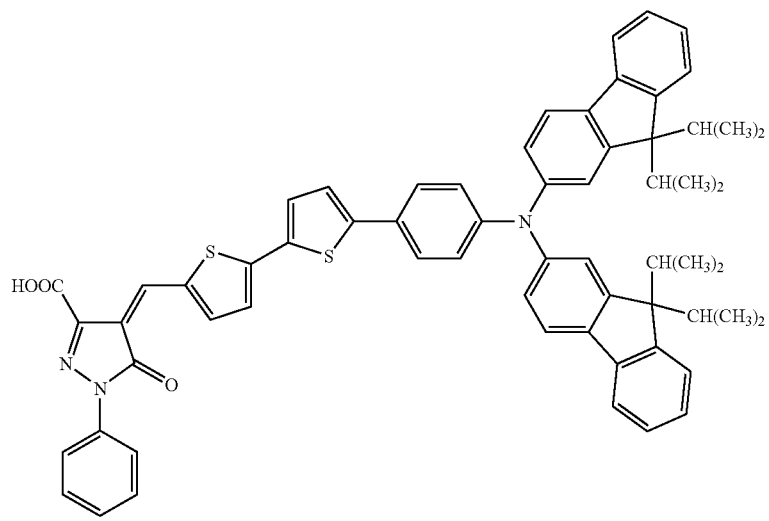
(314)
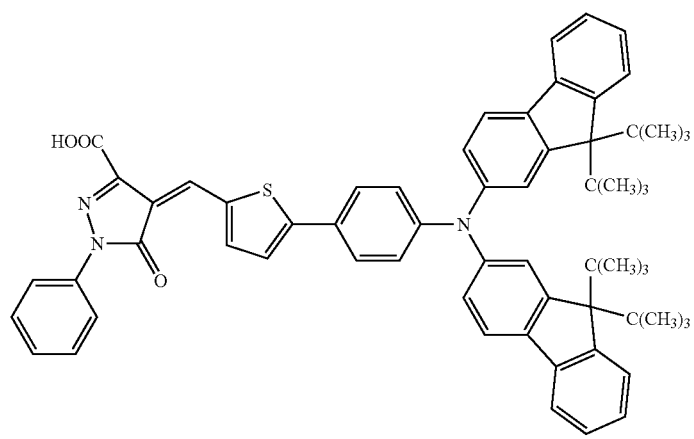
(315)
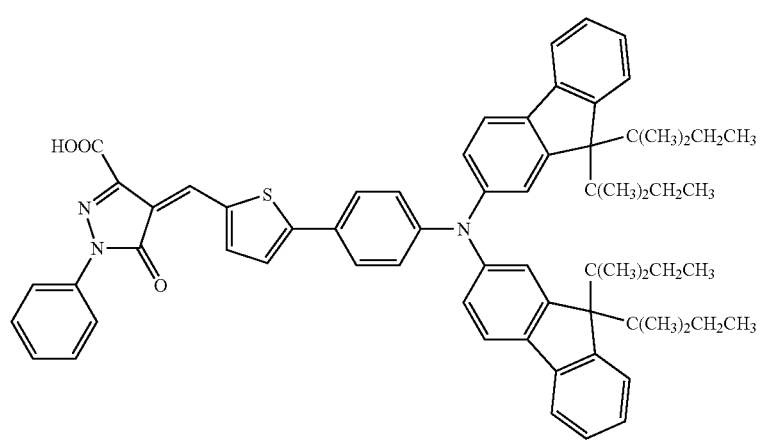
(316)

(317)
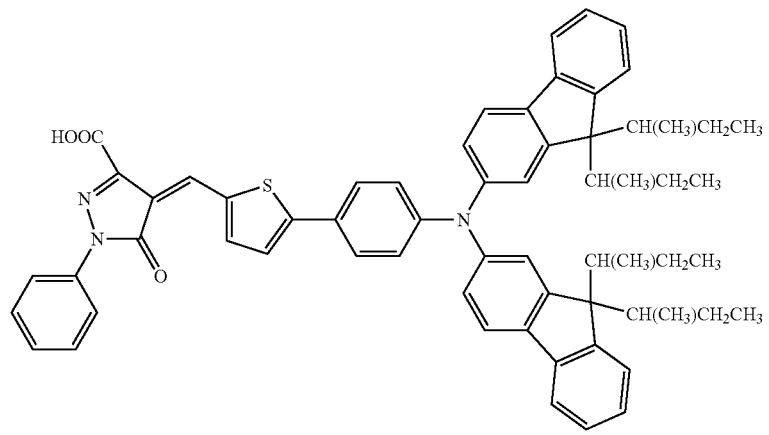
(318)
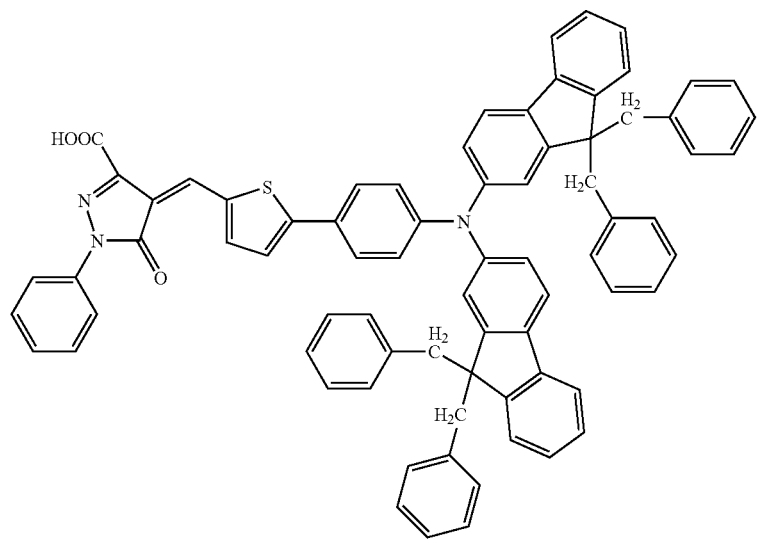
(319) (320)
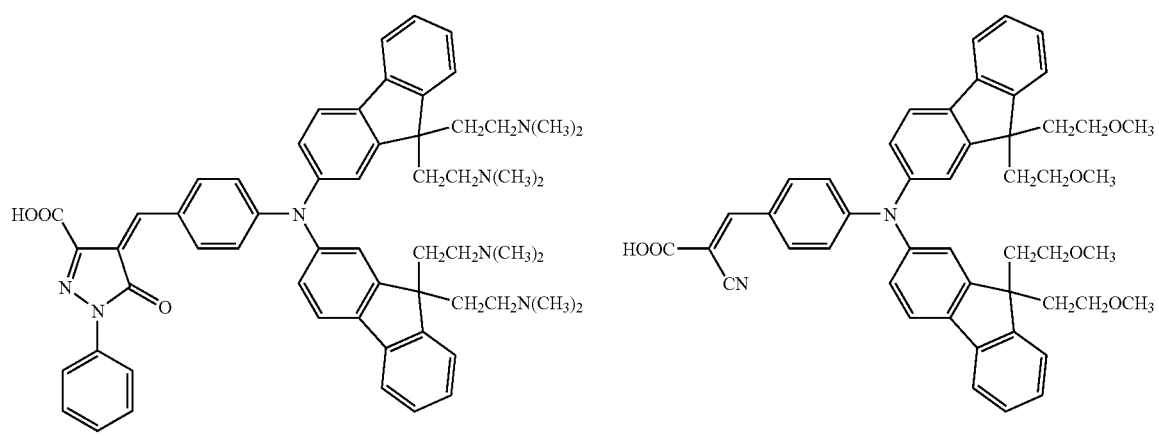

(321)
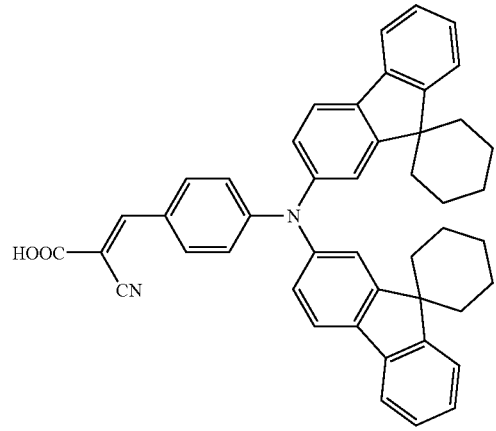
(322)
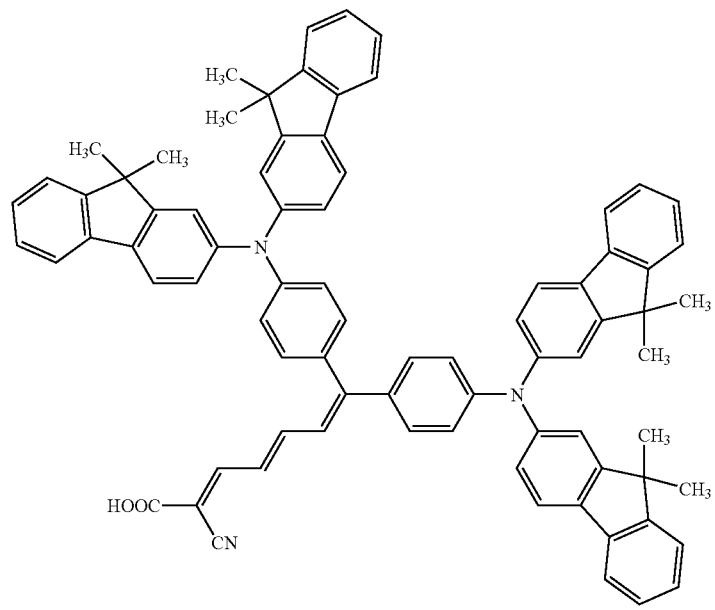
(323)
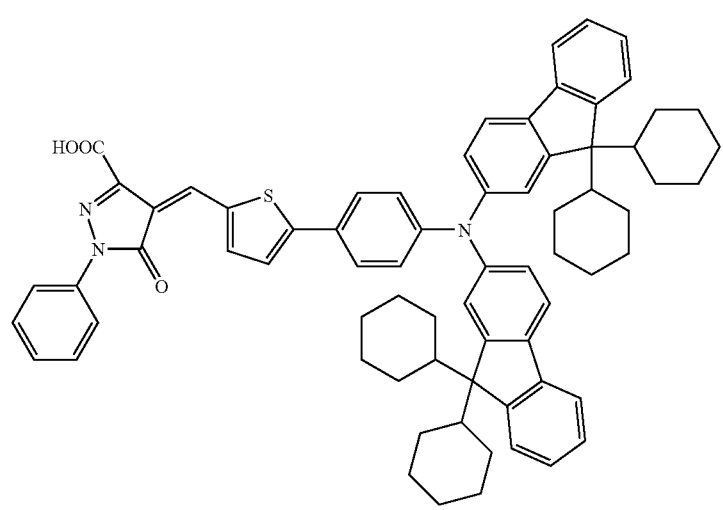

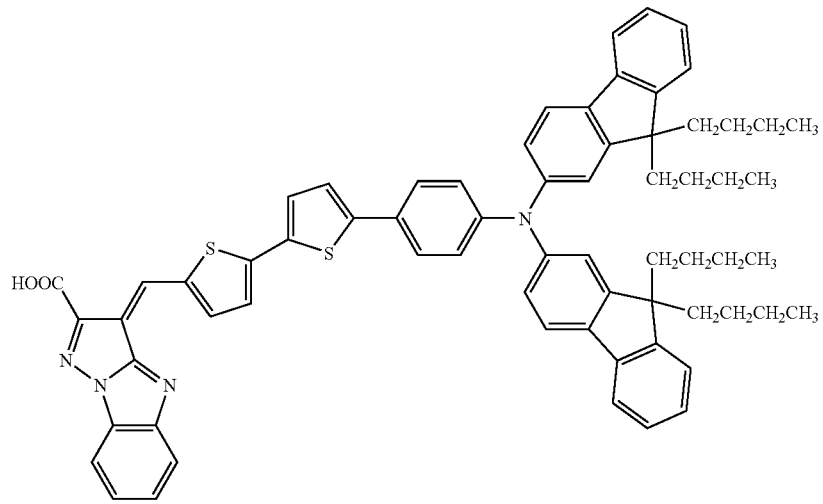
(324)
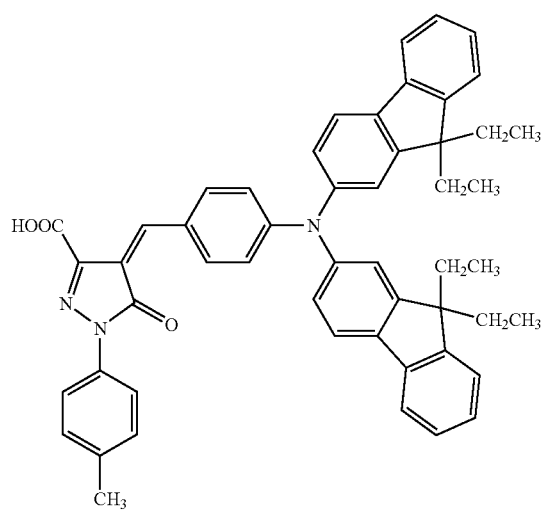
(325)
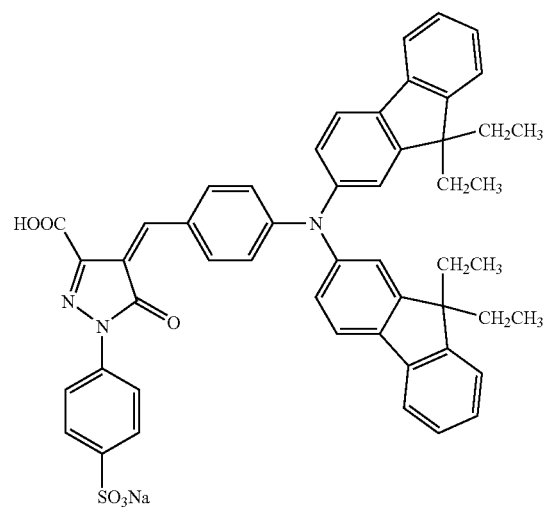
(326)
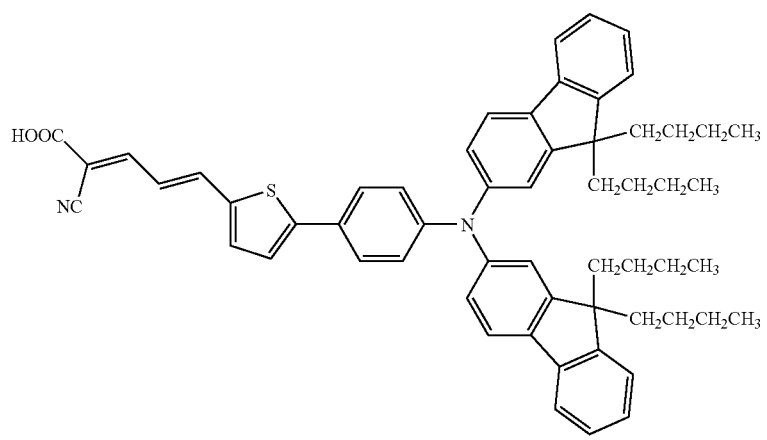
(327)

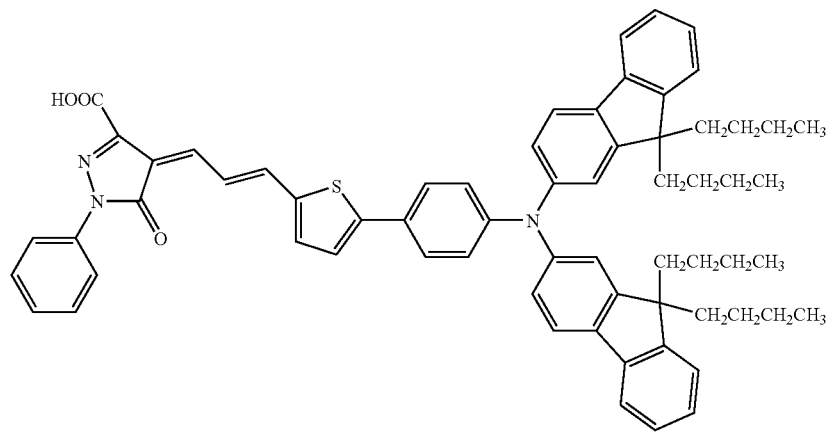
(328)
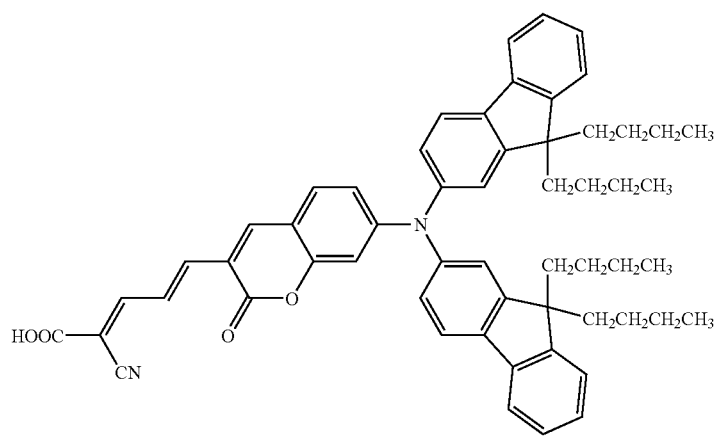
(329)
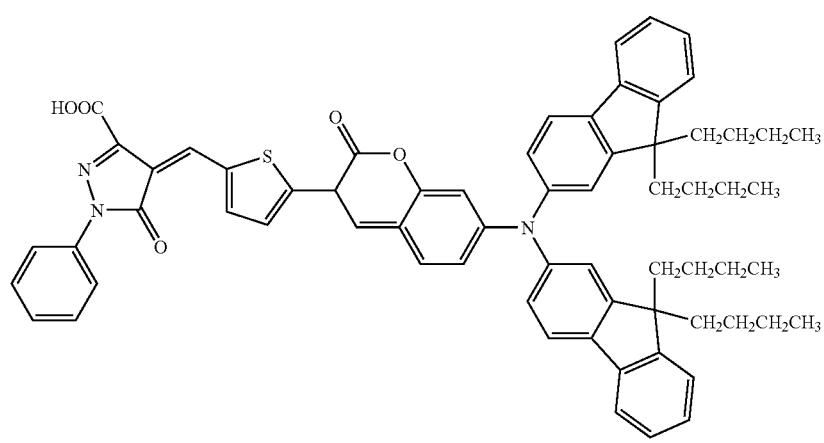
(330)

(331)
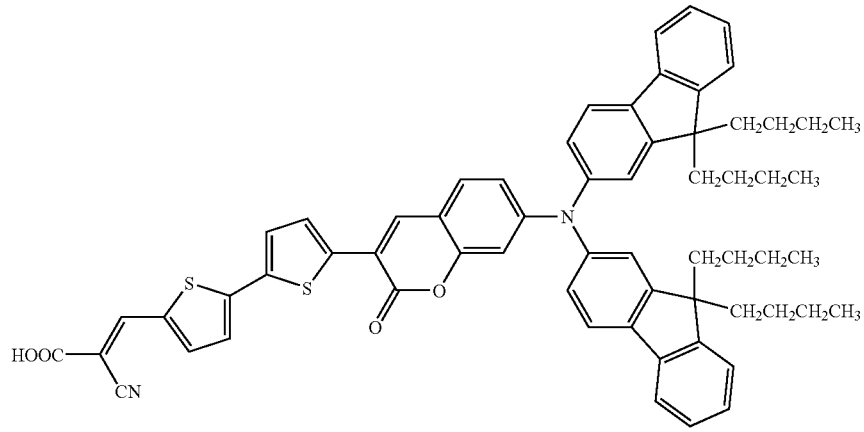
(332)
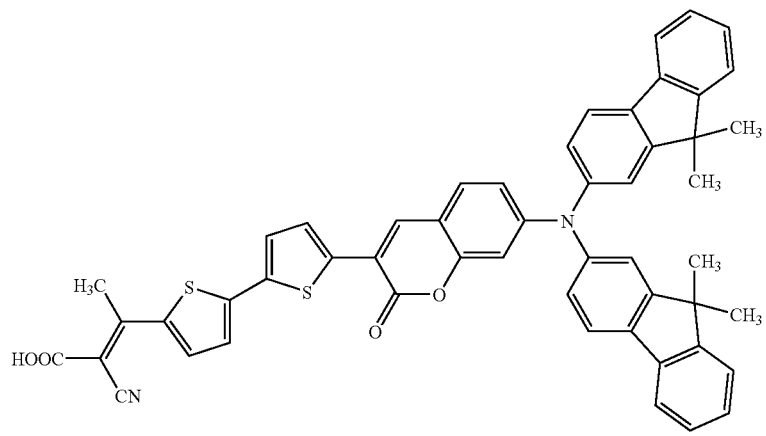
(333)
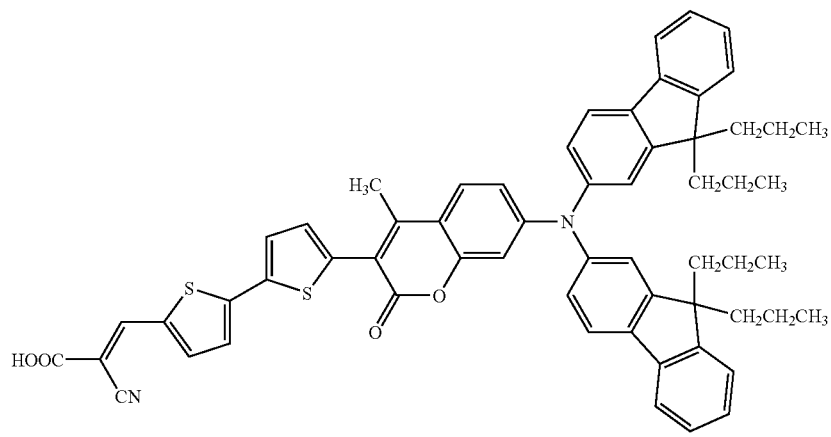

(334)
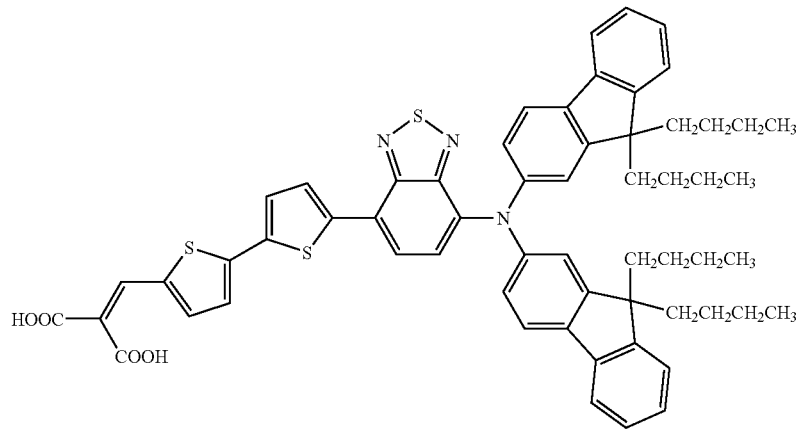
(335)
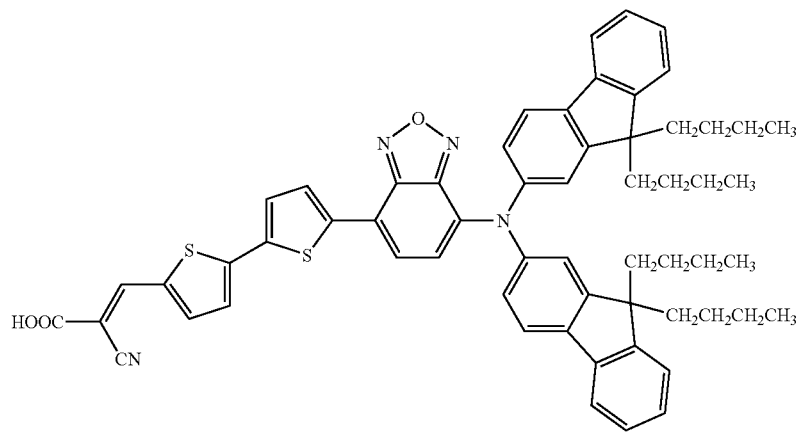
(336)
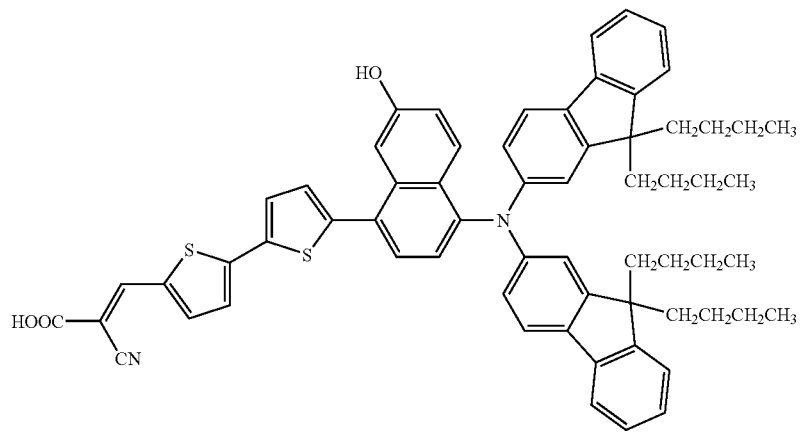

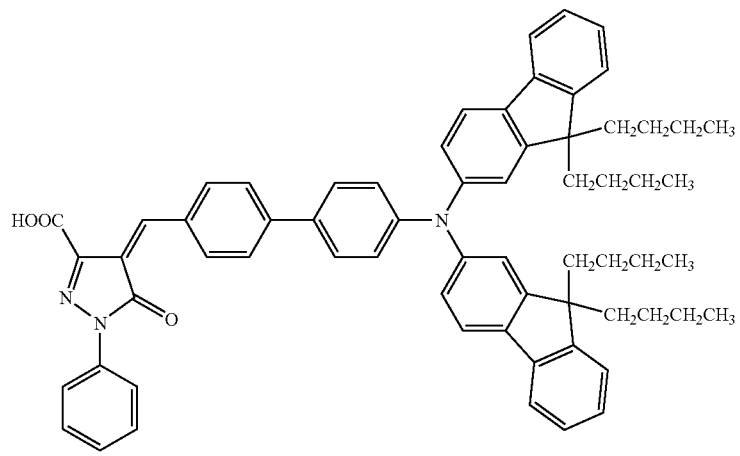
(337)
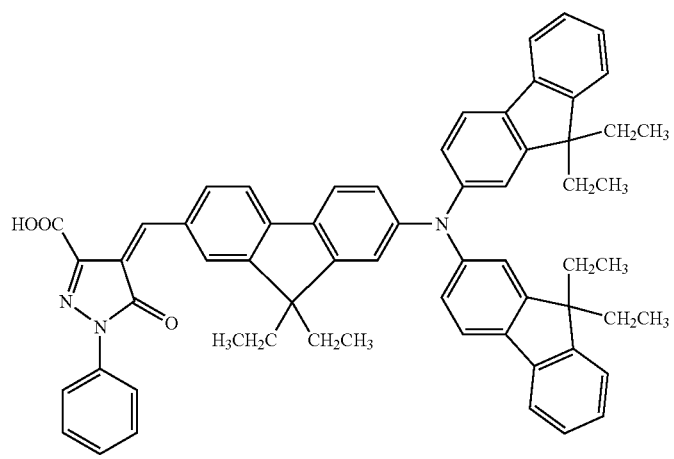
(338)
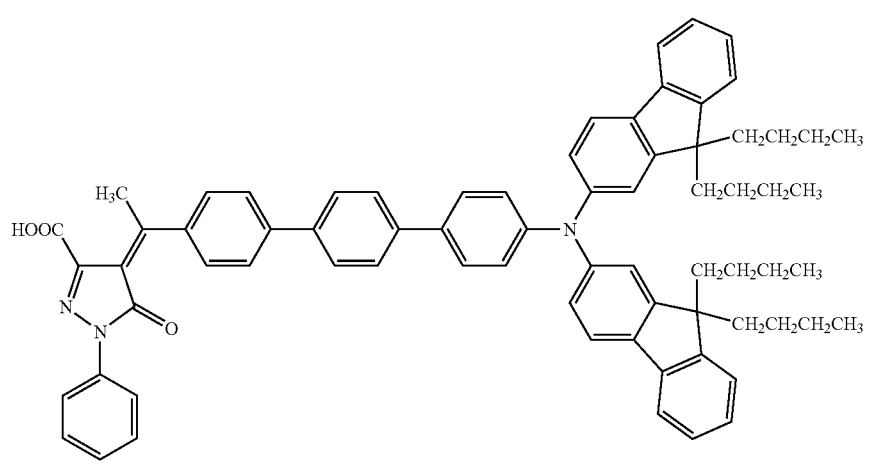
(339)

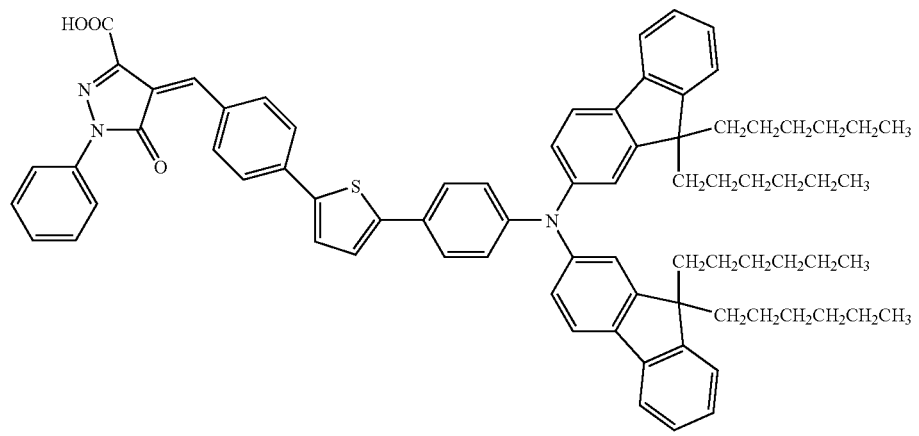
(340)
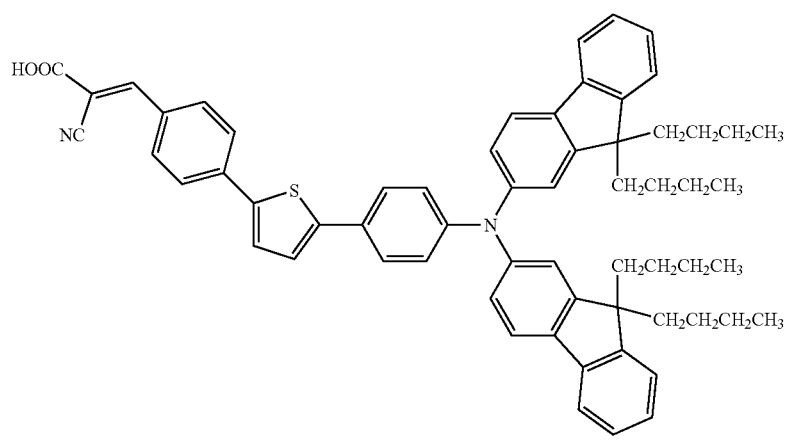
(341)
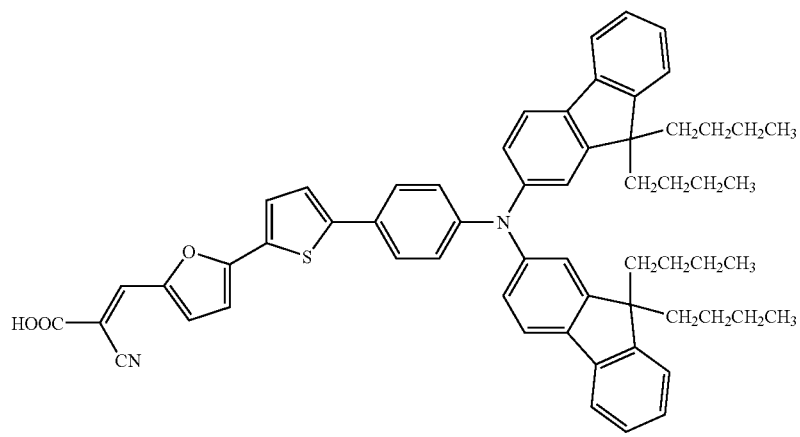
(342)

-continued
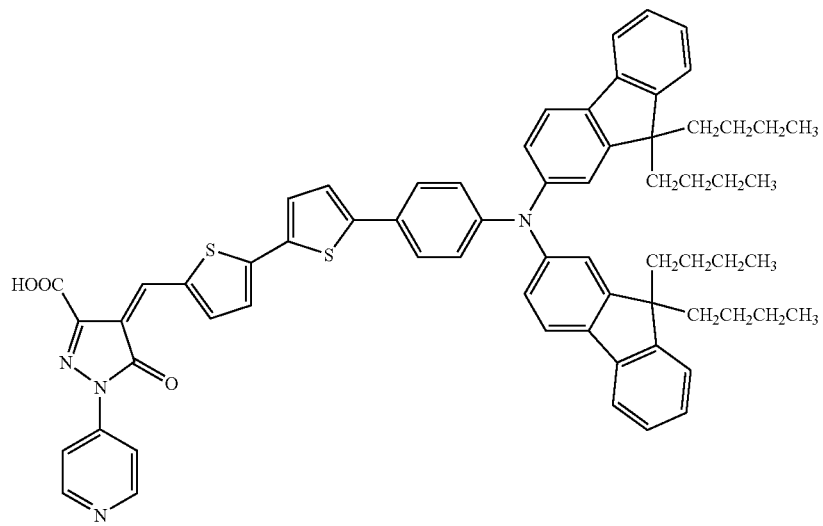
(343)
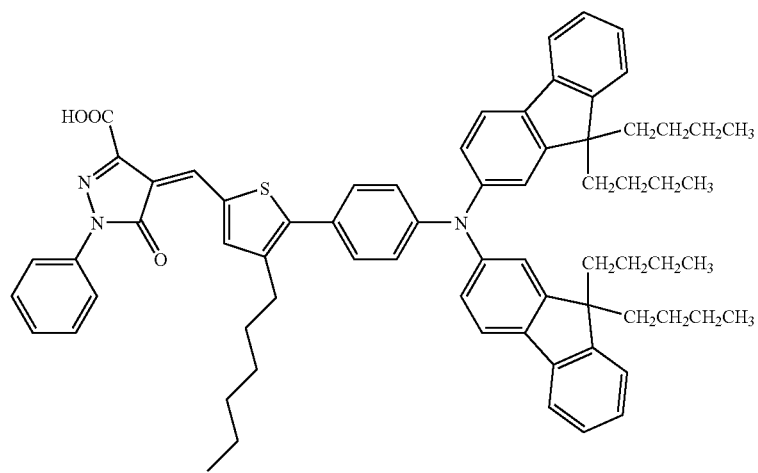
(3001)
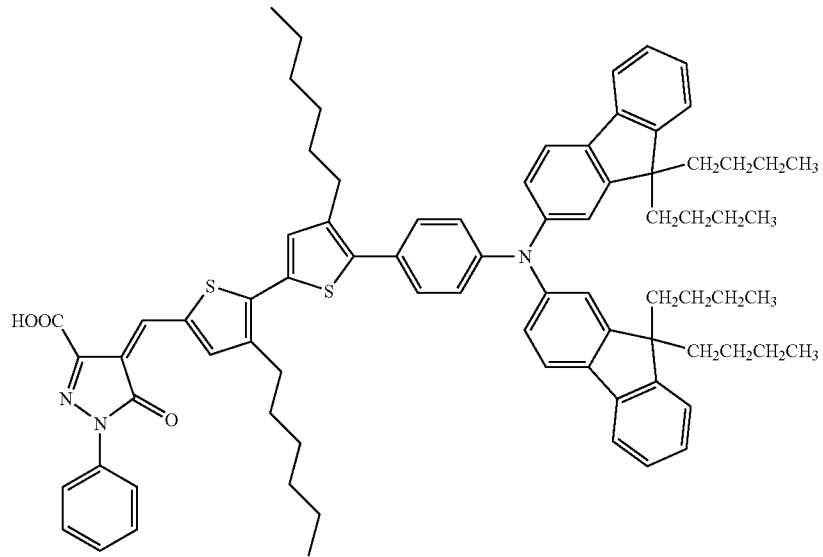
(3002)

(3003)
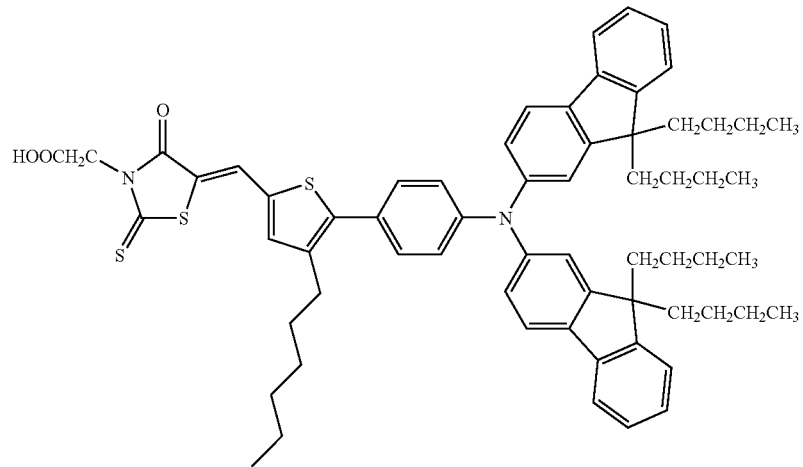
(3004)
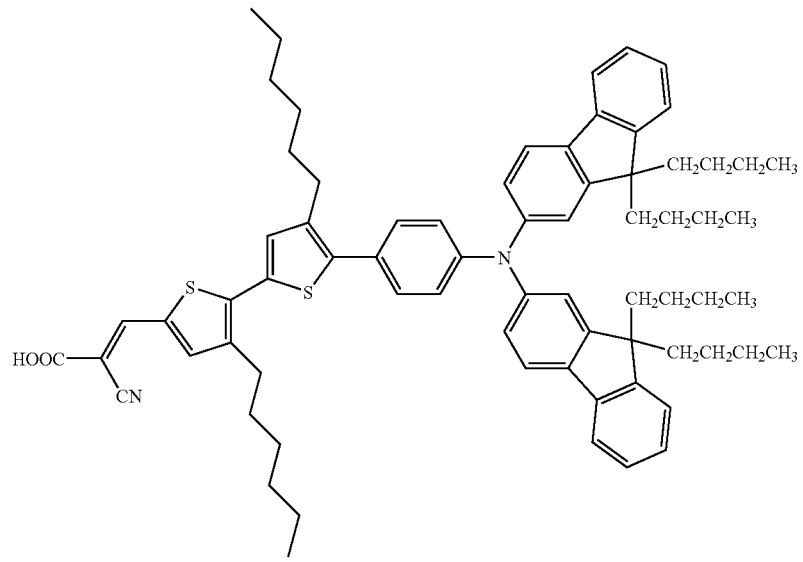
(3005)
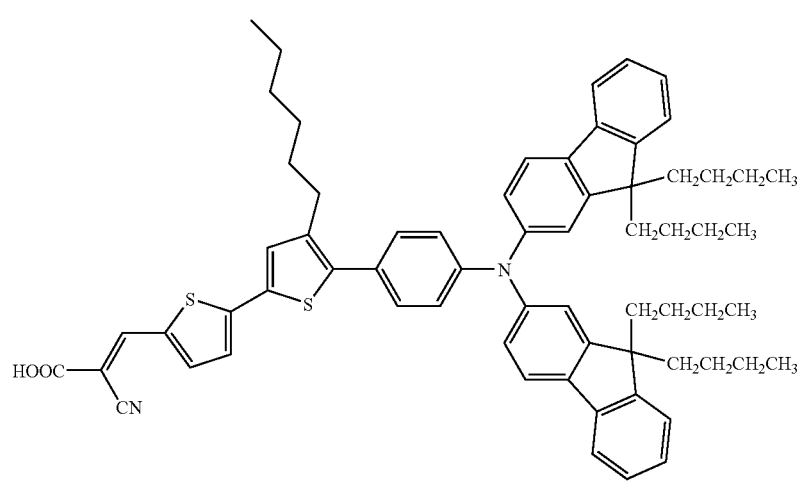

(3006)
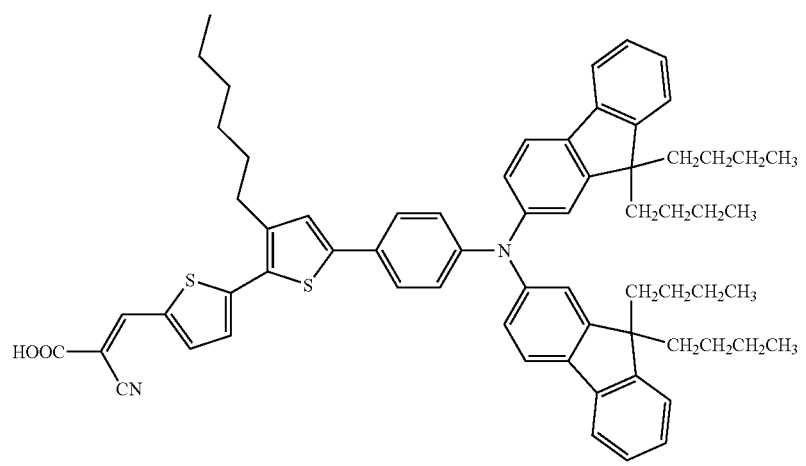
(3007)
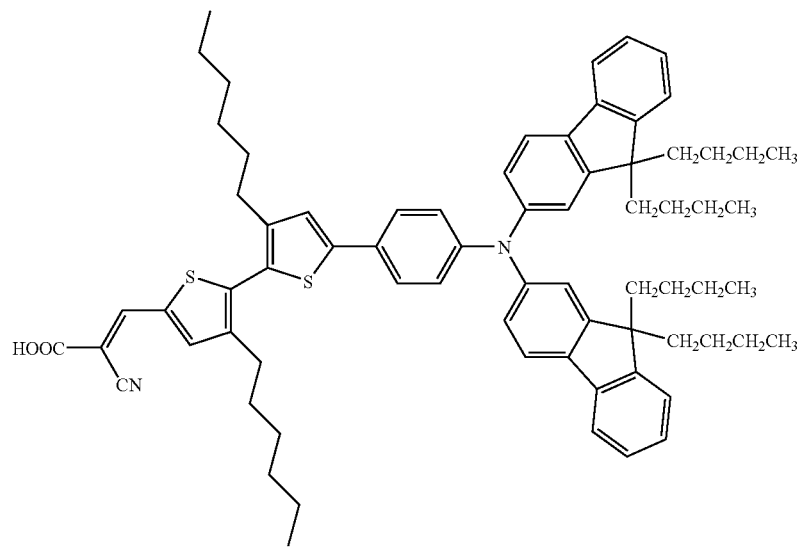
(3008)
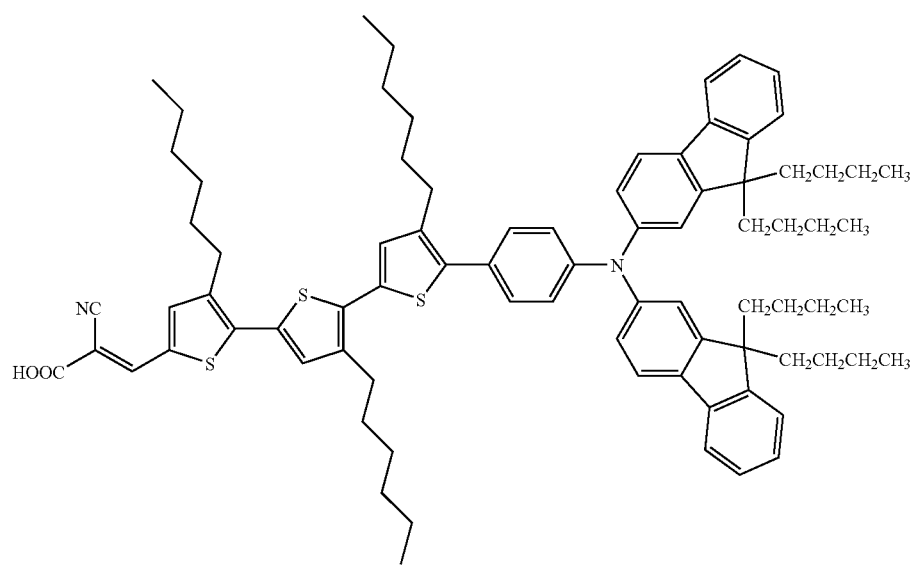

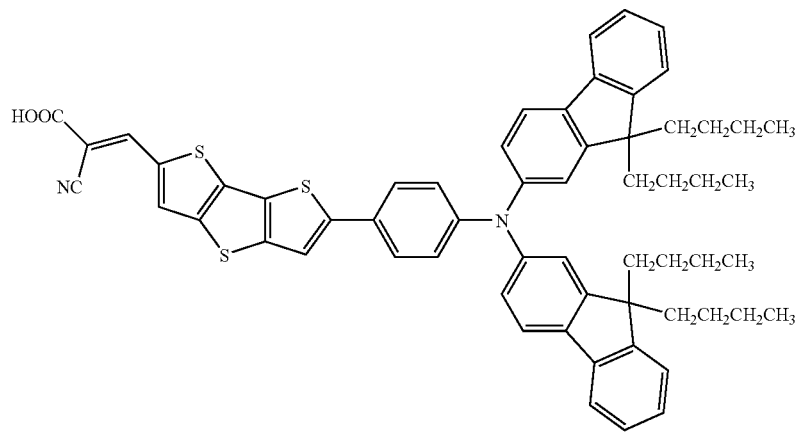
(3009)
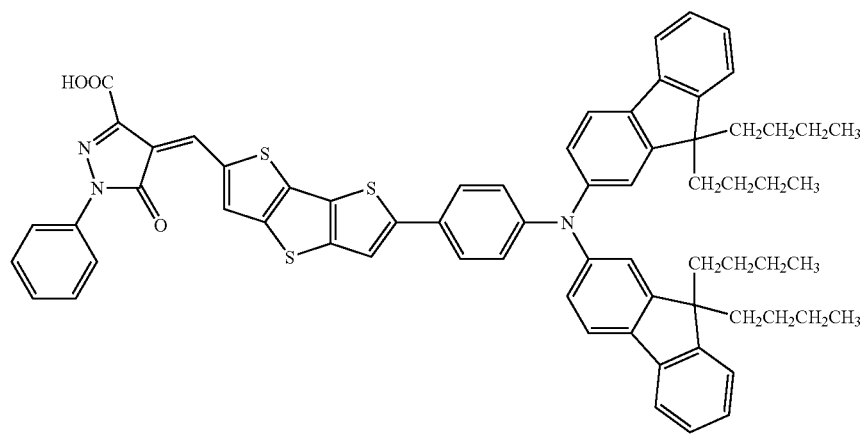
(3010)
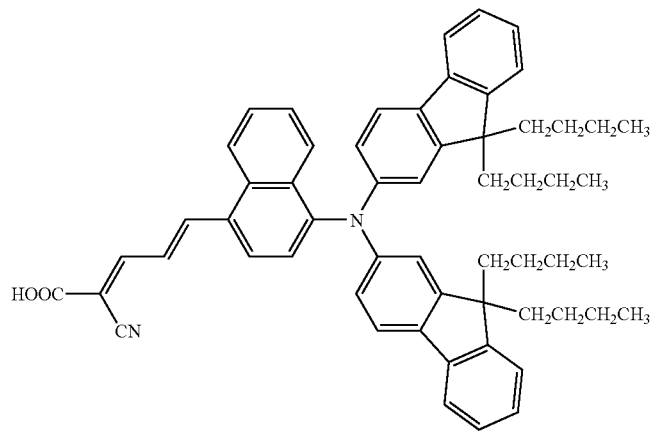
(3011)

(3012)
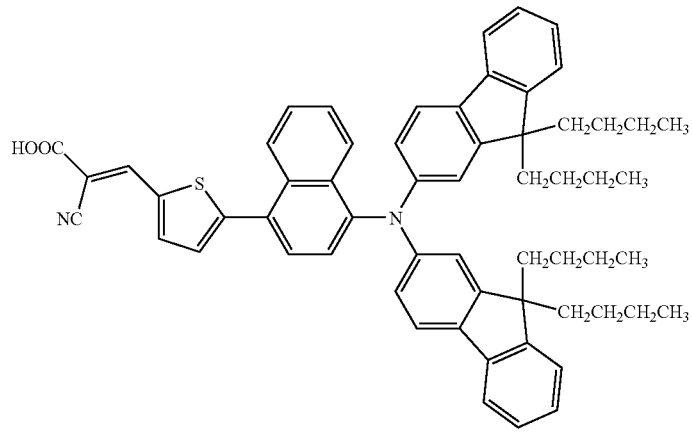
(3013)
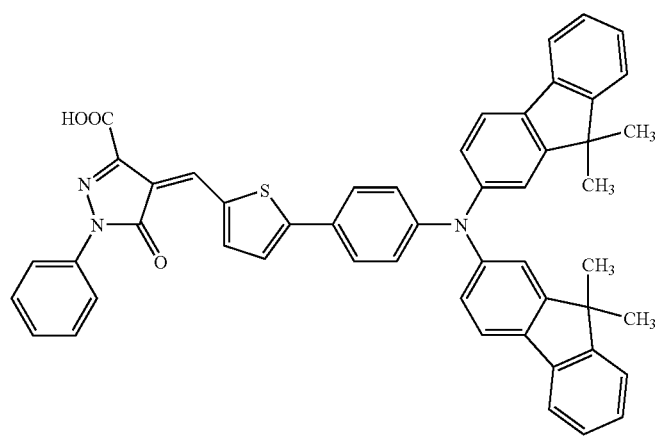
(3014)
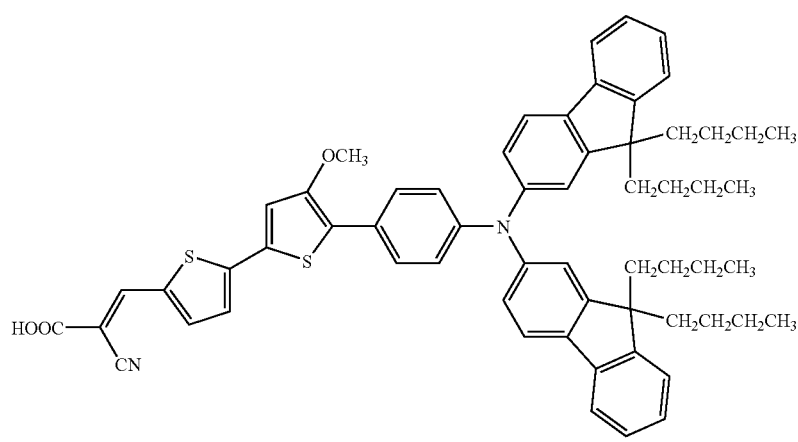

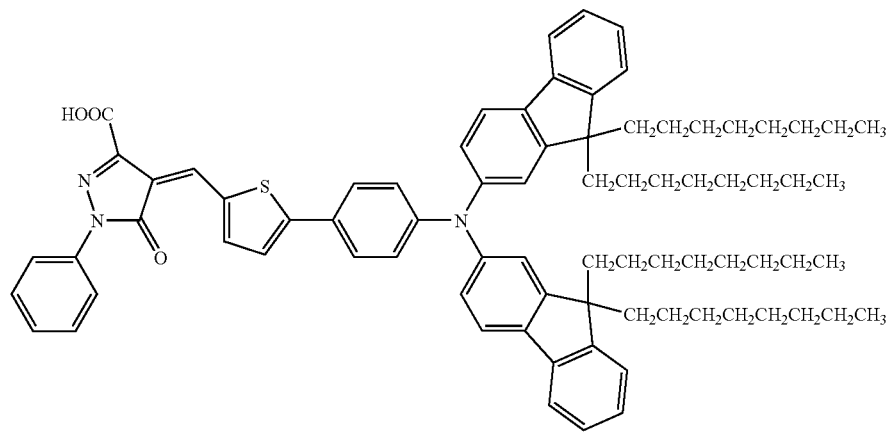
(3015)
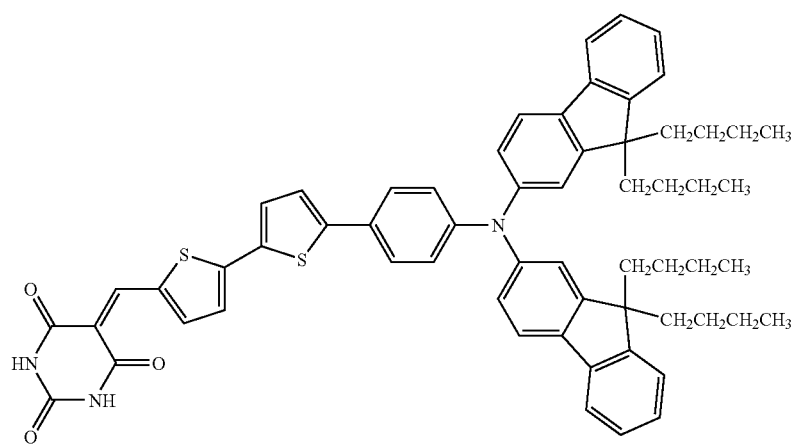
(3016)
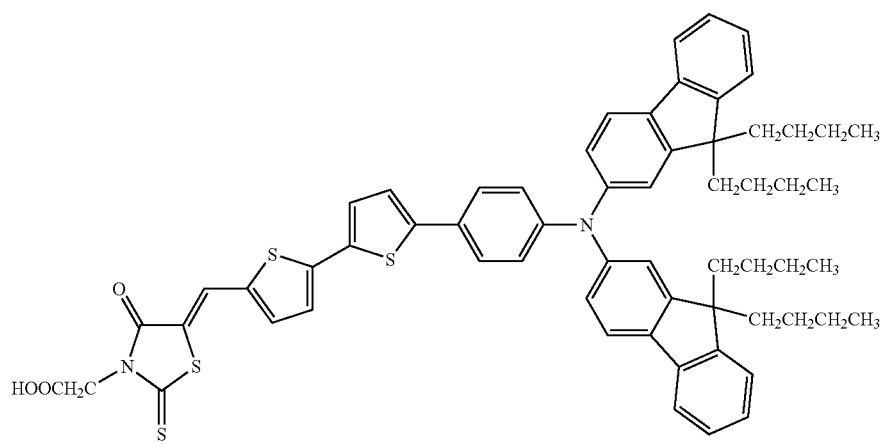
(3017)

(3018)
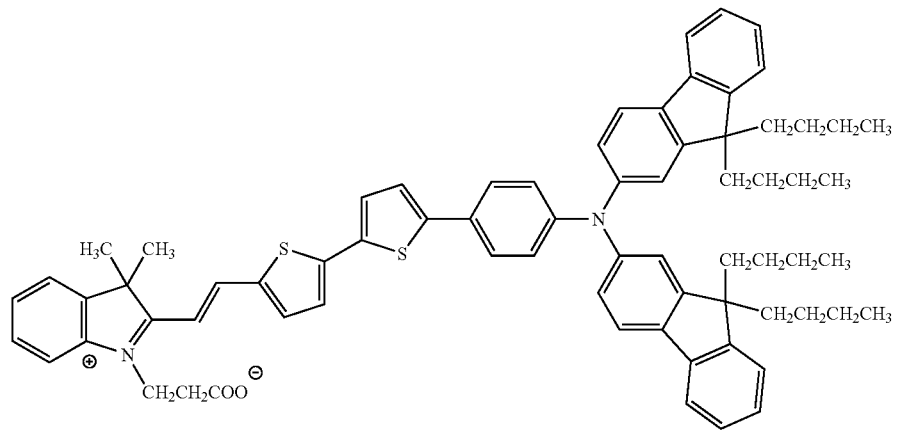
(3019)
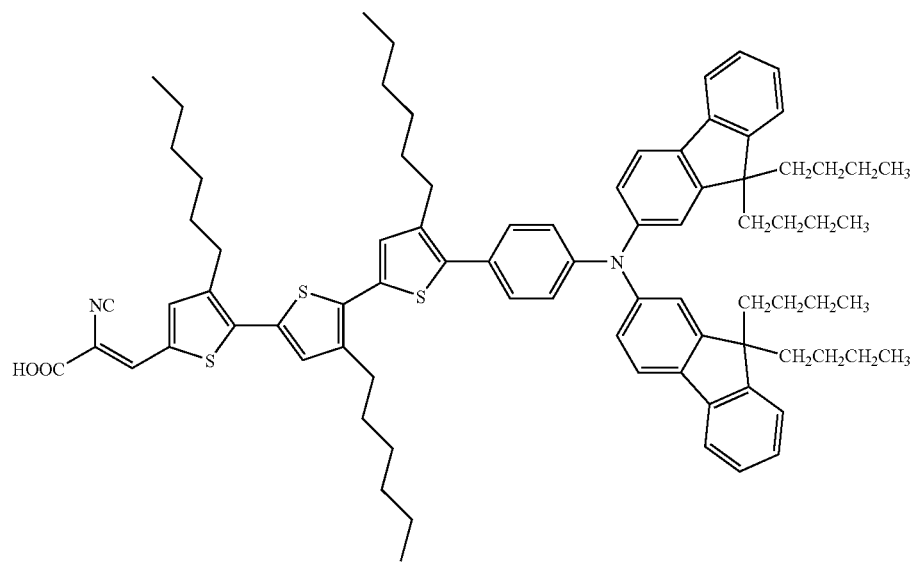
(3020)
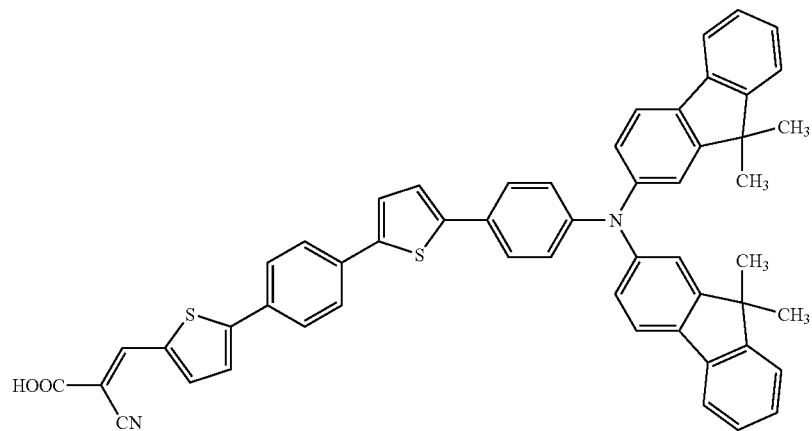

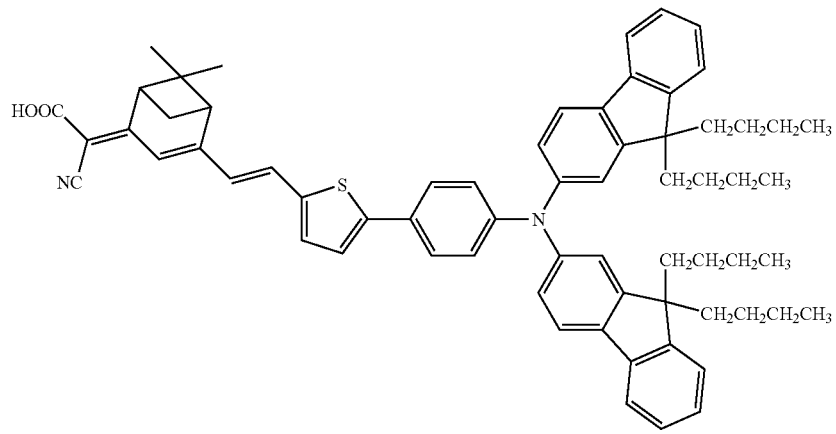
(3021)
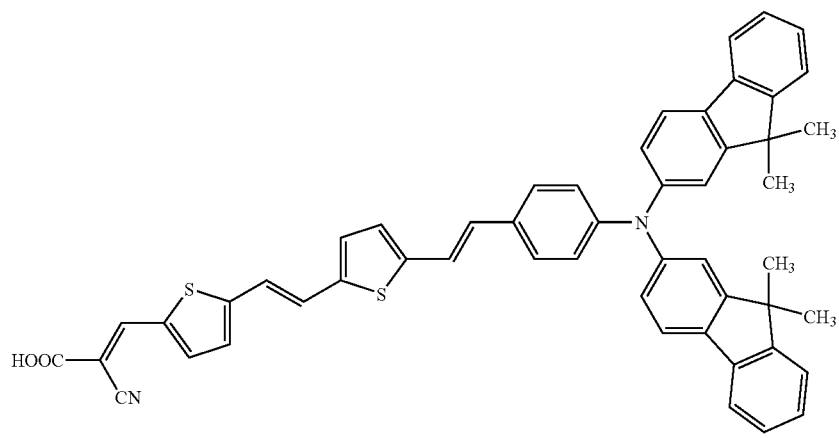
(3022)
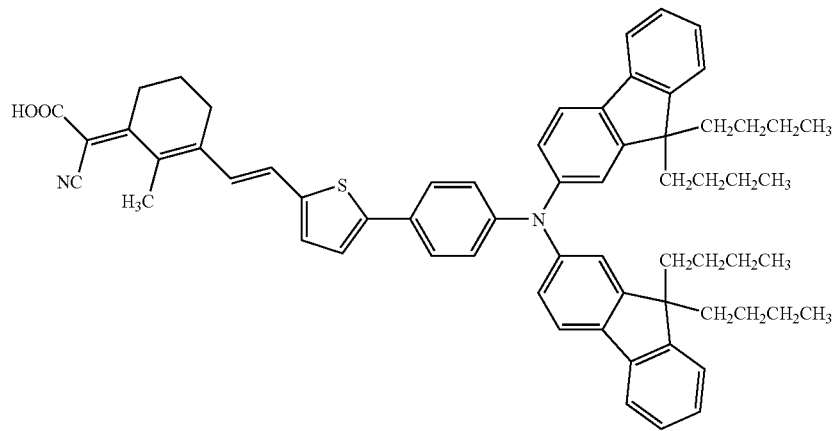
(3023)

(3024)
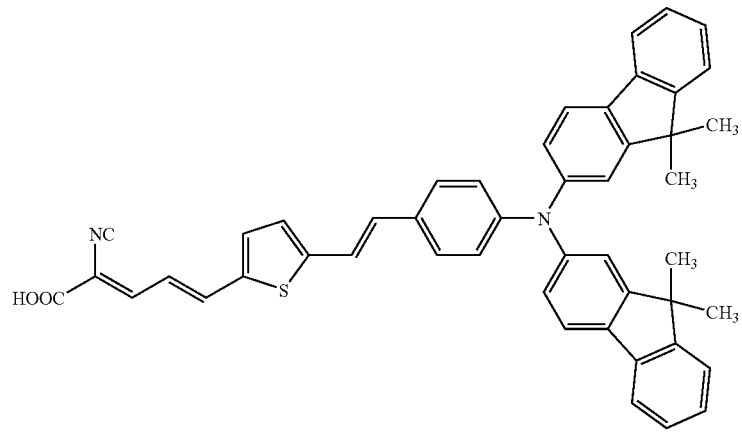
(3025)
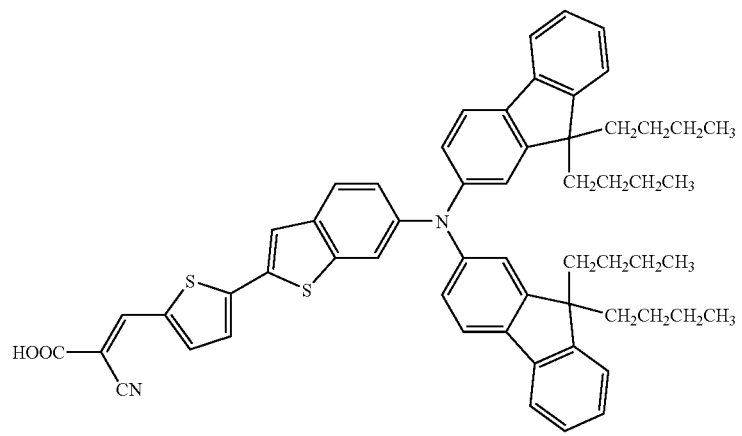
(3026)
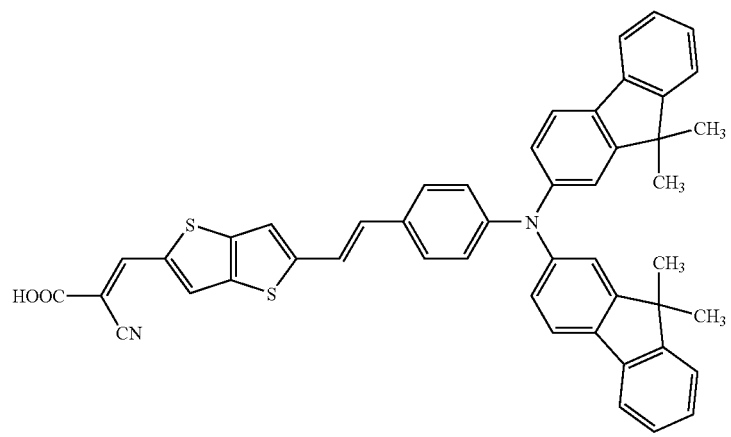

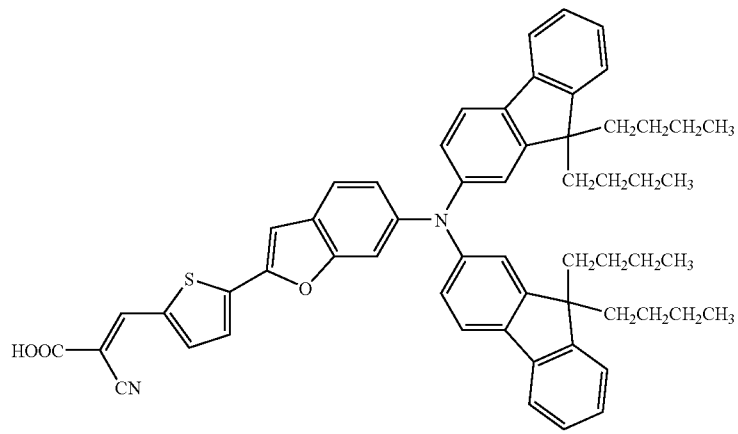
(3027)
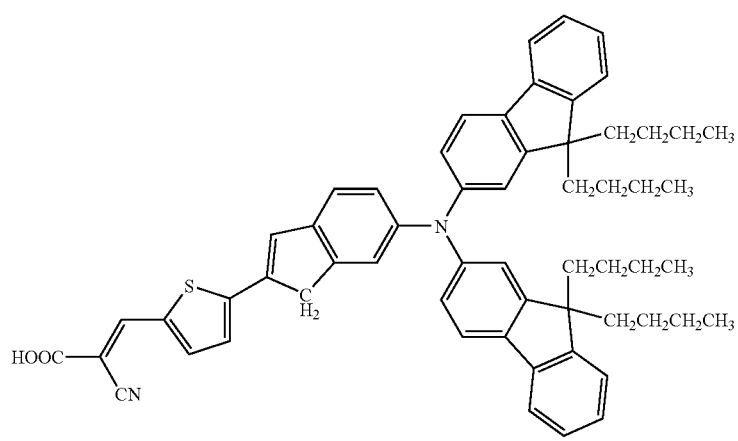
(3028)
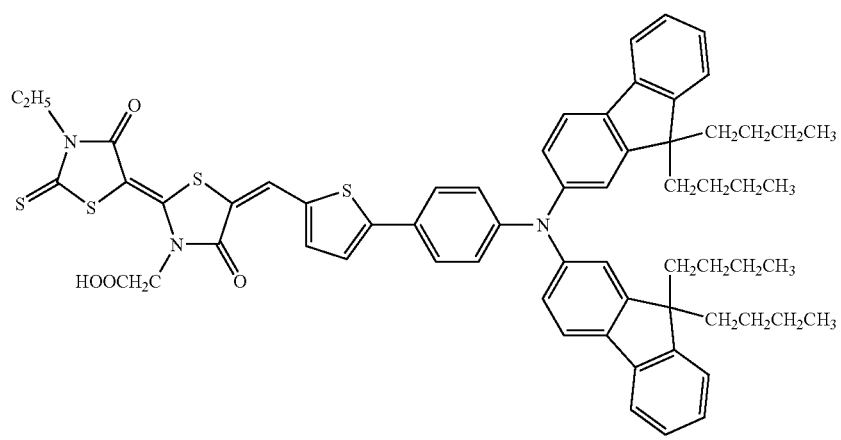
(3029)

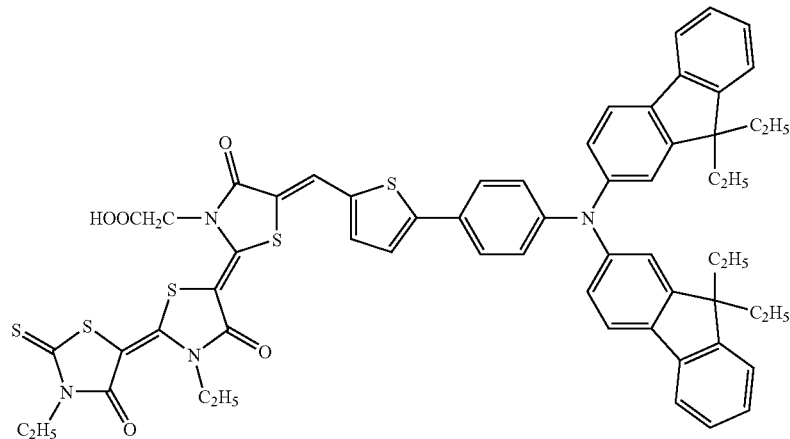
(3030)
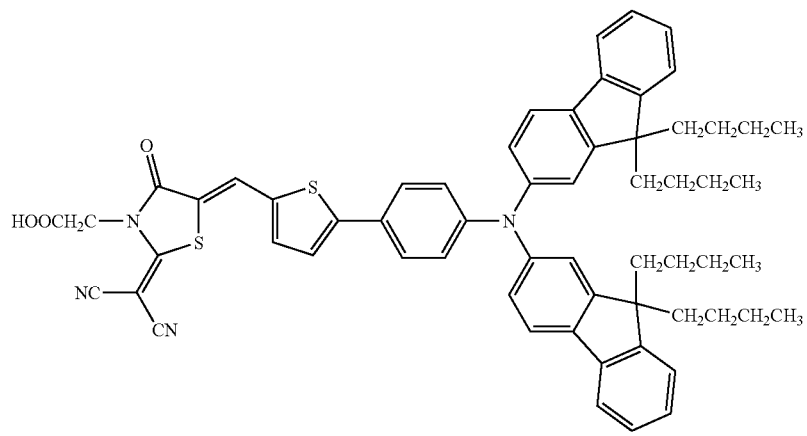
(3031)
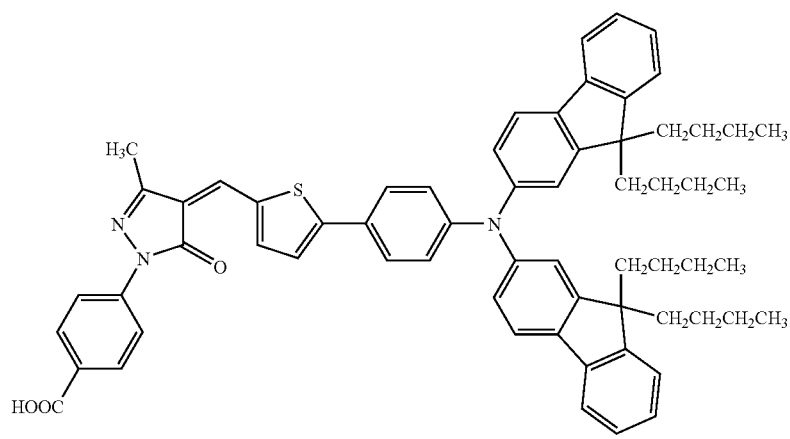
(3032)

-continued
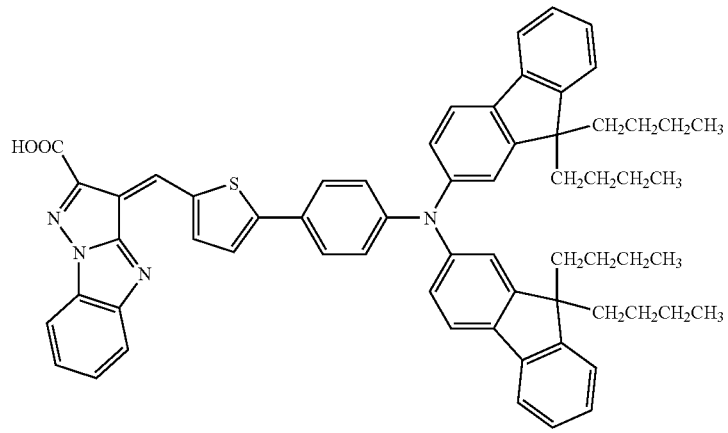
(3033)
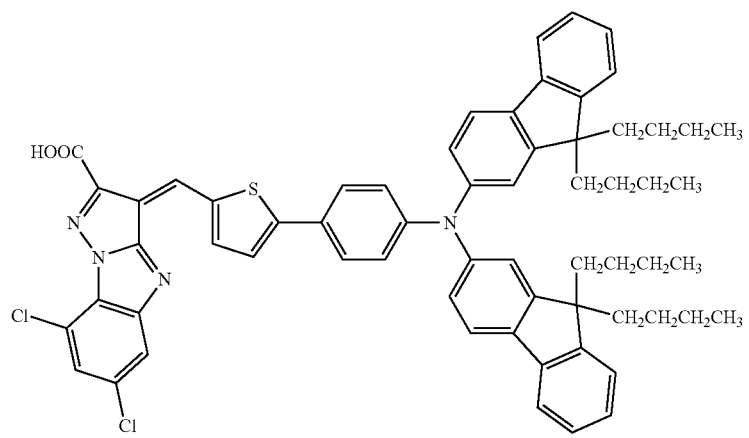
(3034)
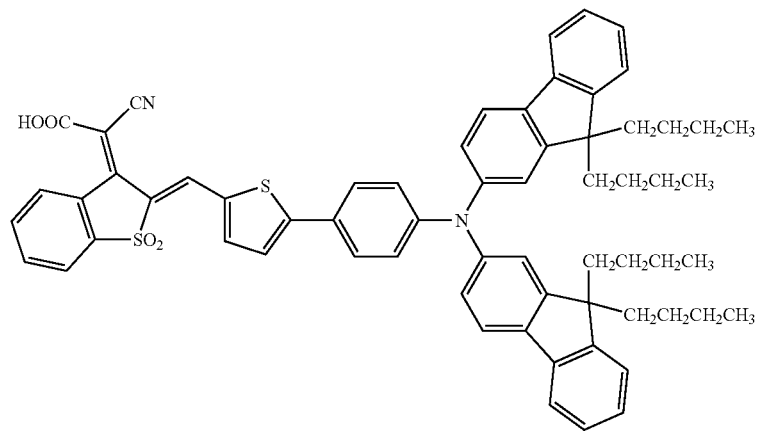
(3035)

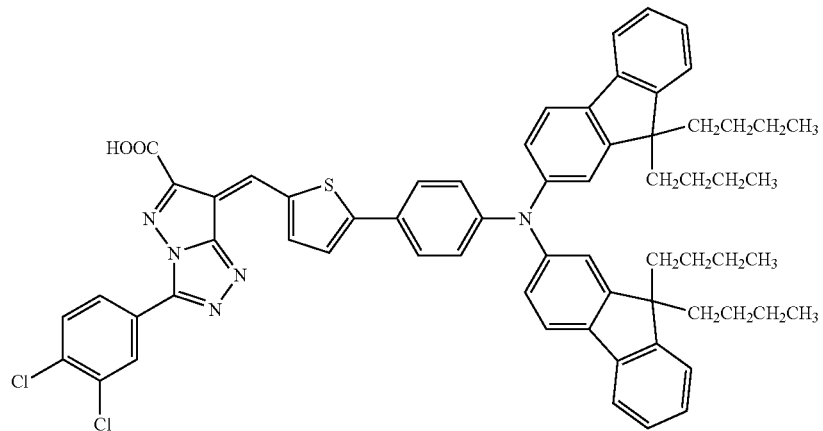
(3036)
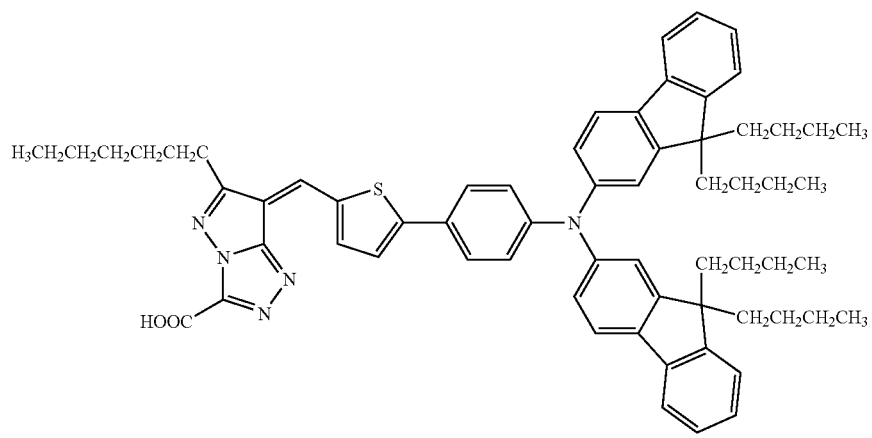
(3037)
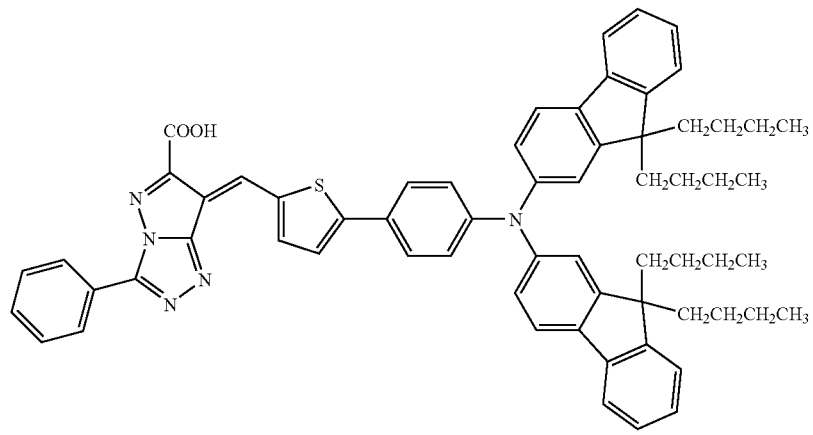
(3038)

-continued
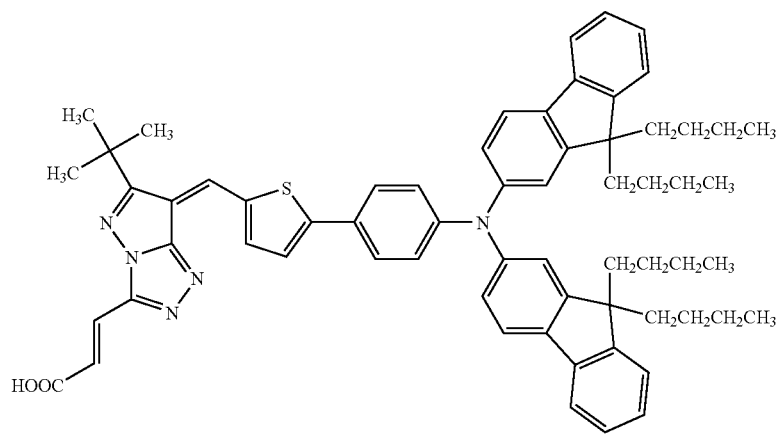
(3039)
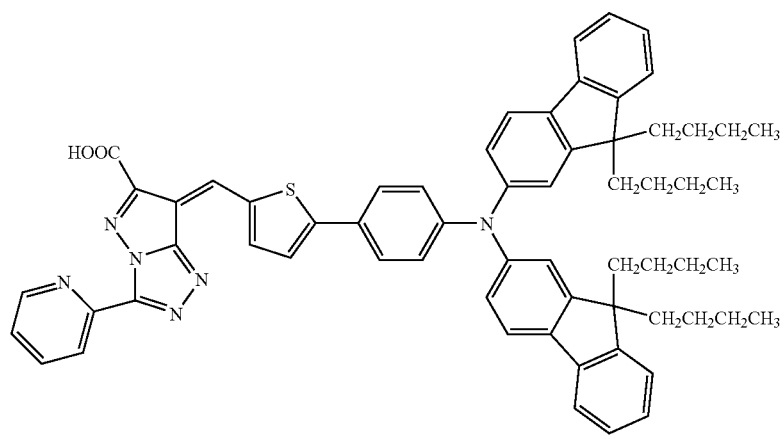
(3040)
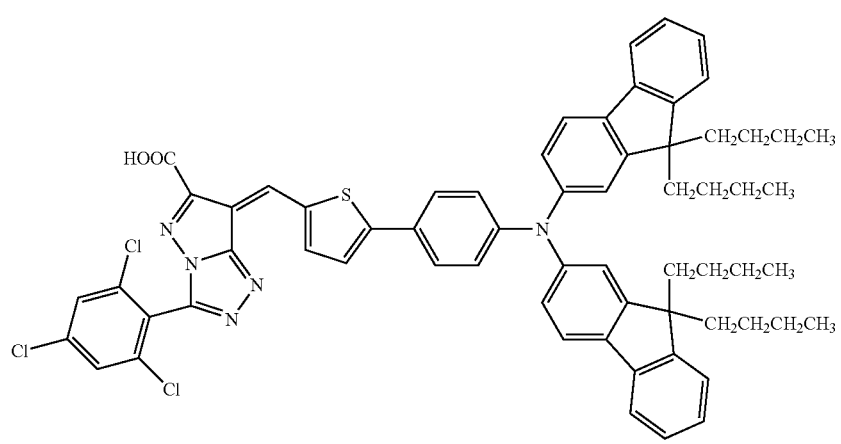
(3041)

-continued
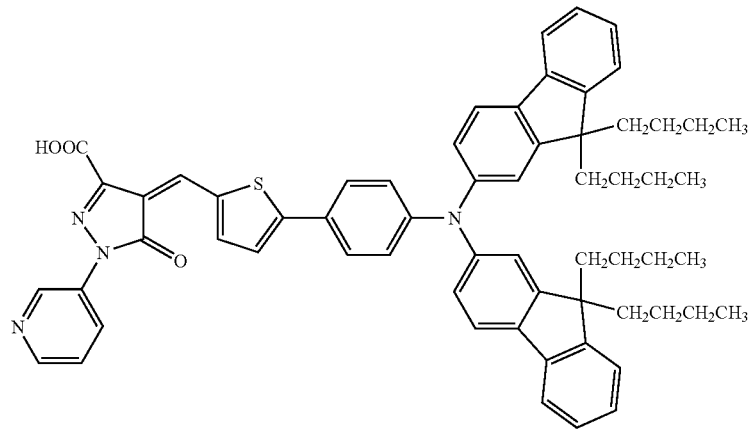
(3042)
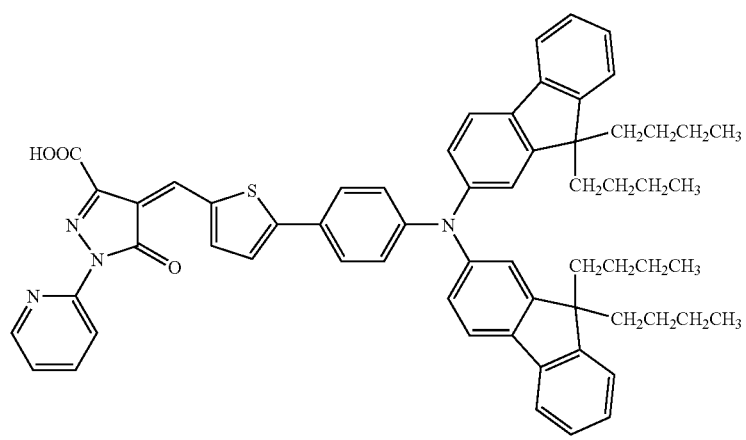
(3043)
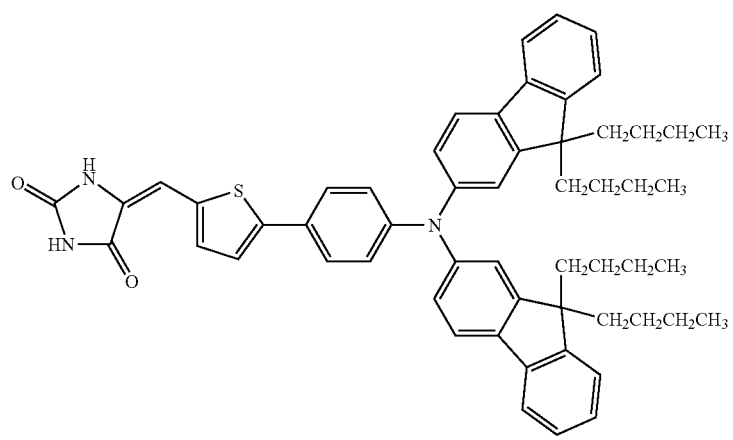
(3044)

-continued
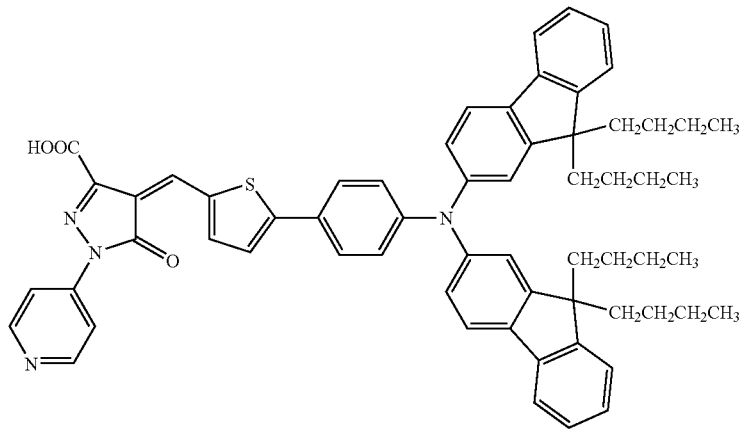
(3045)
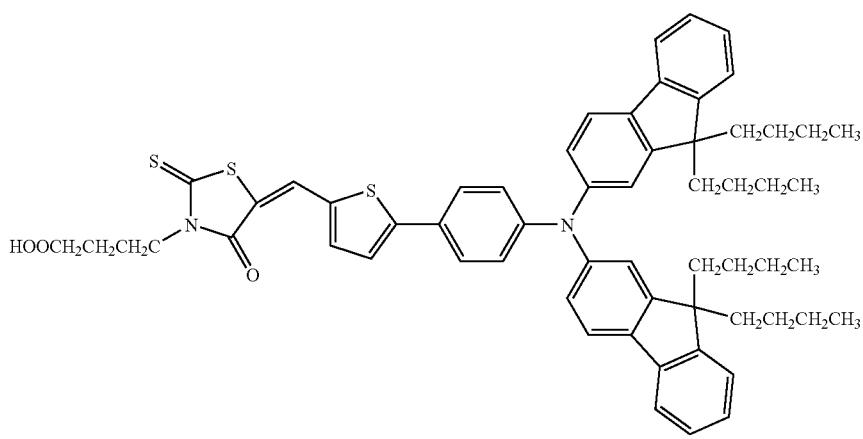
(3046)
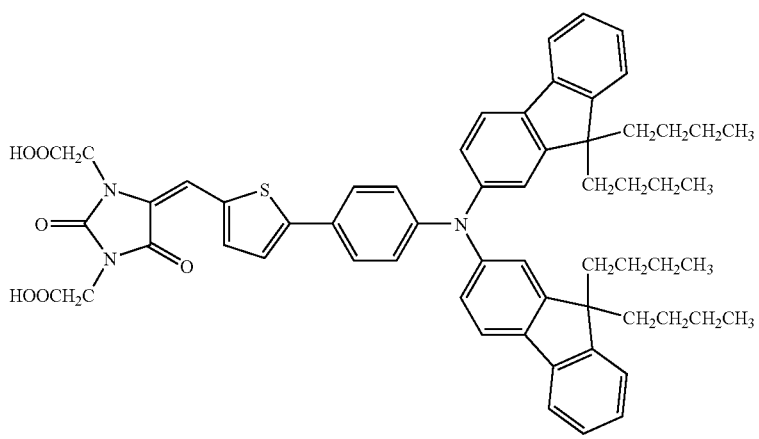
(3047)

-continued
(3048)
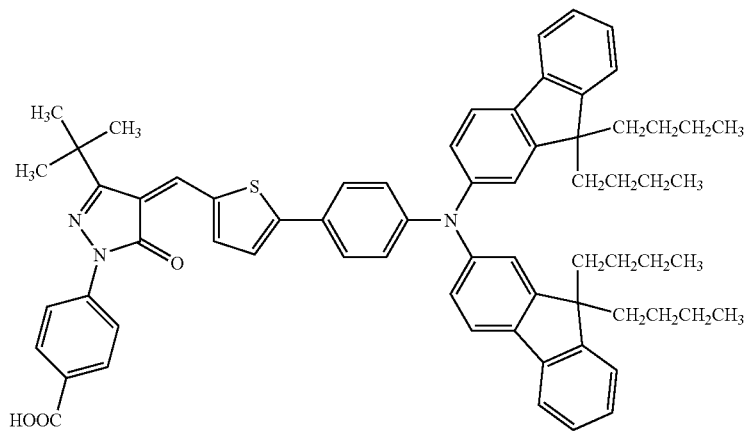
(3049)
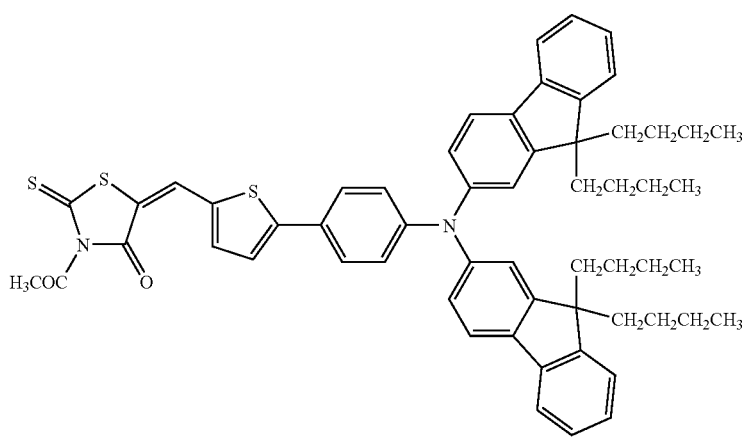
(3050)
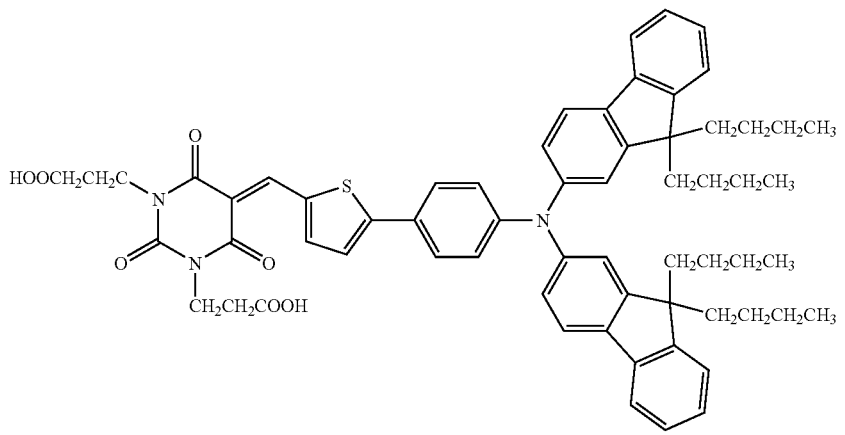

-continued
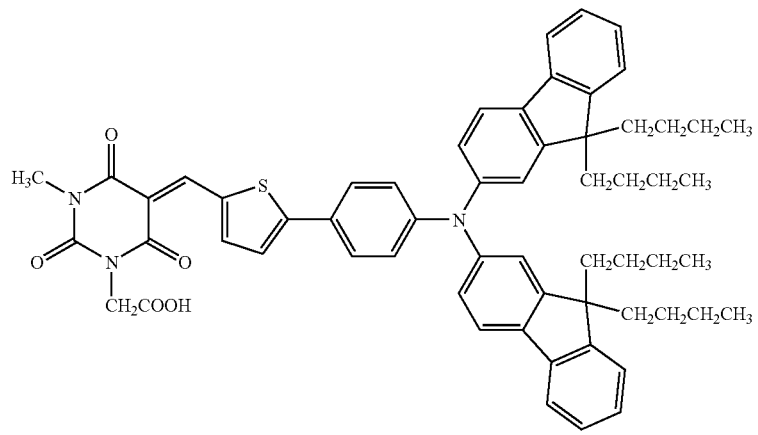
(3051)
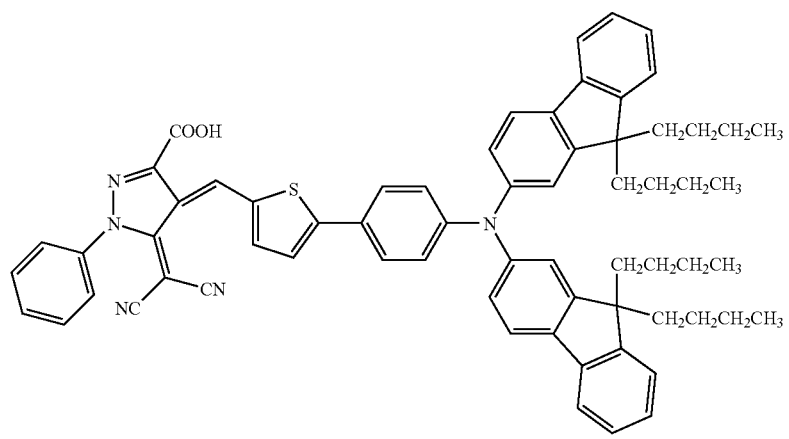
(3052)
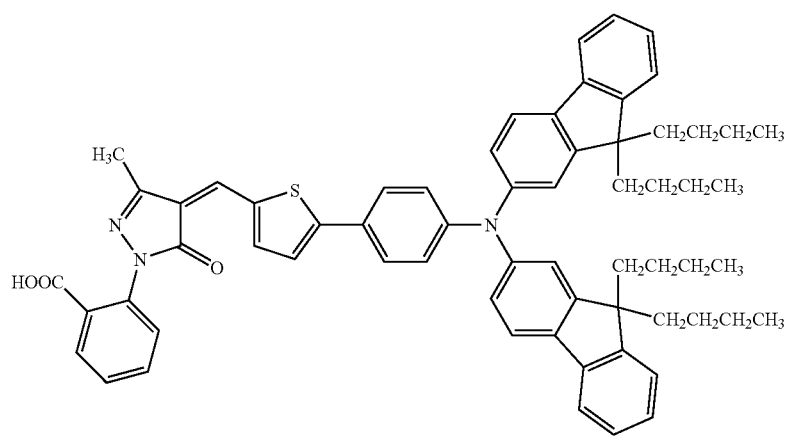
(3053)

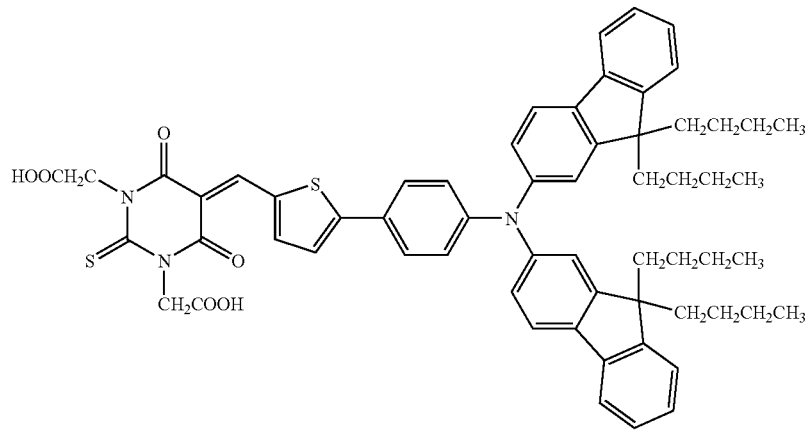
(3054)
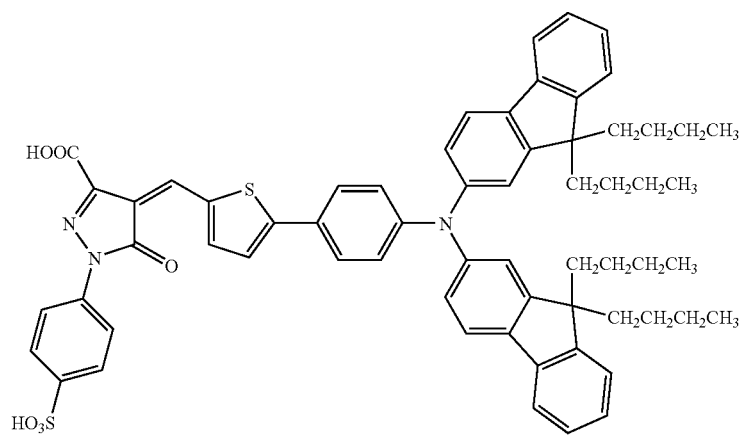
(3055)
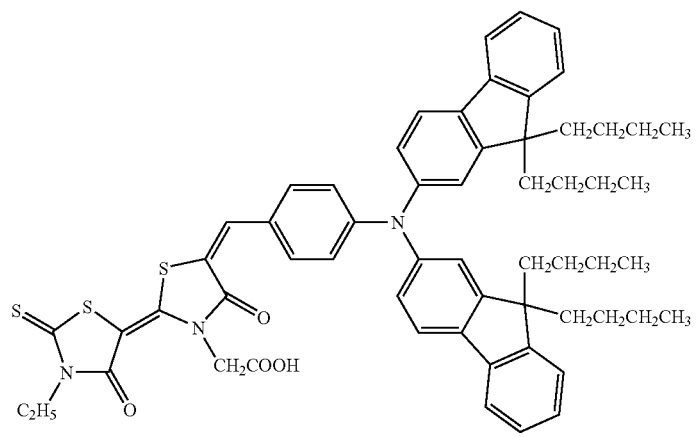
(3056)

-continued

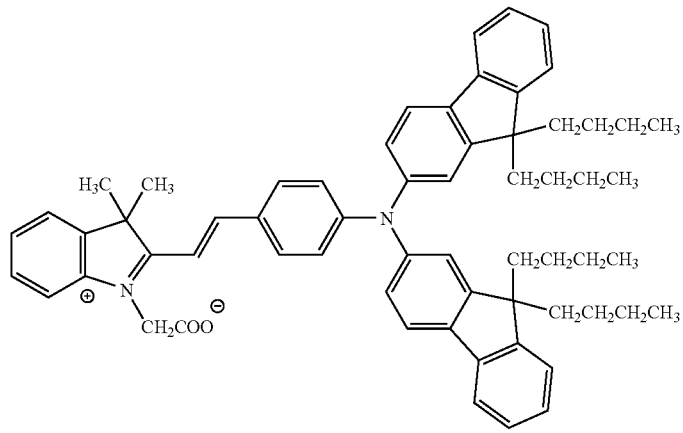
(3057)

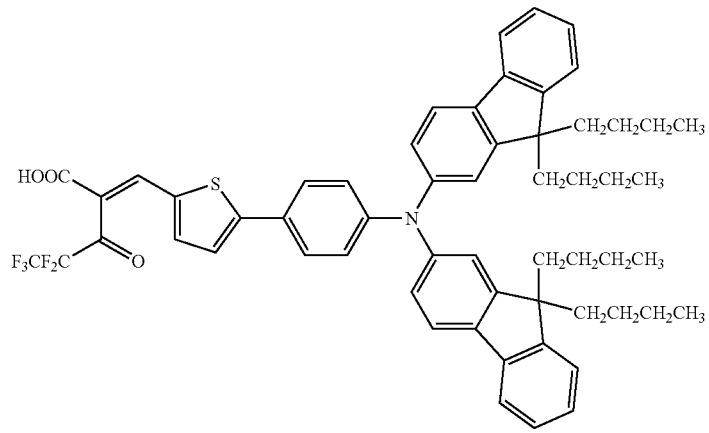
(3058)

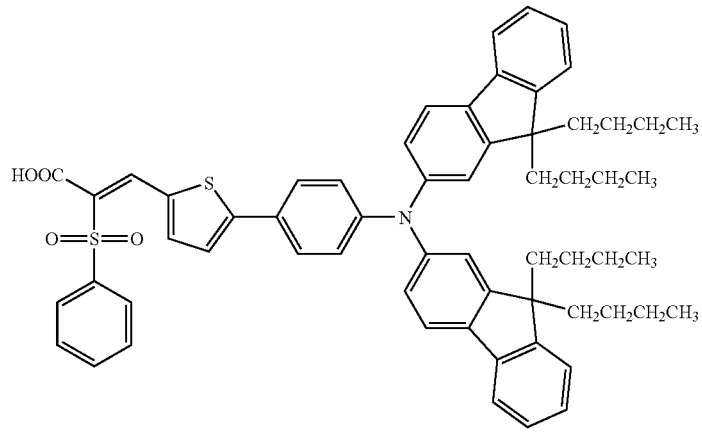
(3059)

The dye-sensitized photoelectric conversion device of the present invention is produced, for example, by establishing a thin film of oxide semiconductor fine particles on a substrate and supporting the dye represented by Formula (1) on the thin film.

As a substrate on which a thin film of oxide semiconductor fine particles is established in the present invention, a substrate whose surface is electrically conductive is preferable. Such a substrate is easily obtained on the market. For example, a product formed by establishing a conductive metal oxide such as indium-, fluorine-, or antimony-doped tin oxide, or a thin film of metal such as copper, silver, gold, etc., on the surface of a transparent polymer material such as glass, polyethylene terephthalate, or polyether sulfone, can be used as a substrate. The electrical conductivity thereof may be generally $1000\Omega$ or less, and particularly preferably $100\Omega$ or less.

Moreover, as oxide semiconductor fine particles, metal oxides are preferable. Specific examples include oxides such as titanium, tin, zinc, tungsten, zirconium, gallium, indium, yttrium, niobium, tantalum or vanadium. Of these, oxides such as titanium, tin, zinc, niobium or indium are preferable. Of these, titanium oxide, zinc oxide, and tin oxide are most preferable. These oxide semiconductors can be used singly. However, they can be mixed or can be coated onto the surface of a semiconductor for their use. Furthermore, the average particle size of a fine particle of oxide semiconductor is generally between 1 and 500 nm, and preferably between 1 and 100 nm. Further, oxide semiconductor fine particles with a large particle size can be mixed with those with a small particle size, or such fine particles can also be used in the form of a multilayer.

A thin film of oxide semiconductor fine particles can be produced by the following methods: a method of directly spraying oxide semiconductor fine particles onto the aforementioned substrate to form a thin film of semiconductor fine particles; a method of electrically depositing semiconductor fine particles in the form of a thin film, using a substrate as an electrode; a method of applying, onto a substrate, a slurry of semiconductor fine particles or a paste containing semiconductor fine particles obtained by hydrolyzing a precursor of semiconductor fine particles such as semiconductor alkoxide, and then drying, curing or calcining it; and the like. From the viewpoint of the performance of an electrode using an oxide semiconductor, a method using a slurry is preferable. In the case of this method, a slurry can be obtained by dispersing oxide semiconductor fine particles that are in a state of secondary agglutination into a dispersion medium according to an ordinary method, such that the average primary particle size thereof becomes between 1 and 200 nm.

As a dispersion medium into which a slurry is dispersed, any type of dispersion medium can be used, as long as it can provide dispersion of semiconductor fine particles. Examples of the dispersion medium used herein include water, alcohols such as ethanol, ketones such as acetone or acetylacetone, and hydrocarbons such as hexane. They may be mixed for their use. In addition, the use of water is preferable in that a change in the viscosity of a slurry can be reduced. Moreover, for the purpose of stabilization of the dispersed state of oxide semiconductor fine particles, a dispersion stabilizer can be used. Examples of a dispersion stabilizer that can be used herein include acids such as acetic acid, hydrochloric acid or nitric acid, and organic solvents such as acetylacetone, acrylic acid, polyethylene glycol or polyvinyl alcohol.

A substrate, onto which a slurry has been applied, may be then calcined. The calcining temperature is generally 100° C. or higher, and preferably 200° C. or higher. The upper limit thereof is approximately the melting point (softening point) of such a substrate or lower. The upper limit is generally 900° C., and preferably 600° C. or lower. The calcining time is not particularly limited. It is preferably approximately 4 hours or shorter. The thickness of a thin film on a substrate is generally between 1 and 200 μm, and preferably between 1 and 50 μm.

A secondary treatment may be performed on a thin film of oxide semiconductor fine particles. That is, for example, a thin film on a substrate is directly immersed in a solution containing the alkoxide, chloride, nitride, sulfide, etc. of a metal of the same type as the semiconductor, and it is then dried or calcined again, thereby improving the performance of the thin film of semiconductor fine particles. Examples of a metal alkoxide include titanium ethoxide, titanium isopropoxide, titanium t-butoxide, and n-dibutyl-diacetyl tin. Such a metal alkoxide can be used in the form of an alcohol solution containing the same. Examples of a chloride include titanium tetrachloride, tin tetrachloride, and zinc chloride. Such a chloride can be used in the form of an aqueous solution containing the same. The thus obtained thin film of oxide semiconductor consists of oxide semiconductor fine particles.

Next, a method of supporting the methine dye represented by the aforementioned Formula (1) of the present invention onto such a thin film of oxide semiconductor will be described.

As a method of supporting the methine dye represented by the aforementioned Formula (1) on a thin film of oxide semiconductor, there is a method of immersing a substrate, on which the aforementioned thin film of oxide semiconductor fine particles has been established, into a solution obtained by dissolving the dye in a solvent capable of dissolving it, or in the case of a dye with low solubility, into a dispersed solution obtained by dispersing the dye into the solvent. The concentration of such a solution or a dispersed solution is determined, as appropriate, depending on the type of a dye. A substrate, on which a thin film of oxide semiconductor fine particles has been established, is dispersed into such a solution. The immersion temperature is approximately between an ordinary temperature and the boiling point of a solvent. In addition, the immersion time is approximately between 1 minute and 48 hours. Specific examples of a solvent that can be used for dissolving a dye include methanol, ethanol, isopropanol, tetrahydrofuran (THF), acetonitrile, dimethyl sulfoxide (DMSO), dimethylformamide (DMF), acetone, n-butanol, t-butanol, water, n-hexane, chloroform, dichloromethane, and toluene. These solvents can be used singly, or in combination of several solvents, depending on the solubility of a dye, and the like. When the solubility of a dye is extremely low, for example, salts such as tetramethyl ammonium iodide or tetra-n-butyl ammonium bromide may be added to the aforementioned solution to dissolve the dye therein. The dye concentration in the solution may be generally between $1 \times 10^{-6}$ M and 1 M, and preferably between $1 \times 10^{-5}$ M and $1 \times 10^{-1}$ M. After completion of the immersion, air drying, and if necessary, heating are performed to eliminate the solvent. Thus, the photoelectric conversion device of the present invention comprising a thin film of oxide semiconductor fine particles sensitized with the methine dye represented by Formula (1) can be obtained.

The methine dye to be supported, which is represented by the aforementioned Formula (1), may be used singly or in combination of several types. In the case of mixing several types of methine dyes, the same types of methine dyes represented by Formula (1) of the present invention may be mixed with one another, or the aforementioned methine dye may also be mixed with other types of dyes or metal complex dyes. In particular, by mixing dyes with different absorption wavelengths, a wide range of absorption wavelength can be utilized, and as a result, a solar cell having high conversion efficiency can be obtained. The type of a metal complex dye to be mixed is not particularly limited. Examples of the metal complex dye include the ruthenium complex described in Non-Patent Document 2 or the quaternary ammonium salt compound thereof, phthalocyanine, and porphyrin. Examples of an organic dye to be mixed include: metal-free phthalocyanine and metal-free porphyrin; cyanine, merocyanine, oxonol and triphenylmethane dyes; methine dyes such as the acrylic acid dye described in Patent Document 2; and xanthene, azo, anthraquinone and perylene dyes. A ruthenium complex, merocyanine, and methine dyes such as an acrylic acid dye are preferable. When two or more types of dyes are used, such dyes may be successively adsorbed on a thin film of semiconductor fine particles, or they may be mixed and dissolved, and the mixed solution may be then adsorbed thereon.

The ratio of the mixed dyes is not particularly limited. Optimal conditions may be selected, as appropriate, depending on the type of each dye. In general, it is preferable to mix the dyes at an equimolar ratio, or to use approximately 10% mol or more of each dye. When two or more types of dyes are adsorbed on a thin film of oxide semiconductor fine particles, using a solution into which such two or more types of dyes have been dissolved or dispersed, the total concentration of the dyes contained in the solution may be the same as in a case where a single type of dye is supported on the thin film. As solvent in the case of two or more types of dyes to be mixed and used, the same solvent as those described above can be used. Solvents used for individual dyes may be identical to or different from one another.

When dyes are supported on a thin film of oxide semiconductor fine particles, in order to prevent association of the dyes, it is advantageous that the dyes be supported in the coexistence of a clathrate compound. Examples of a clathrate compound used herein include steroid compounds such as cholic acid, a crown ether, cyclodextrin, calixarene, and polyethylene oxide. Specific examples of a preferred clathrate compound include cholic acids such as deoxycholic acid, dehydrodeoxycholic acid, chenodeoxycholic acid, a cholic acid methyl ester or sodium cholate, and polyethylene oxide. In addition, after such dyes have been supported on a thin film of oxide semiconductor fine particles, the thin film may be treated with an amine compound such as 4-t-butylpyridine. As a treating method, a method of immersing a substrate, on which a dye-supported thin film of semiconductor fine particles has been established, into an ethanol solution containing amine, etc. can be adopted.

The solar cell of the present invention is composed of a photoelectric conversion device used as one electrode, wherein dyes have been supported on the aforementioned thin film of oxide semiconductor fine particles, a counter electrode, and a redox electrolyte or a hole transport material or a p-type semiconductor, and other components. With regard to the form of such a redox electrolyte, a hole transport material or a p-type semiconductor, known forms such as a liquid, a coagulated form (gel or gel-state), or a solid can be used. As a liquid, a liquid product obtained by dissolving a redox electrolyte, a molten salt, a hole transport material or a p-type semiconductor in a solvent, or an ambient temperature molten salt, can be used. In the case of a coagulated form (gel or gel-state), products obtained by adding the aforementioned components into a polymer matrix, a low molecular weight gellant, etc. can be used. As a solid, a redox electrolyte, a molten salt, a hole transport material or a p-type semiconductor, etc. can be used. Examples of a hole transport material include amine derivatives, conductive polymers such as polyacetylene, polyaniline or polythiophene, and triphenylene compounds. Examples of a p-type semiconductor include CuI and CuSCN. As a counter electrode, an electrode, which has conductivity and acts as a catalyst on the reduction reaction of a redox electrolyte, is preferable. As such a counter electrode, a product obtained by coating a glass or a polymer film with platinum, carbon, rhodium or ruthenium via evaporation, or a product to which conductive fine particles are applied, can be used.

Examples of a redox electrolyte used in the solar cell of the present invention include a halogen redox electrolyte comprising halogen compound having a halogen ion as counterion and halogen molecules, ferrocyanic acid salt-ferricyanic acid salt, ferrocene-ferricinium ion, a metal redox electrolyte including a metal complex such as a cobalt complex, alkylthiol-alkyldisulfide, a viologen dye, and an organic redox electrolyte such as hydroquinone-quinone. Of these, a halogen redox electrolyte is preferable. Examples of a halogen molecule used in a halogen redox electrolyte comprising a halogen compound-halogen molecules include an iodine molecule and a bromine molecule. Of these, an iodine molecule is preferable. Examples of a halogen compound having a halogen ion as a counterion include halogenated metal salts such as LiBr, NaBr, KBr, LiI, NaI, KI, CsI, $CaI_2$, $MgI_2$ or CuI, and organic quaternary ammonium salts of halogen, such as tetraalkylammonium iodide, imidazolium iodide or pyridinium iodide. Of these, salts having an iodine ion as a counterion are preferable. Moreover, other than the aforementioned iodine ion, an electrolyte having an imide ion such as a bis(trifluoromethanesulfonyl)imide ion or a dicyanoimide ion as a counterion is preferably used.

When a redox electrolyte is prepared in the form of a solution containing the same, an electrochemically inactive solvent is used as a solvent. Examples of the solvent include acetonitrile, propylene carbonate, ethylene carbonate, 3-methoxypropionitrile, methoxyacetonitrile, ethylene glycol, propylene glycol, diethylene glycol, triethylene glycol, γ-butyrolactone, dimethoxyethane, diethyl carbonate, diethyl ether, diethyl carbonate, dimethyl carbonate, 1,2-dimethoxyethane, dimethylformamide, dimethyl sulfoxide, 1,3-dioxolane, methyl formate, 2-methyltetrahydrofuran, 3-methyloxazolidin-2-one, sulfolane, tetrahydrofuran, and water. Of these, acetonitrile, propylene carbonate, ethylene carbonate, 3-methoxypropionitrile, methoxyacetonitrile, ethylene glycol, 3-methyl-oxazolidin-2-one, and γ-butyrolactone are particularly preferable. These solvents may be used singly or in combination of two or more types. In the case of a gel-state electrolyte, a product obtained by adding an electrolyte or an electrolyte solution to a matrix such as an oligomer or a polymer, a product obtained by adding an electrolyte or an electrolyte solution to the low molecular weight gellant described in Non-Patent Document 3, or the like can be used. The concentration of such a redox electrolyte is generally between 0.01% and 99% by weight, and preferably approximately between 0.1% and 90% by weight.

The solar cell of the present invention can be obtained by disposing a counter electrode besides the electrode of a photoelectric conversion device produced by supporting the methine dye represented by Formula (1) of the present invention on a thin film of oxide semiconductor fine particles provided on a substrate, and then filling a solution comprising a redox electrolyte therebetween.

EXAMPLES

The present invention will be described more in detail below based on the following examples. However, these examples are not intended to limit the scope of the present invention. The term "part" is used in the examples to mean "part by mass," unless otherwise specified. The symbol "M" is used to mean the concentration of a solution, and it indicates mol/L. In addition, compound numbers used herein correspond to those used in the aforementioned specific examples. Moreover, the maximum absorption wavelength was measured using UV-VIS RECORDING SPECTROPHOTOMETER (UV-2500PC, manufactured by Shimadzu Corporation), a nuclear magnetic resonance was measured using Gemini 300 (manufactured by Varian), and a mass spectrum was measured using LIQUID CHROMATOGRAPH MASS SPECTROMETER (LCMS-2010EV, manufactured by Shimadzu Corporation).

Synthesis Example 1

56.8 parts of fluorene, 200 parts of methanol, 37 parts of 63% sulfuric acid aqueous solution, 31 parts of iodine, and 34 parts of 34% iodic acid aqueous solution were stirred at 60° C. for 5 hours. After completion of the stirring, the resultant was filtrated, and it was then washed with 100 parts of water twice. Thereafter, the resultant was dried at 70° C. overnight. After completion of the drying, the resultant was recrystallized in methanol to obtain 60 parts of 2-iodofluorene in the form of white powders.

Synthesis Example 2

20 parts of 2-iodofluorene was dissolved in a mixed solution of 114 parts of dimethyl sulfoxide (DMSO) and 23 parts of tetrahydrofuran (THF), and the thus obtained mixture was then stirred at 25° C. for 10 minutes. Thereafter, while stirring, 8.6 parts of potassium-tert-butoxide was added to the mixture. Twenty minutes later, 14.6 parts of butyl iodide was added to the mixture, and further twenty minutes later, 8.6 parts of potassium-tert-butoxide was added thereto. Further, twenty minutes later, 14.6 parts of butyl iodide was added thereto, and the obtained mixture was then stirred at 25° C. for 2 hours. After completion of the stirring, THF was distilled away from the reaction solution, and it was then extracted with toluene-water. The toluene phase was dried over magnesium sulfate, and toluene was then distilled away, thereby obtaining a brown tarry solid. This brown tarry solid was separated and purified by column chromatography (hexane-ethyl acetate) to obtain 25 parts of 9,9-dibutyl-2-iodofluorene in the form of a colorless crystal.

Synthesis Example 3

40 parts of 9,9-dibutyl-2-iodofluorene, 3.7 parts of aniline, 30 parts of potassium carbonate, 6 parts of copper powders (200 meshes), and 0.87 parts of 18-crown-6 were dissolved in 50 parts of dimethylformamide (DMF), and the obtained solution was reacted in a nitrogen atmosphere at 160° C. for 24 hours. After completion of the reaction, the reaction product was filtrated, and the filtrate was then extracted with ethyl acetate-water. The ethyl acetate phase was dried over magnesium sulfate, and the ethyl acetate was then distilled away, thereby obtaining a brown tarry substance. This brown tarry substance was separated and purified by column chromatography (hexane-ethyl acetate) to obtain 15 parts of 9,9-dibutyl-N-(9,9-dibutylfluorenyl)-N-phenylfluorenamine (the following Compound (344)) in the form of a colorless crystal.

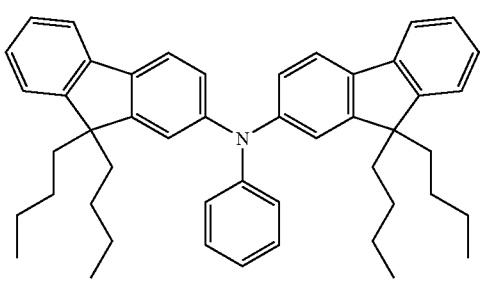

(344)

Synthesis Example 4

20 parts of dimethylformamide (DMF) was cooled to 5° C., and 0.3 parts of phosphorus oxychloride was gradually added thereto, while keeping the temperature at 6° C. or lower. After completion of the addition, while keeping the temperature of the reaction solution at 25° C., it was stirred for 1 hour. Thereafter, 1 part of 9,9-dibutyl-N-(9,9-dibutylfluorenyl)-N-phenylfluorenamine (the aforementioned Compound (344)) was added to the reaction solution, and the mixed solution was then stirred at 25° C. for 2 hours. Thereafter, the reaction solution was stirred at 60° C. for 1 hour. After completion of the reaction, 200 parts of water was added to the reaction solution, and a 5% sodium hydroxide aqueous solution was further added thereto, so that the pH became 12 or greater. The precipitated crystals were filtrated, and were then washed with 10 parts of water, followed by drying at 70° C. overnight. Thereafter, the resultant was separated and purified by column chromatography (hexane-ethyl acetate) to obtain 0.8 parts of the following Compound (345) in the form of a yellow crystal.

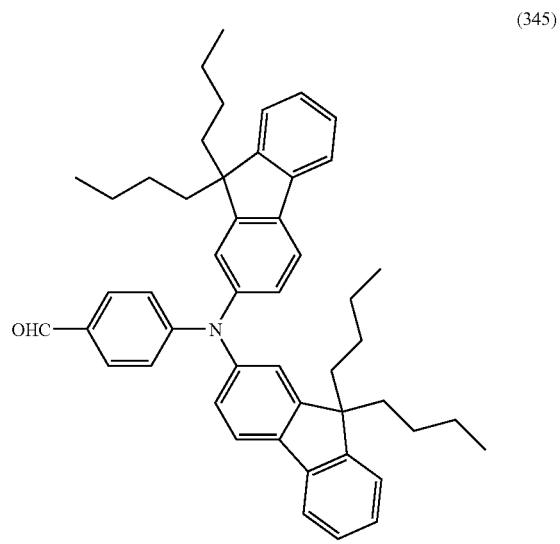 [SMILES: CCCCC1(CCCC)c2ccccc2-c2ccc(N(c3ccc(C=O)cc3)c3ccc4c(c3)C(CCCC)(CCCC)c3ccccc3-4)cc21]

(345)

Synthesis Example 5

5 parts of 9,9-dibutyl-N-(9,9-dibutylfluorenyl)-N-phenylfluorenamine (the aforementioned Compound (344)) and 3 parts of benzyltrimethylammonium dichloroiodate were dissolved in a mixed solution of 36 parts of methanol and 77 parts of chloroform. While stirring, 1 part of calcium carbonate was added to the solution, and the obtained mixture was then stirred at 25° C. for 2 hours. After completion of the stirring, the reaction solution was extracted with 5% sodium thiosulfate aqueous solution-chloroform. The chloroform phase was dried over magnesium sulfate, and the chloroform was then distilled away, thereby obtaining a yellow-black tarry substance. This yellow-black tarry solid was separated by column chromatography (hexane) and was then recrystallized in hexane-ethanol to obtain 6 parts of 9,9-dibutyl-N-(9,9-dibutylfluorenyl)-N-(4-iodophenyl)fluoren-2-amine (the following Compound (346)) in the form of a colorless crystal.

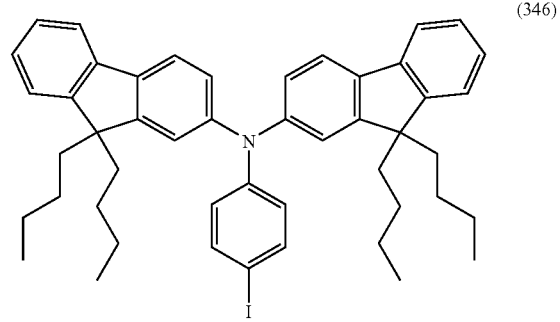 [SMILES: CCCCC1(CCCC)c2ccccc2-c2ccc(N(c3ccc(I)cc3)c3ccc4c(c3)C(CCCC)(CCCC)c3ccccc3-4)cc21]

(346)

Synthesis Example 6

1 part of 9,9-dibutyl-N-(9,9-dibutylfluorenyl)-N-(4-iodophenyl)fluoren-2-amine (the Compound (346)) and 0.2 parts of 2-thiopheneboronic acid were dissolved in 20 parts of 1,2-dimethoxyethane. Thereafter, 0.05 parts of tetrakis(triphenylphosphine)palladium (0) and 10 parts of 20% sodium carbonate aqueous solution were added to the solution, and the obtained mixture was then reacted under reflux for 3 hours. Thereafter, the reaction mixture was extracted with toluene and was then concentrated. The concentrate was purified by column chromatography (hexane) to obtain 0.68 parts of the following Compound (347) in the form of a light yellow solid.

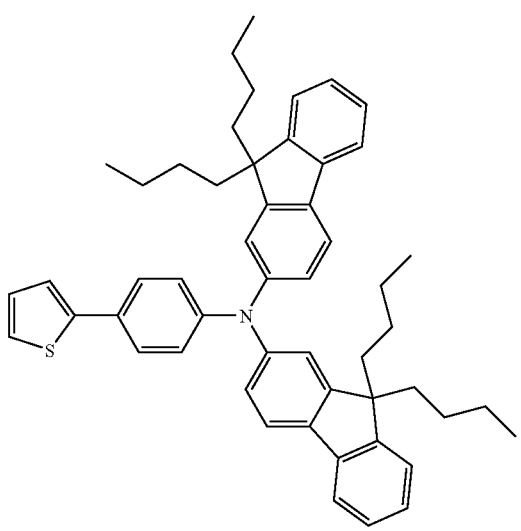

(347)

Synthesis Example 7

10 parts of dimethylformamide (DMF) was cooled to 5° C., and while keeping the temperature of the reaction solution at 6° C. or lower, 0.42 parts of phosphorus oxychloride was gradually added thereto. After completion of the addition, while keeping the temperature of the reaction solution at 25° C., it was stirred for 1 hour. Thereafter, 1 part of the aforementioned Compound (347) was added to the reaction solution, and the mixed solution was then stirred at 25° C. for 2 hours. Thereafter, the reaction solution was stirred at 60° C. for 1 hour. After completion of the reaction, the reaction solution was poured into 200 parts of water, and a 5% sodium hydroxide aqueous solution was further added thereto, so that the pH became 12 or greater. The precipitated crystals were filtrated, and were then washed with 10 parts of water, followed by drying at 70° C. overnight. Thereafter, the resultant was separated and purified by column chromatography (hexane-ethyl acetate) to obtain 0.8 parts of the following Compound (348) in the form of a yellow crystal.

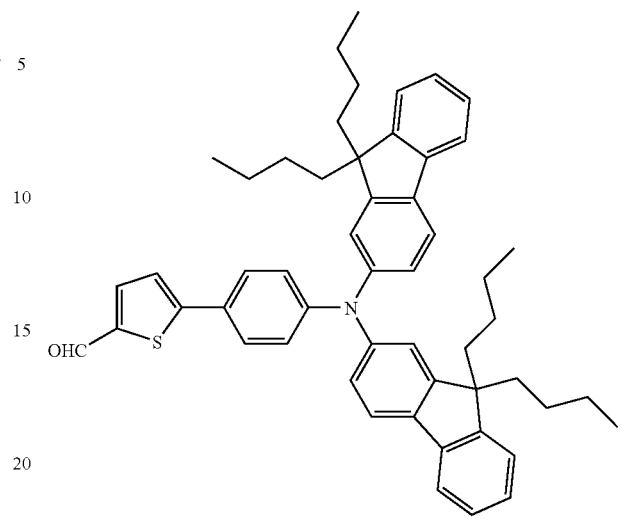

(348)

Synthesis Example 8

0.7 parts of the following Compound (349) was obtained in the form of a yellow solid by the same treatment as that in Synthesis Example 6 with the exception that 0.45 parts of 5-(4,4,5,5-tetramethyl-1,3,2-dioxaborolan-2-yl)-2,2'-bithiophene was used instead of 0.2 parts of 2-thiopheneboronic acid.

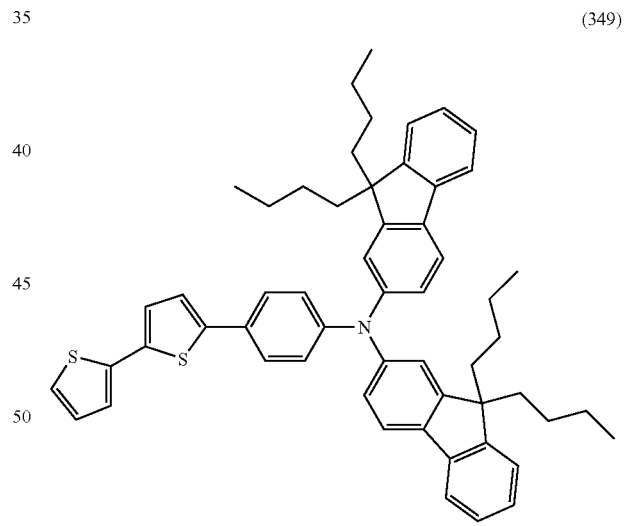

(349)

Synthesis Example 9

0.83 parts of the aforementioned Compound (349) was dissolved in 24 parts of anhydrous tetrahydrofuran (THF) in a nitrogen atmosphere, and while stirring, the solution was cooled to −60° C. Ten minutes later, 0.6 parts of n-butyllithium (1.6 M; n-hexane solution) was added to the reaction solution, and the obtained mixture was then stirred at −60° C. for 40 minutes. Thereafter, 0.5 parts of dimethylformamide was added to the reaction solution, and the mixture was then further stirred at −60° C. for 30 minutes. Thereafter, the reaction temperature was adjusted to 25° C., and the reaction solution was further stirred for 1 hour. After completion of the stirring, the reaction solution was extracted with ethyl acetate-water, and the ethyl acetate phase was then dried over magnesium sulfate. The ethyl acetate was distilled away, thereby obtaining a red tarry substance. This red tarry solid was separated and purified by column chromatography (hexane-ethyl acetate) to obtain 0.7 parts of the following Compound (350) in the form of an orange crystal.

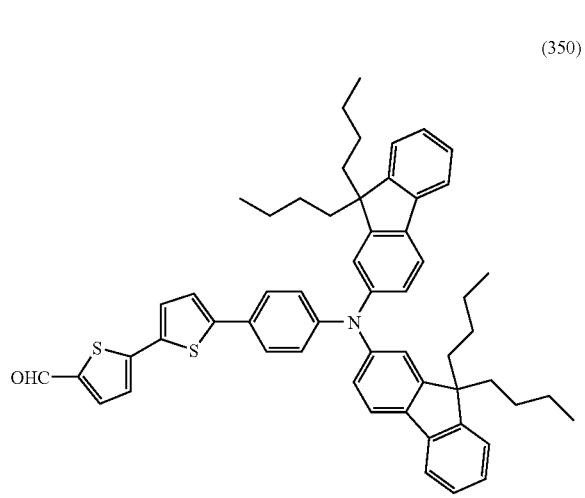 [SMILES: CCCCC1(CCCC)c2ccccc2-c2ccc(N(c3ccc(-c4ccc(-c5ccc(C=O)s5)s4)cc3)c3ccc4c(c3)C(CCCC)(CCCC)c3ccccc3-4)cc21]

(350)

Example 1

0.44 parts of the aforementioned Compound (345) and 0.15 parts of methyl cyanoacetate were dissolved in 10 parts of ethanol, and the obtained solution was then heated to reflux. Thereafter, 0.01 part of anhydrous piperidine was added thereto, and the obtained mixture was heated to reflux for 2 hours. Thereafter, the reaction solution was stirred at 25° C. for 1 hour. The obtained reaction solution was poured into 30 parts of 5% sodium hydroxide-ethanol solution, and the obtained solution was then heated to reflux for 1 hour. Thereafter, the reaction solution was poured into 200 parts of water, and while stirring, a 10% hydrochloric acid aqueous solution was added to the obtained solution until the pH of the solution became 8. The precipitated crystals were filtrated and were then washed with 10 parts of water, followed by drying at 70° C. overnight. Thereafter, the resultant was separated and purified by column chromatography (chloroform, chloroform-ethanol), and it was then further recrystallized in ethanol to obtain 0.3 parts of the aforementioned Compound (13) (please see Table 1) in the form of a yellow crystal.

With regard to this Compound (13), the following maximum absorption wavelength, value measured using a nuclear magnetic resonance device, and mass spectrum were obtained.

Maximum absorption wavelength; λmax=408 nm (1.6× $10^{-5}$ M, ethanol solution)

Measured value of nuclear magnetic resonance;
$^1$H-NMR (PPM: CDCl3): 0.65 (m. 8H), 0.70 (t. 12H), 1.08 (m. 8H), 1.91 (m. 8H), 7.08 (d. 2H), 7.14 (dd. 2H), 7.245 (d. 2H), 7.33 (m. 6H), 7.67 (d. 4H), 7.90 (d. 2H), 8.15 (s. 1H)

Mass Spectrometry; [M+1] 824.3

Example 2

0.21 parts of the aforementioned Compound (345) and 0.05 parts of the following Compound (351) were heated to reflux for 6 hours in 20 parts of ethanol. After completion of the reaction, the reaction solution was cooled to 25° C., and it was then left overnight. Thereafter, the precipitated crystals were filtrated and were then washed with 10 parts of ethanol. The resultant was separated and purified by column chromatography (chloroform, chloroform-ethanol), and it was then further recrystallized in chloroform-ethanol to obtain 0.15 parts of the aforementioned Compound (76) (please see Table 3) in the form of a black crystal.

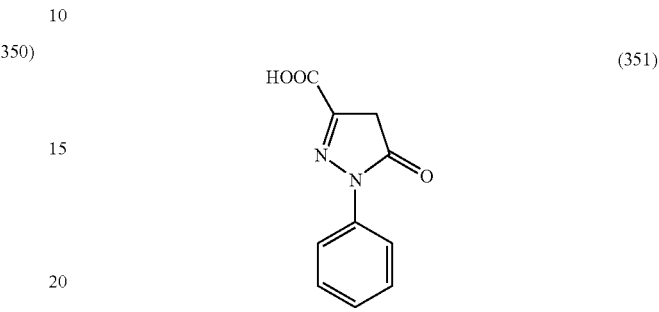

(351)

With regard to this Compound (76), the following maximum absorption wavelength, value measured using a nuclear magnetic resonance device, and mass spectrum were obtained.

Maximum absorption wavelength; λmax=512 nm (1.6× $10^{-5}$ M, THF solution)

Measured value of nuclear magnetic resonance;
$^1$H-NMR (PPM: d-DMSO): 0.55 (m. 8H), 0.64 (t. 12H), 1.01 (m. 8H), 1.87 (m. 8H), 7.03 (d. 4H), 7.19 (d. 2H), 7.29 (m. 4H), 7.43 (m. 5H), 7.59 (d. 2H), 7.67 (d. 1H), 7.73 (m. 4H), 8.09 (s. 1H)

Mass Spectrometry; [M+1] 944.9

Example 3

0.35 parts of the aforementioned Compound (152) (please see Table 6) was obtained in the form of an orange crystal by the same treatment as that in Example 1 with the exception that 1 part of the aforementioned Compound (348) was used instead of 0.44 parts of the aforementioned Compound (345) and that the amount of methyl cyanoacetate (0.15 parts) was changed to 0.27 parts.

With regard to this Compound (152), the following maximum absorption wavelength and value measured using a nuclear magnetic resonance device were obtained.

Maximum absorption wavelength; λmax=428 nm (1.6× $10^{-5}$ M, THF solution)

Measured value of nuclear magnetic resonance;
$^1$H-NMR (PPM: d-DMSO): 0.56 (m. 8H), 0.65 (t. 12H), 1.02 (m. 8H), 1.89 (m. 8H), 7.06 (m. 4H), 7.20 (d. 2H), 7.30 (m. 4H), 7.42 (m. 2H), 7.52 (d. 1H), 7.62 (d. 2H), 7.68 (d. 1H), 7.75 (m. 4H), 8.06 (s. 1H)

Example 4

0.18 parts of the aforementioned Compound (219) (please see Table 8) was obtained in the form of a black crystal by the same treatment as that in Example 2 with the exception that 0.25 parts of the aforementioned Compound (348) was used instead of 0.21 parts of the aforementioned Compound (345) and that the amount (0.05 parts) of the aforementioned Compound (351) was changed to 0.07 parts.

With regard to this Compound (219), the following maximum absorption wavelength and value measured using a nuclear magnetic resonance device were obtained.

Maximum absorption wavelength; λmax=554 nm (1.6×$10^{-5}$ M, THF solution)

Measured value of nuclear magnetic resonance;

$^1$H-NMR (PPM: d-DMSO): 0.57 (m), 0.66 (t), 1.02 (m), 1.90 (m), 3.71 (m), 6.95 (m), 7.08 (m), 7.34 (m), 7.74 (m), 7.97 (d), 8.10 (s),

Example 5

0.12 parts of the aforementioned Compound (224) (please see Table 8) was obtained in the form of a red crystal by the same treatment as that in Example 4 with the exception that the amount (0.25 parts) of the aforementioned Compound (348) was changed to 0.05 parts and that 0.01 part of rhodanine-3-acetic acid was used instead of 0.05 parts of the aforementioned Compound (351).

With regard to this Compound (224), the following maximum absorption wavelength and value measured using a nuclear magnetic resonance device were obtained.

Maximum absorption wavelength; λmax=511 nm (1.6×$10^{-5}$ M, THF solution)

Measured value of nuclear magnetic resonance;

$^1$H-NMR (PPM: d-DMSO): 0.56 (m), 0.66 (t), 1.02 (m), 1.89 (m), 3.70 (m), 4.66 (s), 7.06 (m), 7.21 (s), 7.30 (m), 7.42 (m), 7.74 (m), 8.13 (s)

Example 6

0.34 parts of the aforementioned Compound (160) (please see Table 6) was obtained in the form of a brown crystal by the same treatment as that in Example 1 with the exception that 0.4 parts of the aforementioned Compound (350) was used instead of 0.44 parts of the aforementioned Compound (345) and that the amount of methyl cyanoacetate (0.15 parts) was changed to 0.14 parts and the amount of ethanol (20 parts) was changed to 30 parts.

With regard to this Compound (160), the following maximum absorption wavelength and value measured using a nuclear magnetic resonance device were obtained.

Maximum absorption wavelength; λmax=467 nm (1.6×$10^{-5}$ M, THF solution)

Measured value of nuclear magnetic resonance;

$^1$H-NMR (PPM: d-DMSO): 0.55 (m. 8H), 0.64 (t. 12H), 1.01 (m. 8H), 1.87 (m. 8H), 7.03 (d. 4H), 7.19 (d. 2H), 7.29 (m. 4H), 7.43 (m. 5H), 7.59 (d. 2H), 7.67 (d. 1H), 7.73 (m. 4H), 8.09 (s. 1H)

Example 7

0.14 parts of the aforementioned Compound (269) (please see Table 9) was obtained in the form of a black crystal by the same treatment as that in Example 2 with the exception that 0.2 parts of the aforementioned Compound (350) was used instead of 0.21 parts of the aforementioned Compound (345) and that the amount (0.05 parts) of the aforementioned Compound (351) was changed to 0.04 parts.

With regard to this Compound (269), the following maximum absorption wavelength and value measured using a nuclear magnetic resonance device were obtained.

Maximum absorption wavelength; λmax=556 nm (1.6×$10^{-5}$ M, THF solution)

Measured value of nuclear magnetic resonance;

$^1$H-NMR (PPM: CDCl3): 0.68 (m. 8H), 0.72 (t. 12H), 1.10 (m. 8H), 1.90 (m. 8H), 7.09 (dd. 2H), 7.156 (d. 2H), 7.22 (d. 2H), 7.31 (m. 10H), 7.41 (d. 1H), 7.48 (m. 3H), 7.55 (d. 1H), 7.61 (d. 2H), 7.65 (d. 2H), 7.96 (d. 2H), 8.87 (s. 1H)

Examples 8-21 and Comparative Examples 1-5

In order that the methine dye of the present invention having each of the compound numbers as shown in Table 11 has a concentration of 3.2×$10^{-4}$ M, the compounds of Examples 8-13, the compound of Comparative Example 1 (wherein the below-mentioned compound A was used), the compound of Comparative Example 2 (wherein the below-mentioned compound B was used), the compound of Comparative Example 4 (wherein the below-mentioned compound D was used), and the compound of Comparative Example 5 (wherein the below-mentioned compound E was used) were dissolved in ethanol. The compounds of Examples 14-21 and the compound of Comparative Example 3 (wherein the below-mentioned compound C was used) were dissolved in tetrahydrofuran. A porous substrate (a thin film of semiconductor formed by calcining porous titanium oxide at 450° C. for 30 minutes on a transparent conductive glass electrode) was immersed at a room temperature (20° C.) for 12 hours in each of the thus obtained solutions, so that each dye was supported on the substrate. Thereafter, the substrates of Examples 8-13 and Comparative Examples 1, 2, 4, and 5 were washed with ethanol, and the substrates of Examples 14-21 and Comparative Example 3 were washed with tetrahydrofuran. The substrates were then dried to obtain the photoelectric conversion devices of the present invention comprising thin films of semiconductor fine particles sensitized with dyes. In Examples 20 and 21, a tetrahydrofuran solution was prepared, using each of two types of dyes such that the concentration thereof became 1.6×$10^{-4}$ M, and each of the two types of dyes was supported on a substrate to obtain a photoelectric conversion device. On the other hand, in Examples 10, 11, 13 and 18-21, and Comparative Examples 1, 3 and 5, approximately 1 cc of 0.2 M titanium tetrachloride aqueous solution was added dropwise to a titanium oxide thin film portion of a semiconductor thin film electrode, and the electrode was then left at rest at room temperature (20° C.) for 24 hours. Thereafter, it was washed with water and was then calcined again at 450° C. for 30 minutes to obtain a titanium tetrachloride-treated semiconductor thin film electrode. Thereafter, a dye was supported on the obtained titanium tetrachloride-treated semiconductor thin film electrode in the same above manner. Moreover, in Examples 9, 11 and 15-21, and Comparative Examples 1-5, cholic acid represented by the Formula (352) as shown below was added as a clathrate compound, resulting in a concentration of 3×$10^{-2}$ M, when a dye was supported on a semiconductor thin film to prepare a dye solution. Thereafter, the dye was supported on the semiconductor thin film, thereby obtaining a thin film of cholic acid-treated dye-sensitized semiconductor fine particles. On a substrate on which the thus obtained thin film of cholic acid-treated dye-sensitized semiconductor fine particles had been established, a thin film of semiconductor fine particles and a platinum sputtered face of a conductive glass were disposed with a space of 20 μm. A solution (an electrolyte solution) comprising an electrolyte was poured into the space to fill the space with the electrolyte. As such an electrolyte solution, an electrolyte solution formed by dissolving iodine/lithium iodide/1,2-dimethyl-3-n-propylimidazolium iodide/t-butylpyridine in 3-methoxypropionitrile, resulting in a concentration of 0.1 M/0.1 M/0.6 M/1 M, was used.

With regard to the size of a cell to be measured, an effective portion thereof was set at 0.25 cm². A 500-W xenon lamp was used as a light source, and it was passed through an AM (atmospheric path air mass) 1.5 filter, resulting in 100 mW/cm². A short circuit current, an open circuit voltage, and conversion efficiency were measured using a solar simulator WXS-155S-10, AM1.5G (manufactured by Wacom Electric Co., Ltd.).

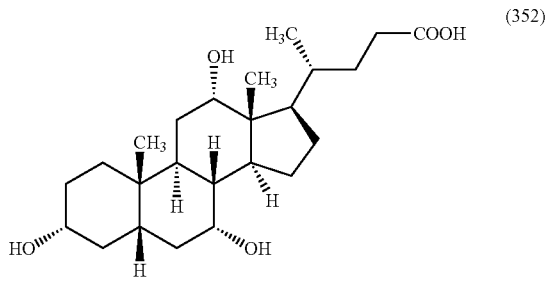

(352)

In addition, the compound described in International Publication WO2002/011213 was defined as compound No. A (compound No. 7 in the patent publication). The compounds described in International Patent Application PCT/JP2004/003203 were defined as compound No. B (compound No. 205 in the patent publication), compound No. C (compound No. 246 in the patent publication), compound No. D (compound No. 276 in the patent publication, and compound No. E (compound No. 513 in the patent publication)). These compounds were evaluated and compared.

TABLE 11

Evaluation results

| Example | Compound No. | Short circuit current (mA/cm²) | Open circuit voltage (V) | Conversion efficiency (%) | Presence or absence of $TiCl_4$ treatment on thin film | Presence or absence of cholic acid during adsorption |
|---|---|---|---|---|---|---|
| Example 8 | 13 | 9.5 | 0.77 | 5.0 | No | No |
| Example 9 | 13 | 10.1 | 0.76 | 5.3 | No | Yes |
| Example 10 | 13 | 10.4 | 0.77 | 5.4 | Yes | No |
| Example 11 | 13 | 11.1 | 0.77 | 5.8 | Yes | Yes |
| Example 12 | 76 | 9.2 | 0.69 | 4.4 | No | No |
| Example 13 | 76 | 11.5 | 0.69 | 5.6 | Yes | No |
| Example 14 | 152 | 10.5 | 0.75 | 5.4 | No | No |
| Example 15 | 152 | 13.8 | 0.72 | 6.6 | No | Yes |
| Example 16 | 219 | 15.1 | 0.69 | 6.9 | No | Yes |
| Example 17 | 224 | 11.6 | 0.64 | 5.0 | No | Yes |
| Example 18 | 160 | 14.2 | 0.65 | 6.3 | Yes | Yes |
| Example 19 | 269 | 14.7 | 0.66 | 6.9 | Yes | Yes |
| Example 20 | 152 + 160 | 14.7 | 0.65 | 6.8 | Yes | Yes |
| Example 21 | 219 + 269 | 15.4 | 0.66 | 7.0 | Yes | Yes |
| Comparative Example 1 | A | 9.8 | 0.76 | 4.9 | Yes | Yes |
| Comparative Example 2 | B | 11.7 | 0.69 | 5.5 | No | Yes |
| Comparative Example 3 | C | 13.9 | 0.65 | 6.1 | Yes | Yes |
| Comparative Example 4 | D | 14.6 | 0.68 | 6.7 | No | Yes |
| Comparative Example 5 | E | 11.4 | 0.78 | 5.5 | Yes | Yes |

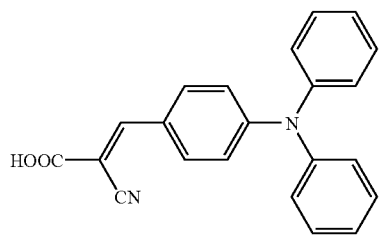

(A)

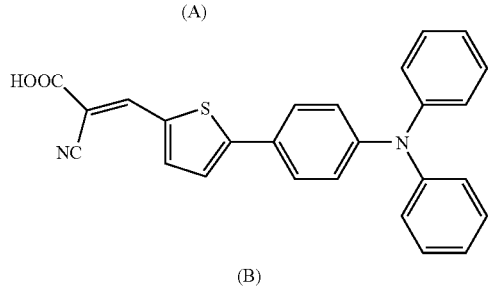

(B)

TABLE 11-continued

Evaluation results

| Example | Compound No. | Short circuit current (mA/cm$^2$) | Open circuit voltage (V) | Conversion efficiency (%) | Presence or absence of TiCl$_4$ treatment on thin film | Presence or absence of cholic acid during adsorption |
|---|---|---|---|---|---|---|

(C)

(D)

(E)

From the results as shown in Table 11, it is found that, using a photoelectric conversion device sensitized with the methine dye represented by Formula (1) of the present invention, visible light can effectively be converted to electricity. In addition, it was confirmed that conversion efficiency was further enhanced when multiple methine dyes of the present invention were mixed and used.

Specifically, Example 11 (compound 13: a compound wherein, in the aforementioned Formula (1), n is 0, m is 0, $R_1$ to $R_4$ each are n-butyl, $A_1$ is hydrogen, either X or Y is carboxyl, and the other is cyano) was compared with Comparative Example 1 (compound A), on both thin films of which the treatment with titanium tetrachloride had been performed and on which cholic acid had been used during adsorption, under the same conditions. As a result, in the case of Example 11, a short circuit current was 11.1 mA/cm$^2$, an open circuit voltage was 0.77 V, and conversion efficiency was 5.8%. On the other hand, in the case of Comparative Example 1, a short circuit current was 9.8 mA/cm$^2$, an open circuit voltage was 0.76 V, and conversion efficiency was 4.9%. Thus, Example 11 and Comparative Example 1 had almost the same open circuit voltage, but the improvement in the performance of Example 1 as a cell was observed in terms of 13% or greater in the short circuit current and, surprisingly, 18% or greater in the conversion efficiency.

In addition, Example 15 (compound 152: a compound wherein, in the aforementioned Formula (1), n is 0, m is 1, $R_1$ to $R_4$ each are n-butyl, $A_1$, $A_4$ and $A_5$ each are a hydrogen atom, either X or Y is carboxyl, and the other is cyano) was compared with Comparative Example 2 (compound B), on both thin films of which the treatment with titanium tetrachloride had not been performed and on which cholic acid had been used during adsorption, under the same conditions. As a result, in the case of Example 15, a short circuit current was 13.8 mA/cm², an open circuit voltage was 0.72 V, and conversion efficiency was 6.6%. On the other hand, in the case of Comparative Example 2, a short circuit current was 11.7 mA/cm², an open circuit voltage was 0.69 V, and conversion efficiency was 5.5%. Thus, the improvement in the performance of Example 15 as a cell was observed in terms of 17% or greater in the short circuit current, 4% or greater in the open circuit voltage, and surprisingly, 20% or greater in the conversion efficiency.

Moreover, Example 18 (compound 160: a compound wherein, in the aforementioned Formula (1), n is 0, m is 2, $R_1$ to $R_4$ each are n-butyl, $A_1$, $A_4$'s and $A_5$'s each are a hydrogen atom, either X or Y is carboxyl, and the other is cyano) was compared with Comparative Example 3 (compound C), on both thin films of which the treatment with titanium tetrachloride had been performed and on which cholic acid had been used during adsorption, under the same conditions. As a result, in the case of Example 18, a short circuit current was 14.2 mA/cm², an open circuit voltage was 0.65 V, and conversion efficiency was 6.3%. On the other hand, in the case of Comparative Example 3, a short circuit current was 13.9 mA/cm², an open circuit voltage was 0.65 V, and conversion efficiency was 6.1%. Thus, Example 18 and Comparative Example 3 had almost the same open circuit voltage, but the improvement in the performance of Example 18 as a cell was observed in terms of 2% or greater in the short circuit current and 3% or greater in the conversion efficiency.

Furthermore, Example 16 (compound 219: a compound wherein, in the aforementioned Formula (1), n is 0, m is 1, $R_1$ to $R_4$ each are n-butyl, $A_1$, $A_4$ and $A_5$ each are a hydrogen atom, and a ring formed between X and Y is the compound represented by the above Formula (2007)) was compared with Comparative Example 4 (compound D), on both thin films of which the treatment with titanium tetrachloride had not been performed and on which cholic acid had been used during adsorption, under the same conditions. As a result, in the case of Example 16, a short circuit current was 15.1 mA/cm², an open circuit voltage was 0.69 V, and conversion efficiency was 6.9%. On the other hand, in the case of Comparative Example 4, a short circuit current was 14.6 mA/cm², an open circuit voltage was 0.68 V, and conversion efficiency was 6.7%. Thus, Example 16 and Comparative Example 4 had almost the same open circuit voltage, but the improvement in the performance of Example 16 as a cell was observed in terms of 3% or greater in the short circuit current and approximately 3% in the conversion efficiency.

Synthesis Example 10

20 parts of 2-iodofluorene was dissolved in a mixed solution of 114 parts of dimethyl sulfoxide (DMSO) and 23 parts of tetrahydrofuran (THF), and the thus obtained mixture was then stirred at 25° C. for 10 minutes. Thereafter, while stirring, 8.7 parts of potassium-tert-butoxide was added to the mixture. Twenty minutes later, 19.2 parts of n-octyl iodide was added to the mixture, and further twenty minutes later, 8.7 parts of potassium-tert-butoxide was added thereto. Further, twenty minutes later, 19.2 parts of n-octyl iodide was added thereto, and the obtained mixture was then stirred at 25° C. for 2 hours. After completion of the stirring, THF was distilled away from the reaction solution, and it was then extracted with toluene-water. The toluene phase was dried over magnesium sulfate, and the toluene was then distilled away, thereby obtaining a brown tarry solid. This brown tarry solid was separated and purified by column chromatography (hexane-ethyl acetate) to obtain 30 parts of 9,9-di-n-octyl-2-iodofluorene in the form of a colorless crystal.

Synthesis Example 11

20 parts of 9,9-di-n-octyl-2-iodofluorene, 1.2 parts of aniline, 10 parts of potassium carbonate, 2 parts of copper powders (200 meshes), and 0.3 parts of 18-crown-6 were dissolved in 60 parts of dimethylformamide (DMF), and the obtained solution was reacted in a nitrogen atmosphere at 160° C. for 24 hours. After completion of the reaction, the reaction product was filtrated, and the filtrate was then extracted with ethyl acetate-water. The ethyl acetate phase was dried over magnesium sulfate, and the ethyl acetate was then distilled away, thereby obtaining a brown tarry substance. This brown tarry substance was separated and purified by column chromatography (hexane-ethyl acetate) to obtain 7.5 parts of 9,9-di-n-octyl-N-(9,9-di-n-octylfluorenyl)-N-phenylfluorenamine (the following Compound (353)) in the form of a colorless crystal.

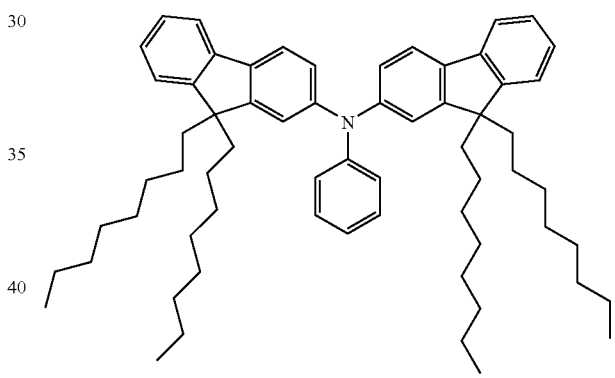

(353)

Synthesis Example 12

2.4 parts of 9,9-di-n-octyl-N-(9,9-di-n-octylfluorenyl)-N-phenylfluorenamine (the aforementioned Compound (353)) and 1.1 parts of benzyltrimethylammonium dichloroiodate were dissolved in a mixed solution of 10 parts of methanol and 30 parts of chloroform. While stirring, 0.4 parts of calcium carbonate was added to the solution. The obtained mixture was then stirred at 25° C. for 2 hours, and it was then stirred under heating at 70° C. for 1 hour. After completion of the reaction, the reaction solution was extracted with 5% sodium thiosulfate aqueous solution-chloroform. The chloroform phase was dried over magnesium sulfate, and the chloroform was then distilled away, thereby obtaining a yellow-black tarry substance. This yellow-black tarry solid was separated by column chromatography (hexane) and was then recrystallized in hexane-ethanol to obtain 2.6 parts of the following Compound (354) in the form of a colorless crystal.

(354)

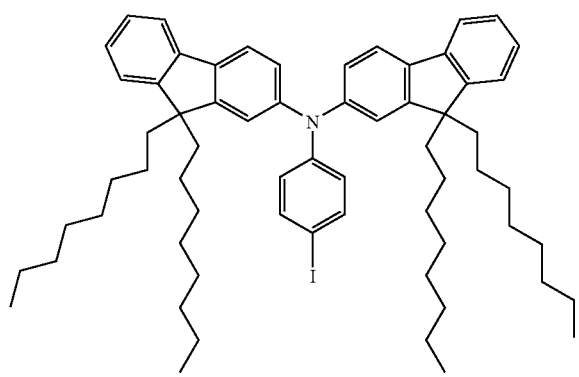

Synthesis Example 13

1.2 parts of the following Compound (355) was obtained in the form of a light yellow crystal by the same treatment as that in Synthesis Example 6 with the exception that 1.3 parts of the aforementioned Compound (354) was used instead of 1 part of 9,9-dibutyl-N-(9,9-dibutylfluorenyl)-N-(4-iodophenyl)fluoren-2-amine (Compound (346)).

(355)

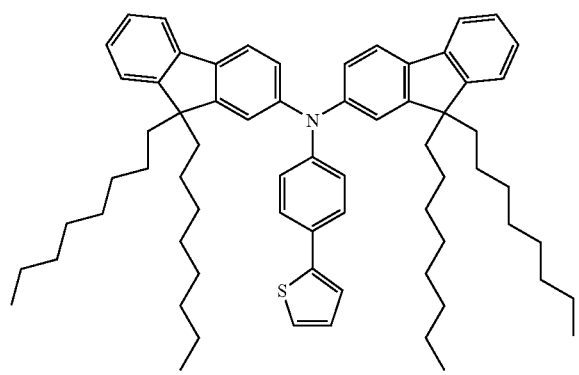

Synthesis Example 14

1.2 parts of the following Compound (356) was obtained in the form of a yellow crystal by the same treatment as that in Synthesis Example 7 with the exception that 1.2 parts of the aforementioned Compound (355) was used instead of 1 part of the aforementioned Compound (347).

(356)

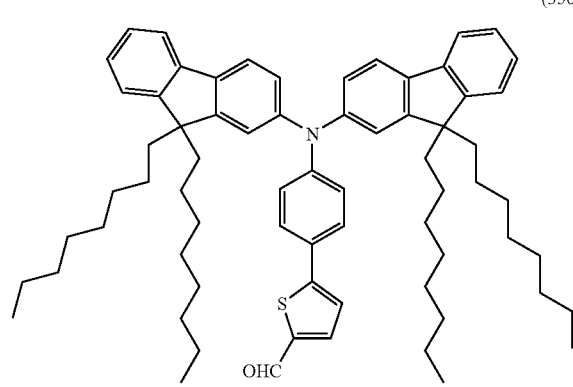

Example 22

0.2 parts of the above Compound (3015) was obtained in the form of a black violet crystal by the same treatment as that in Example 2 with the exception that 0.24 parts of the aforementioned Compound (356) was used instead of 0.21 parts of the aforementioned Compound (345).

The maximum absorption wavelength of this Compound (3015) is as follows.

Maximum absorption wavelength; λmax=532 nm ($1.6 \times 10^{-5}$ M, THF solution)

Synthesis Example 15

20 parts of 2-iodofluorene was dissolved in a mixed solution of 114 parts of dimethyl sulfoxide (DMSO) and 23 parts of tetrahydrofuran (THF), and the thus obtained mixture was then stirred at 25° C. for 10 minutes. Thereafter, while stirring, 8.7 parts of potassium-tert-butoxide was added to the mixture. Twenty minutes later, 13.2 parts of methyl iodide was added to the mixture, and further twenty minutes later, 8.7 parts of potassium-tert-butoxide was added thereto. Further, twenty minutes later, 13.2 parts of methyl iodide was added thereto, and the obtained mixture was then stirred at 25° C. for 2 hours. After completion of the stirring, the THF was distilled away from the reaction solution, and it was then extracted with toluene-water. The toluene phase was dried over magnesium sulfate, and the toluene was then distilled away, thereby obtaining a brown tarry solid. This brown tarry solid was separated and purified by column chromatography (hexane-ethyl acetate) to obtain 21 parts of 9,9-dimethyl-2-iodofluorene in the form of a colorless crystal.

Synthesis Example 16

20 parts of 9,9-dimethyl-2-iodofluorene, 2.3 parts of aniline, 19 parts of potassium carbonate, 3.8 parts of copper powders (200 meshes), and 0.57 parts of 18-crown-6 were dissolved in 100 parts of dimethylformamide (DMF), and the obtained solution was reacted in a nitrogen atmosphere at 160° C. for 24 hours. After completion of the reaction, the reaction product was filtrated, and the filtrate was then extracted with ethyl acetate-water. The ethyl acetate phase was dried over magnesium sulfate, and the ethyl acetate was then distilled away, thereby obtaining a brown tarry substance. This brown tarry substance was separated and purified by column chromatography (hexane-ethyl acetate) to obtain 9.4 parts of 9,9-dimethyl-N-(9,9-dimethylfluorenyl)-N-phenylfluorenamine (the following Compound (357)) in the form of a colorless crystal.

(357)

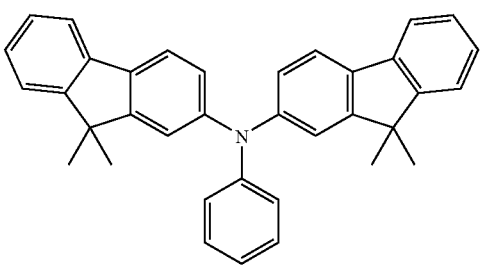

Synthesis Example 17

4.6 parts of 9,9-dimethyl-N-(9,9-dimethylfluorenyl)-N-phenylfluorenamine (the aforementioned Compound (357))

and 5 parts of benzyltrimethylammonium dichloroiodate were dissolved in a mixed solution of 30 parts of methanol and 70 parts of chloroform. While stirring, 1.8 parts of calcium carbonate was added to the solution. The obtained mixture was then stirred at 25° C. for 2 hours, and it was then stirred under heating at 50° C. for 1 hour. After completion of the reaction, the reaction solution was extracted with 5% sodium thiosulfate aqueous solution-chloroform. The chloroform phase was dried over magnesium sulfate, and the chloroform was then distilled away, thereby obtaining a yellow-black tarry substance. This yellow-black tarry solid was separated by column chromatography (hexane) and was then recrystallized in hexane-ethanol to obtain 5.1 parts of the following Compound (358) in the form of a colorless crystal.

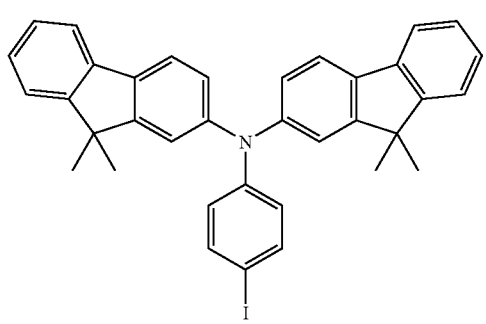

(358)

Synthesis Example 18

0.68 parts of the following Compound (359) was obtained in the form of a light yellow crystal by the same treatment as that in Synthesis Example 6 with the exception that 1.0 part of the aforementioned Compound (358) was used instead of 1 part of 9,9-dibutyl-N-(9,9-dibutylfluorenyl)-N-(4-iodophenyl)fluoren-2-amine (Compound (346)).

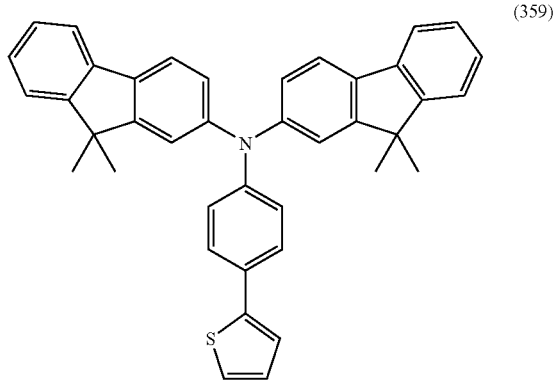 [SMILES: CC1(C)c2ccccc2-c2ccc(N(c3ccc(-c4cccs4)cc3)c3ccc4c(c3)C(C)(C)c3ccccc3-4)cc21]

(359)

Synthesis Example 19

0.61 parts of the following Compound (360) was obtained in the form of a yellow crystal by the same treatment as that in Synthesis Example 7 with the exception that 0.77 parts of the aforementioned Compound (359) was used instead of 1 part of the aforementioned Compound (347).

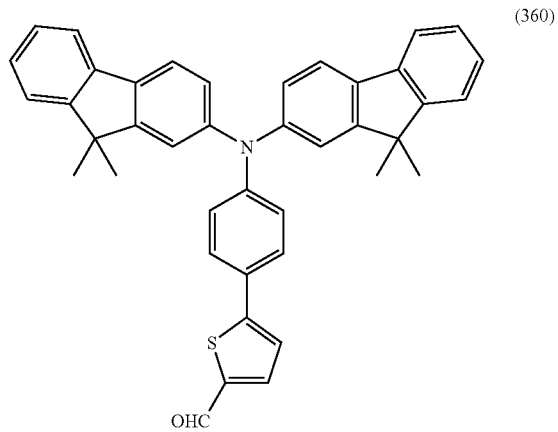 [SMILES: CC1(C)c2ccccc2-c2ccc(N(c3ccc(-c4ccc(C=O)s4)cc3)c3ccc4c(c3)C(C)(C)c3ccccc3-4)cc21]

(360)

Example 23

0.14 parts of the aforementioned Compound (3013) was obtained in the form of a black violet crystal by the same treatment as that in Example 2 with the exception that 0.16 parts of the aforementioned Compound (360) was used instead of 0.21 parts of the aforementioned Compound (345).

With regard to this Compound (3013), the following maximum absorption wavelength, value measured using a nuclear magnetic resonance device, and mass spectrum were obtained.

Maximum absorption wavelength; λmax=548 nm (1.6× $10^{-5}$ M, THF solution)

Measured value of nuclear magnetic resonance;

$^1$H-NMR (PPM: d-DMSO): 1.39 (s), 7.11 (m), 7.27 (m), 7.45 (t), 7.52 (d), 7.71 (d), 7.79 (m), 7.96 (d), 8.13 (d), 9.03 (s)

Mass Spectrometry; [M+1] 774.9

Example 24

0.14 parts of the aforementioned Compound (3016) was obtained in the form of a black crystal by the same treatment as that in Example 7 with the exception that 0.03 parts of barbituric acid was used instead of 0.05 parts of the aforementioned Compound (351).

With regard to this Compound (3016), the following maximum absorption wavelength and value measured using a nuclear magnetic resonance device were obtained.

Maximum absorption wavelength; λmax=518 nm (1.6× $10^{-5}$ M, THF solution)

Measured value of nuclear magnetic resonance;

$^1$H-NMR (PPM: d-DMSO): 0.56 (m), 0.66 (t), 1.89 (m), 7.05 (m), 7.20 (s), 7.31 (m), 7.42 (d), 7.53 (d), 7.64 (m), 7.69 (d), 7.76 (m), 8.15 (d), 8.47 (s)

Example 25

0.12 parts of the aforementioned Compound (3017) was obtained in the form of a black crystal by the same treatment as that in Example 24 with the exception that 0.047 parts of rhodanine-3-acetic acid was used instead of 0.03 parts of barbituric acid.

With regard to this Compound (3017), the following maximum absorption wavelength and value measured using a nuclear magnetic resonance device were obtained.

Maximum absorption wavelength; λmax=506 nm (1.6× $10^{-5}$ M, THF solution)

Measured value of nuclear magnetic resonance;
$^1$H-NMR (PPM: d-DMSO): 0.56 (m), 0.65 (t), 1.88 (m), 4.36 (s), 7.04 (m), 7.20 (s), 7.29 (m), 7.41 (d), 7.46 (d), 7.52 (d), 7.59 (m), 7.74 (m), 8.03 (s)

Example 26

0.09 parts of the aforementioned Compound (3018) was obtained in the form of a black crystal by the same treatment as that in Example 24 with the exception that 0.034 parts of the following Compound (361) was used instead of 0.03 parts of barbituric acid.

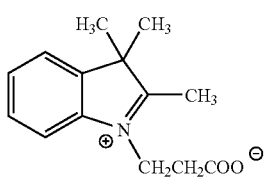
(361)

The maximum absorption wavelength of this Compound (3018) is as follows.

Maximum absorption wavelength; λmax=548 nm (1.6× $10^{-5}$ M, THF solution)

Synthesis Example 20

1 part of 9,9-dibutyl-N-(9,9-dibutylfluorenyl)-N-(4-iodophenyl)fluoren-2-amine (the Compound (346)) and 0.38 parts of 3-n-hexylthiophen-2-boronic acid ethylene glycol ester were dissolved in 6 parts of 1,2-dimethoxyethane. Thereafter, 0.04 parts of tetrakis(triphenylphosphine)palladium (0) and 3.4 parts of 20% sodium carbonate aqueous solution were added to the solution, and the obtained mixture was then reacted under reflux for 5 hours. Thereafter, the reaction mixture was extracted with toluene and was then concentrated. The concentrate was purified by column chromatography (hexane) to obtain 1 part of the following Compound (362) in the form of a light yellow solid.

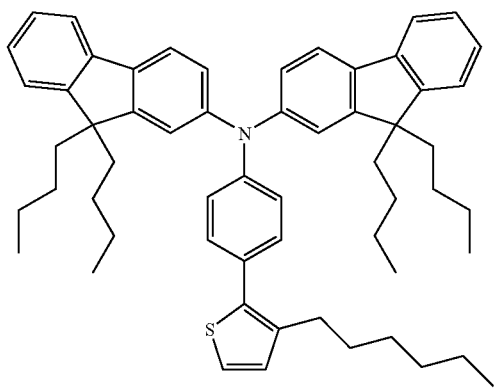
(362)

Synthesis Example 21

1.4 parts of the following Compound (363) was obtained in the form of a yellow solid by the same treatment as that in Synthesis Example 9 with the exception that 1.7 parts of the aforementioned Compound (362) was used instead of 0.83 parts of the aforementioned Compound (349).

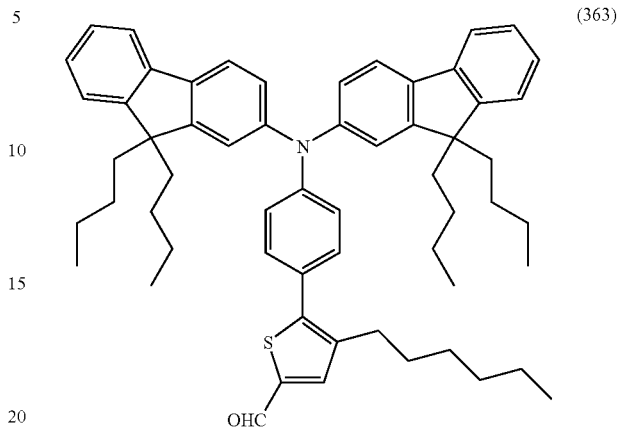
(363)

Example 27

0.3 parts of the aforementioned Compound (168) was obtained in the form of a yellow crystal by the same treatment as that in Example 1 with the exception that 0.49 parts of the aforementioned Compound (363) was used instead of 0.44 parts of the aforementioned Compound (345).

With regard to this Compound (168), the following maximum absorption wavelength and value measured using a nuclear magnetic resonance device were obtained.

Maximum absorption wavelength; λmax=426 nm (1.6× $10^{-5}$ M, ethanol solution)

Measured value of nuclear magnetic resonance;
$^1$H-NMR (PPM: d-DMSO): 0.55 (m), 0.64 (t), 0.81 (m), 1.02 (m), 1.20 (s), 1.54 (m), 1.88 (m), 7.06 (d), 7.19 (s), 7.31 (m), 7.40 (d), 7.58 (s), 7.74 (m), 8.03 (s)

Example 28

0.21 parts of the aforementioned Compound (363) and 0.05 parts of the aforementioned Compound (351) were heated to reflux for 6 hours in 20 parts of ethanol. After completion of the reaction, the reaction solution was cooled to 25° C., and it was then left overnight. Thereafter, the precipitated crystals were filtered and were then washed with 10 parts of ethanol. The resultant was separated and purified by column chromatography (chloroform, chloroform-ethanol), and it was then further recrystallized in chloroform-ethanol to obtain 0.15 parts of the aforementioned Compound (3001) in the form of a black crystal.

With regard to this Compound (3001), the following maximum absorption wavelength and value measured using a nuclear magnetic resonance device were obtained.

Maximum absorption wavelength; λmax=522 nm (1.6× $10^{-5}$ M, ethanol solution)

Measured value of nuclear magnetic resonance;
$^1$H-NMR (PPM: d-DMSO): 0.57 (m), 0.65 (t), 0.82 (s), 1.01 (m), 1.22 (s), 1.59 (m), 1.90 (m), 7.09 (d), 7.23 (m), 7.42 (d), 7.75 (m), 7.97 (m), 9.02 (s)

Example 29

0.16 parts of the aforementioned Compound (3003) was obtained in the form of a black crystal by the same treatment as that in Example 28 with the exception that 0.05 parts of rhodanine-3-acetic acid was used instead of 0.05 parts of the aforementioned Compound (351).

With regard to this Compound (3003), the following maximum absorption wavelength and value measured using a nuclear magnetic resonance device were obtained.

Maximum absorption wavelength; λmax=476 nm (1.6× $10^{-5}$ M, ethanol solution)

Measured value of nuclear magnetic resonance;
$^1$H-NMR (PPM: d-DMSO): 0.57 (m), 0.66 (t), 0.82 (m), 1.02 (m), 1.23 (m), 1.89 (m), 4.33 (s), 7.07 (m), 7.22 (s), 7.30 (m), 7.40 (m), 7.67 (s), 7.76 (m), 7.95 (s)

Synthesis Example 22

1.4 parts of the aforementioned Compound (362) was dissolved in 5 parts of chloroform. Thereafter, 5 parts of acetic acid and 0.39 parts of N-iodosuccinimide were added to the solution, and the obtained mixture was refluxed for 4 hours while the light was blocked. Thereafter, the reaction mixture was extracted with chloroform, and the chloroform phase was then dried over magnesium sulfate. Thereafter, the chloroform was distilled away. The resultant was separated and purified by column chromatography (hexane-ethyl acetate) to obtain 1.4 parts of the following Compound (364).

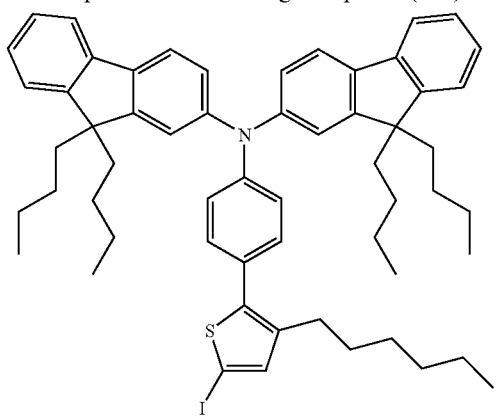

(364)

Synthesis Example 23

0.26 parts of the following Compound (365) was obtained in the form of a yellow solid by the same treatment as that in Synthesis Example 19 with the exception that 0.26 parts of the aforementioned Compound (364) was used instead of 1 part of the aforementioned Compound (346).

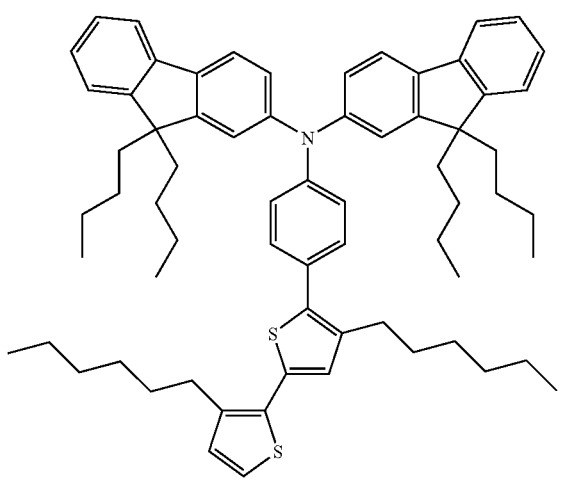

(365)

Synthesis Example 24

1.3 parts of the following Compound (366) was obtained in the form of a yellow solid by the same treatment as that in Synthesis Example 9 with the exception that 1.6 parts of the aforementioned Compound (365) was used instead of 0.83 parts of the aforementioned Compound (349).

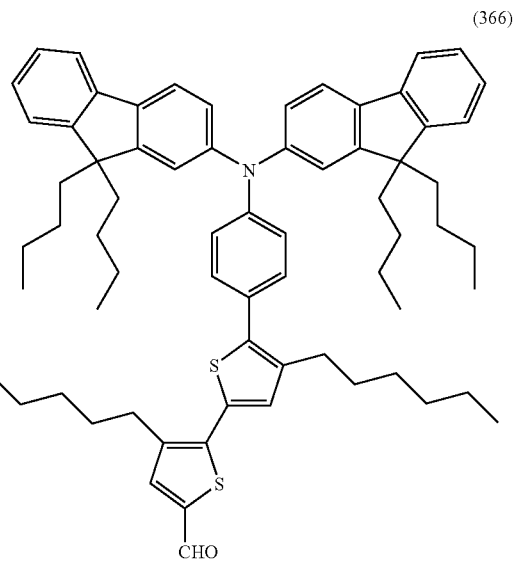

(366)

Example 30

0.4 parts of the above Compound (3004) was obtained in the form of a yellow crystal by the same treatment as that in Example 1 with the exception that 0.53 parts of the aforementioned Compound (366) was used instead of 0.44 parts of the aforementioned Compound (345).

With regard to this Compound (3004), the following maximum absorption wavelength and value measured using a nuclear magnetic resonance device were obtained.

Maximum absorption wavelength; λmax=420 nm (water: acetonitrile=1:1)

Measured value of nuclear magnetic resonance;
$^1$H-NMR (PPM: d-DMSO): 0.57 (m), 0.65 (t), 0.83 (s), 1.03 (m), 1.59 (m), 1.88 (m), 7.06 (d), 7.20 (s), 7.30 (m), 7.41 (d), 7.56 (d), 7.75 (t), 7.96 (s)

Example 31

0.21 parts of the aforementioned Compound (366) and 0.04 parts of the aforementioned Compound (351) were heated to reflux for 6 hours in 20 parts of ethanol. After completion of the reaction, the reaction solution was cooled to 25° C., and it was then left overnight. Thereafter, the precipitated crystals were filtrated and were then washed with 10 parts of ethanol. The resultant was separated and purified by column chromatography (chloroform, chloroform-ethanol), and it was then further recrystallized in chloroform-ethanol to obtain 0.15 parts of the aforementioned Compound (3002) in the form of a black crystal.

With regard to this Compound (3002), the following maximum absorption wavelength and value measured using a nuclear magnetic resonance device were obtained.

Maximum absorption wavelength; λmax=539 nm (water:acetonitrile=1:1)

Measured value of nuclear magnetic resonance;

¹H-NMR (PPM: d-DMSO): 0.56 (m), 0.66 (t), 1.04 (m), 1.26 (m), 1.63 (m), 1.89 (m), 7.07 (d), 7.21 (s), 7.36 (m), 7.75 (m), 7.95 (m), 9.00 (s)

Industrial Applicability

The photoelectric conversion device of the present invention using a methine dye having a specific structure is useful as a solar cell having high conversion efficiency and high stability.

The invention claimed is:

1. A photoelectric conversion device comprising a methine dye represented by the following Formula (2) supported on a thin film of oxide semiconductor fine particles provided on a substrate:

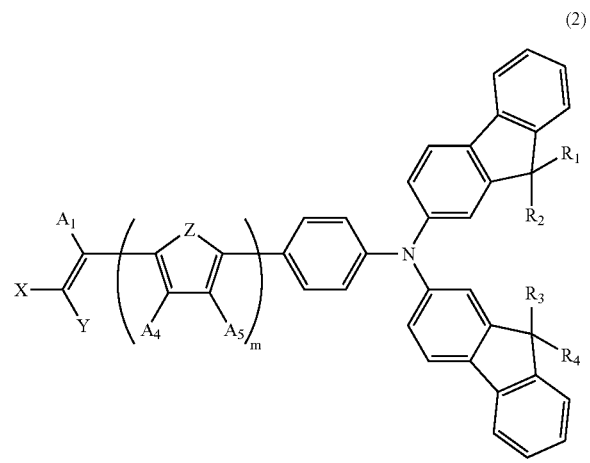

(2)

(wherein, in Formula (2), m represents an integer between 1 and 3; $R_1$ to $R_4$ each independently represent a linear unsubstituted $C_4$-$C_8$ alkyl, one of X and Y represents a carboxyl group, and the other is a cyano group, or X and Y bind together to form a ring structure represented by a formula selected from the group consisting of the following Formulas (2005), (2007) and (2012):

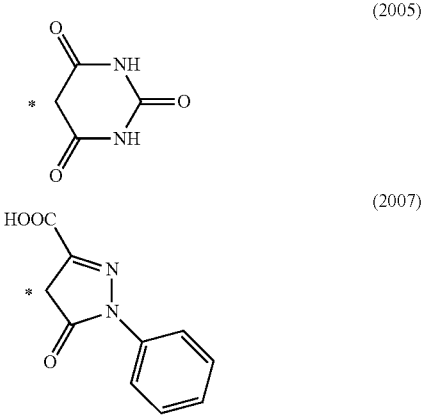

(2005)

(2007)

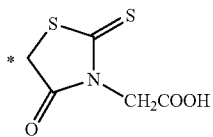

(2012)

(wherein, in Formulas (2005), (2007), and (2012), the symbol * indicates a carbon atom where X binds to Y in Formula (2));

Z('s) represents a sulfur atom, $A_1$, $A_4$('s), and $A_5$('s) each independently represent a hydrogen atom, or an aliphatic hydrocarbon residue that may have a substituent, when m is 2 or greater and plural $A_4$'s and plural $A_5$'s exist, each of the $A_4$'s and $A_5$'s may be identical to or different from one another.

2. The photoelectric conversion device according to claim 1, wherein the ring structure formed by binding between X and Y in Formula (2), is represented by the aforementioned Formula (2007) or (2012).

3. The photoelectric conversion device according to claim 1, wherein in Formula (2), either $A_4$ or $A_5$ (when m is 1), or at least one of the $A_4$'s and $A_5$'s (when m is 2 or greater) represents an aliphatic hydrocarbon residue that may have a substituent.

4. The photoelectric conversion device according to claim 3, wherein the aliphatic hydrocarbon residue that may have a substituent is a saturated alkyl group that may have a substituent.

5. The photoelectric conversion device according to claim 4, wherein the saturated alkyl group that may have a substituent is an n-hexyl group.

6. The photoelectric conversion device according to claim 5, wherein in Formula (2), $A_5$('s) is an n-hexyl group.

7. The photoelectric conversion device comprising one or more methine dyes represented by Formula (2) described in claim 1, a metal complex, and/or an organic dye having a structure other than the structure represented by Formula (2), supported on the thin film of oxide semiconductor fine particles provided on the substrate.

8. The photoelectric conversion device according to claim 1, wherein the thin film of oxide semiconductor fine particles comprises titanium dioxide, zinc oxide, or tin oxide.

9. The photoelectric conversion device according to claim 1, wherein the thin film of oxide semiconductor fine particles are sensitized with the methine dye comprises the methine dye represented by Formula (2) supported on the thin film of oxide semiconductor fine particles in the presence of a clathrate compound.

10. A solar cell, comprising the photoelectric conversion device according to claim 1.

* * * * *